US011487152B2

(12) United States Patent
Hoshino

(10) Patent No.: US 11,487,152 B2
(45) Date of Patent: Nov. 1, 2022

(54) LAMINATE AND IMAGE DISPLAY DEVICE

(71) Applicant: FUJIFILM Corporation, Tokyo (JP)

(72) Inventor: Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/338,139

(22) Filed: Jun. 3, 2021

(65) Prior Publication Data

US 2022/0113596 A1 Apr. 14, 2022

Related U.S. Application Data

(63) Continuation of application No. PCT/JP2019/048466, filed on Dec. 11, 2019.

(30) Foreign Application Priority Data

Dec. 13, 2018 (JP) .............................. JP2018-233329

(51) Int. Cl.
*G02F 1/1337* (2006.01)
*G02F 1/13363* (2006.01)
*G02F 1/1335* (2006.01)

(52) U.S. Cl.
CPC .. *G02F 1/133541* (2021.01); *G02F 1/133528* (2013.01); *G02F 1/133638* (2021.01); *G02F 1/133711* (2013.01)

(58) Field of Classification Search
CPC ......... G02F 1/133528; G02F 1/133541; G02F 1/13363; G02F 1/133638; G02F 1/133711; G02B 5/3083
See application file for complete search history.

(56) References Cited

U.S. PATENT DOCUMENTS

| 2007/0170394 A1* | 7/2007 | Kawamura | ........ | C09K 19/3852 |
| | | | | 252/299.01 |
| 2015/0226895 A1* | 8/2015 | Hatanaka | ............... | G02B 5/305 |
| | | | | 427/163.1 |
| 2018/0195004 A1* | 7/2018 | Adlem | ............... | C09K 19/3838 |
| 2018/0246381 A1 | 8/2018 | Wakita et al. | | |
| 2020/0004087 A1 | 1/2020 | Nozoe et al. | | |
| 2020/0033663 A1 | 1/2020 | Hoshino et al. | | |

FOREIGN PATENT DOCUMENTS

| JP | 2000-344734 A | 12/2000 |
| JP | 2014-074729 A | 4/2014 |
| JP | 2016-194693 A | 11/2016 |
| WO | 2005/116165 A1 | 12/2005 |
| WO | 2017/069252 A1 | 4/2017 |
| WO | 2018/173727 A1 | 9/2018 |
| WO | 2018/199096 A1 | 11/2018 |

OTHER PUBLICATIONS

International Search Report issued in PCT/JP2019/048466 dated Feb. 4, 2020.
Written Opinion issued in PCT/JP2019/048466 dated Feb. 4, 2020.
International Preliminary Report on Patentability completed by WIPO dated Jun. 8, 2021 in connection with International Patent Application No. PCT/JP2019/048466.
Office Action, issued by the Japanese Patent Office dated Jun. 21, 2022, in connection with Japanese Patent Application No. 2020-559282.
Office Action, issued by the Japanese Patent Office dated Sep. 6, 2022, in connection with Japanese Patent Application No. 2020-559282.

* cited by examiner

*Primary Examiner* — Jia X Pan
(74) *Attorney, Agent, or Firm* — Edwards Neils LLC; Jean C. Edwards, Esq

(57) ABSTRACT

The present invention provides a laminate and an image display device, in which alignment defects of a liquid crystal layer provided on an optical alignment layer are suppressed. The laminate includes an optical alignment layer and a liquid crystal layer provided on the optical alignment layer. In the laminate, the liquid crystal layer is formed from a liquid crystal composition containing a liquid crystal compound and a surfactant, and the liquid crystal compound is immobilized in a horizontal alignment state, and the surfactant is a copolymer having a repeating unit containing a fluorinated alkyl group and having a repeating unit containing a mesogenic group.

12 Claims, No Drawings

LAMINATE AND IMAGE DISPLAY DEVICE

CROSS-REFERENCE TO RELATED APPLICATIONS

This application is a Continuation of PCT International Application No. PCT/JP2019/048466 filed on Dec. 11, 2019, which was published under PCT Article 21(2) in Japanese, and which claims priority under 35 U.S.C. § 119(a) to Japanese Patent Application No. 2018-233329 filed on Dec. 13, 2018. The above applications are hereby expressly incorporated by reference, in their entirety, into the present application.

BACKGROUND OF THE INVENTION

1. Field of the Invention

The present invention relates to a laminate and an image display device.

2. Description of the Related Art

Optical films such as an optical compensation sheet and a retardation film are used in various image display devices from the viewpoint of eliminating image coloration and expanding a viewing angle.

A stretched birefringence film has been used as the optical film; however, in recent years, it has been proposed to use an optically anisotropic layer (a liquid crystal layer) using a liquid crystal compound, instead of the stretched birefringence film.

It is known that in such an optically anisotropic layer, an alignment layer is provided on a support that forms this optically anisotropic layer in order to align a liquid crystal compound and that an optical alignment layer, as an alignment layer, which is obtained by undergoing an optical alignment treatment instead of the rubbing treatment is also known (see, for example, WO2017/069252A and WO2018/173727A).

SUMMARY OF THE INVENTION

As a result of examining the optical alignment films (the optical alignment layers) disclosed in WO2017/069252A and WO2018/173727A, the inventors of the present invention revealed that a liquid crystal layer provided on the optical alignment layer may have alignment defects depending on the kind of liquid crystal compound.

An object of the present invention is to provide a laminate and an image display device, in which alignment defects of a liquid crystal layer provided on an optical alignment layer are suppressed.

As a result of diligent studies to solve the above problems, the inventors of the present invention have found that in a case where a predetermined surfactant is blended to a liquid crystal composition that forms a liquid crystal layer, alignment defects of a liquid crystal layer provided on an optical alignment layer are suppressed, and completed the present invention.

That is, the problems described above can be achieved by the following configurations.

[1] A laminate comprising an optical alignment layer; and a liquid crystal layer provided on the optical alignment layer, in which the liquid crystal layer is a layer formed from a liquid crystal composition containing a liquid crystal compound and a surfactant, and the liquid crystal compound is immobilized in a horizontal alignment state, and the surfactant is a copolymer having a repeating unit containing a fluorinated alkyl group, and a repeating unit containing a mesogenic group.

[2] The laminate according to [1], in which the optical alignment layer contains a compound having a photo-alignable group, and the photo-alignable group is a group having a cinnamoyl structure.

[3] The laminate according to [1] or [2], in which the liquid crystal compound is a high-molecular weight liquid crystal compound.

[4] The laminate according to any one of [1] to [3], in which the liquid crystal composition further contains a dichroic substance.

[5] The laminate according to any one of [1] to [4], further comprising a λ/4 plate that is provided on the liquid crystal layer.

[6] An image display device comprising the laminate according to any one of [1] to [5].

According to the present invention, it is possible to provide a laminate and an image display device, in which alignment defects of a liquid crystal layer provided on an optical alignment layer are suppressed.

DESCRIPTION OF THE PREFERRED EMBODIMENTS

In the following description, the present invention will be described in more detail.

The following description of constituent requirements is based on representative embodiments of the invention; however, the present invention is not limited thereto.

A numerical value range represented using "to" in the present specification means a range including the numerical values described before and after "to" as the lower limit and the upper limit respectively.

In addition, in the present specification, parallel, orthogonal, horizontal, and vertical do not respectively mean, in the strict sense, parallel, orthogonal, horizontal, and vertical; however, respectively mean parallel in a range of ±10°, orthogonal in a range of ±10°, horizontal in a range of ±10°, and vertical in a range of ±10°.

Further, in the present specification, as each component, a substance corresponding to each component may be used alone, or two or more kinds of substances may be used in a combination. Here, in a case where two or more kinds of substances are used in combination for each component, the content of the component refers to the total content of the substances used that is used in combination unless otherwise particularly specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Laminate]

The laminate according to the embodiment of the present invention a laminate including an optical alignment layer and a liquid crystal layer provided on the optical alignment layer.

In addition, in the laminate according to the embodiment of the present invention, the liquid crystal layer is a layer formed from a liquid crystal composition containing a liquid crystal compound and a surfactant, and the liquid crystal compound is immobilized in a horizontal alignment state.

Further, in the laminate according to the embodiment of the present invention, the surfactant is a copolymer having a repeating unit containing a fluorinated alkyl group, and a repeating unit containing a mesogenic group.

In the present invention, as described above, as the surfactant that is blended in the liquid crystal composition that forms the liquid crystal layer, the copolymer having a repeating unit containing a fluorinated alkyl group and a repeating unit containing a mesogenic group is used, and thus alignment defects of a liquid crystal layer provided on an optical alignment layer can be suppressed.

Although the details of the reasons for the above have not been revealed; however, the inventors of the present invention presume that the reasons are as follows.

First, as the alignment layer that is used for the alignment of the liquid crystal compound, as described above, an alignment layer subjected to a rubbing treatment or an optical alignment layer subjected to an optical alignment treatment is known.

Among the above, aligning regulation power (liquid crystal aligning ability) is imparted to the optical alignment layer by irradiating a layer containing a compound having optical alignment ability with polarized light. However, the aligning regulation power is generally small as compared with the rubbing treatment, and in particular, the aligning regulation power may be insufficient at the practical irradiation dose, and thus the liquid crystal layer formed on the optical alignment layer easily has alignment defects.

On the other hand, in a case of forming a liquid crystal layer, it is general to use a surfactant in the liquid crystal composition for the intended purpose of obtaining a good plane shape or the like.

For these reasons, it is presumed that in the present invention, since a copolymer having a repeating unit containing a fluorinated alkyl group and a repeating unit containing a mesogenic group is used as the surfactant, the mesogenic groups in the surfactant are unevenly located at the interface with the optical alignment layer, thereby being capable of assisting the alignment of the liquid crystal compound.

[Optical Alignment Layer]

An optical alignment layer included in the laminate according to the embodiment of the present invention is not particularly limited, and a conventionally known optical alignment layer can be used.

The material for forming the optical alignment layer is not particularly limited; however, a compound having a photo-alignable group is usually used. The compound may be a polymer having a repeating unit containing a photo-alignable group.

The photo-alignable group is a functional group capable of imparting anisotropy to a film by irradiation with light. More specifically, the photo-alignable group is a group in which the molecular structure therein can be changed by irradiation with light (for example, linearly polarized light). Typically, the photo-alignable group refers to a group that undergoes at least one photoreaction selected from a photoisomerization reaction, a photodimerization reaction, or a photodegradation reaction by irradiation with light (for example, linearly polarized light).

Among these photo-alignable groups, a group (a group having a structure that becomes photoisomerized) that undergoes a photoisomerization reaction or a group (a group having a structure that becomes photodimerized) that undergoes a photodimerization reaction is preferable, and a group that undergoes a photodimerization reaction occurs is more preferable.

The photoisomerization reaction refers to a reaction in which stereoisomerization or structural isomerization occurs by the action of light. Examples of the known substance that undergoes such a photoisomerization reaction include a substance having an azobenzene structure (K. Ichimura et al., Mol. Cryst. Liq. Cryst., Vol. 298, page 221 (1997)), a substance having a hydrazone-β-ketoester structure (S. Yamamura et al., Liquid Crystals, vol. 13, No. 2, page 189 (1993)), a substance having stilbene structure (J. G. Victor and J. M. Torkelson, Macromolecules, Vol. 20, page 2241 (1987)), and a substance having a spiropyran structure (K. Ichimura et al., Chemistry Letters, page 1063 (1992); K. Ichimura et al., Thin Solid Films, vol. 235, page 101 (1993)).

The group that undergoes a photoisomerization reaction is preferably a group that undergoes a photoisomerization reaction including a C=C bond or an N=N bond is preferable, and examples of such a group include a group having an azobenzene structure (skeleton), a group having a hydrazone-β-ketoester structure (skeleton), a group having a stilbene structure (skeleton), and a group having a spiropyran structure (skeleton).

The photodimerization reaction is a reaction in which an addition reaction occurs between two groups by the action of light, by which, typically, a ring structure is formed. Examples of the known substance that undergoes such photodimerization occurs include a substance having a cinnamic acid structure (M. Schadt et al., J. Appl. Phys., Vol. 31, No. 7, page 2155 (1992)), a substance a coumarin structure (M. Schadt et al., Nature., Vol. 381, page 212 (1996)), a substance having a chalcone structure (Toshihiro Ogawa et al., Proceedings of Symposium Digest on Liquid Crystal, 2AB03 (1997), and a substance having a benzophenone structure (Y. K. Jang et al., SID Int. Symposium Digest, P-53 (1997)).

Examples of the group that undergoes a photodimerization reaction include a group having a cinnamic acid (cinnamoyl) structure (skeleton), a group having a coumarin structure (skeleton), a group having a chalcone structure (skeleton), a group having a benzophenone structure (skeleton), and a group having anthracene structure (skeleton). Among these groups, a group having a cinnamoyl structure or a group having a coumarin structure is preferable, and a group having a cinnamoyl structure is more preferable.

Further, a compound having the photo-alignable group may further have a crosslinkable group.

The crosslinkable group is preferably a thermally crosslinkable group that undergoes a curing reaction by the action of heat or a photo-crosslinkable group that undergoes a curing reaction by the action of light and may be a crosslinkable group having both a thermally crosslinkable group and a photo-crosslinkable group.

Examples of the crosslinkable group include at least one selected from the group consisting of an epoxy group, an oxetanyl group, a group represented by —NH—CH$_2$—O—R (R represents a hydrogen atom or an alkyl group having 1 to 20 carbon atoms), a group having an ethylenically unsaturated double bond, and a blocked isocyanate group. Among these, a group having an epoxy group, an oxetanyl group, or an ethylenically unsaturated double bond is preferable.

It is noted that a 3-membered cyclic ether group is also called an epoxy group, and a 4-membered cyclic ether group is also called an oxetanyl group.

Specific examples of the group having an ethylenically unsaturated double bond include a vinyl group, an allyl group, a styryl group, an acryloyl group, and a methacryloyl group, and preferred examples thereof are an acryloyl group and a methacryloyl group.

Examples of the preferred aspect of the optical alignment layer include an optical alignment layer formed by using a composition for forming an optical alignment layer, which contains a polymer A having a repeating unit a1 containing a cinnamate group and contains a low-molecular weight compound B having a molecular weight smaller than that of the polymer A and having a cinnamate group.

Here, in the present specification, the cinnamate group refers to a group having a cinnamic acid structure containing cinnamic acid or a derivative thereof as a basic skeleton and is a group represented by Formula (I) or Formula (II).

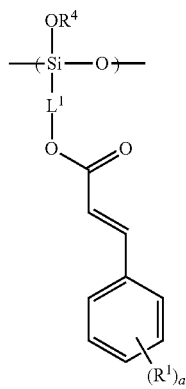

In the formulae, $R^1$ represents a hydrogen atom or a monovalent organic group, and $R^2$ represents a monovalent organic group. In formula (I), a represents an integer of 0 to 5, and in formula (II), a represents an integer of 0 to 4. In a case where a is 2 or more, a plurality of $R^1$'s may be the same or different from each other. * Indicates a bonding hand.

The polymer A is not particularly limited as long as it is a polymer having the repeating unit a1 containing a cinnamate group, and a conventionally known polymer can be used.

The weight-average molecular weight of the polymer A is preferably 1,000 to 500,000, more preferably 2,000 to 300,000, and still more preferably 3,000 to 200,000.

Here, the weight-average molecular weight is defined as a value in terms of polystyrene (PS), which is measured by gel permeation chromatography (GPC), and the measurement by GPC in the present invention can be carried out using HLC-8220 GPC (manufactured by Tosoh Corporation) and using TSK gel Super HZM-H, HZ4000, or HZ2000, as a column.

Examples of the repeating unit a1 that is contained in the cinnamate group contained in the polymer A include repeating units represented by Formulae (A1) to (A4).

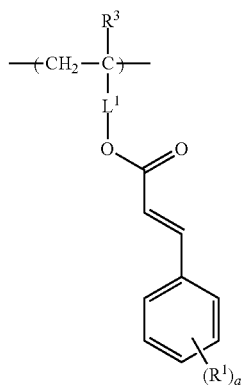

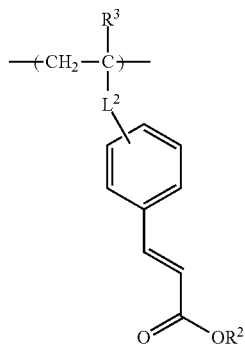

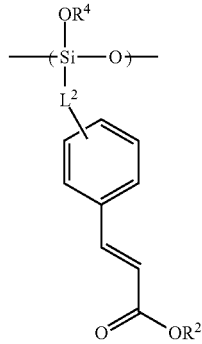

Here, in Formulae (A1) and (A3), $R^3$ represents a hydrogen atom or a methyl group, and in Formulae (A2) and (A4), $R^4$ represents an alkyl group having 1 to 6 carbon atoms.

In Formulae (A 1) and (A2), $L^1$ represents a single bond or a divalent linking group, a represents an integer of 0 to 5, and $R^1$ represents a hydrogen atom or a monovalent organic group.

In Formulae (A3) and (A4), $L^2$ represents a divalent linking group, and $R^2$ represents a monovalent organic group.

Specific examples of $L^1$ include —CO—O-Ph-, —CO—O-Ph-Ph-, —CO—O—$(CH_2)_n$—, —CO—O—$(CH_2)_n$-Cy-, and —$(CH_2)_n$—Cy-. Here, Ph represents a divalent benzene ring (for example, a phenylene group) which may have a substituent, Cy represents a divalent cyclohexane ring which may have a substituent (for example, a cyclohexan-1,4-diyl group), and n represents an integer of 1 to 4.

Specific examples of $L^2$ include —O—CO— and —O—CO—$(CH_2)_m$—O—. Here, m represents an integer of 1 to 6.

In addition, examples of the monovalent organic group as $R^1$ include a chain-like or cyclic alkyl group having 1 to 20 carbon atoms, an alkoxy group having 1 to 20 carbon atoms, and an aryl group having 6 to 20 carbon atoms, which may have a substituent.

In addition, examples of the monovalent organic group as $R^2$ include, a chain-like or cyclic alkyl group having 1 to 20 carbon atoms and an aryl group having 6 to 20 carbon atoms, which may have a substituent.

In addition, a is preferably 1, and $R^1$ is preferably positioned at the para position.

Further, examples of the substituent which may be contained in the above-described Ph, Cy, and aryl group include an alkyl group, an alkoxy group, a hydroxy group, a carboxy group, an amino group.

From the viewpoints of further improving the alignment property of the liquid crystal layer and further improving the adhesiveness of the liquid crystal layer, the polymer A preferably further has a repeating unit a2 containing a crosslinkable group.

The definition and the preferred aspect of the crosslinkable group are as described above.

Among the above, the repeating unit a2 containing a crosslinkable group is preferably a repeating unit having an epoxy group, an oxetanyl group, or a group having an ethylenically unsaturated double bond.

Preferred specific examples of the repeating unit having a group having an epoxy group, an oxetanyl group, or a group having an ethylenically unsaturated double bond include the following repeating units. It is noted that $R^3$ and $R^4$ are respectively synonymous with $R^3$ and $R^4$ in the above-described Formulae (A1) and (A1).

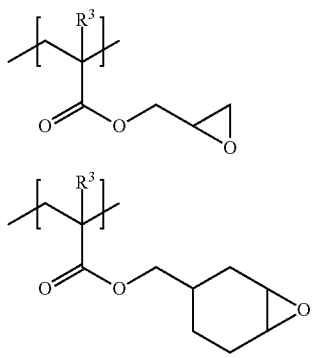

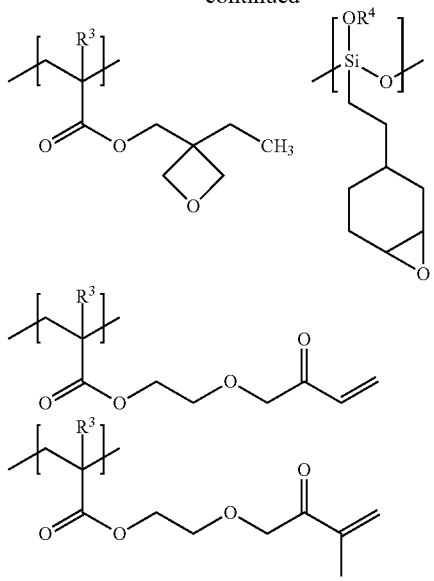

The polymer A may have another repeating unit other than the repeating unit a1 and the repeating unit a2, which are described above.

Examples of the monomer that forms another repeating unit include an acrylic acid ester compound, a methacrylic acid ester compound, a maleimide compound, an acrylamide compound, acrylonitrile, maleic acid anhydride, a styrene compound, and a vinyl compound.

In a case where an organic solvent which will be described later is contained, the content of the polymer A in the composition for forming an optical alignment layer is preferably 0.1 to 50 parts by mass and more preferably 0.5 to 10 parts by mass with 100 parts by mass of the solvent.

The low-molecular weight compound B is a compound having a molecular weight smaller than that of the polymer A and having a cinnamate group. In a case where the low-molecular weight compound B is used, the alignment property of the prepared optical alignment layer is good.

Due to the reason that the alignment property of the optical alignment layer is further improved, the molecular weight of the low-molecular weight compound B is preferably 200 to 500 and more preferably 200 to 400.

Examples of the low-molecular weight compound B include a compound represented by Formula (B1).

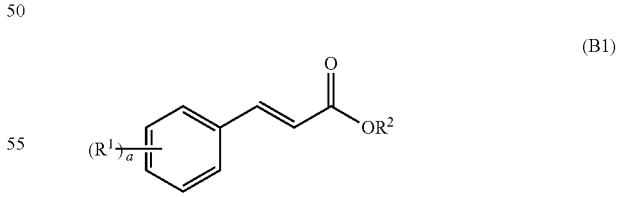

In Formula (B1), a represents an integer of 0 to 5, $R^1$ represents a hydrogen atom or a monovalent organic group, and $R^2$ represents a monovalent organic group. In a case where a is 2 or more, a plurality of $R^1$'s may be the same or different from each other.

In addition, examples of the monovalent organic group as $R^1$ include a chain-like or cyclic alkyl group having 1 to 20 carbon atoms, an alkoxy group having 1 to 20 carbon atoms, and an aryl group having 6 to 20 carbon atoms, which may have a substituent. Among them, an alkoxy group having 1 to 20 carbon atoms is preferable, an alkoxy group having 1 to 6 carbon atoms is more preferable, and a methoxy group or an ethoxy group is still more preferable.

In addition, examples of the monovalent organic group as $R^2$ include, a chain-like or cyclic alkyl group having 1 to 20 carbon atoms and an aryl group having 6 to 20 carbon atoms, which may have a substituent. Among them, a chain-like alkyl group having 1 to 20 carbon atoms is preferable, and a branched alkyl group having 1 to 10 carbon atoms is more preferable.

In addition, a is preferably 1, and $R^1$ is preferably positioned at the para position.

Further, examples of the substituent which may be contained in the above-described aryl group include an alkyl group, an alkoxy group, a hydroxy group, a carboxy group, an amino group.

The content of the low-molecular weight compound B in the composition for forming an optical alignment layer is preferably 10% to 500% by mass and more preferably 30% to 300% by mass, with respect to the mass of the constitutional unit a1 of the polymer A.

The composition for forming an optical alignment layer preferably contains a crosslinking agent C having a crosslinkable group, in addition to the polymer A having a constitutional unit a2 containing a crosslinkable group, due to the reason that the alignment property is further improved.

The molecular weight of the crosslinking agent C is preferably 1,000 or less, and more preferably 100 to 500.

Examples of the crosslinking agent C include a compound having two or more epoxy groups or oxetanyl groups in the molecule, a blocked isocyanate compound (a compound having a protected isocyanate group), and an alkoxymethyl group-containing compound.

Among these, a compound having two or more epoxy groups or oxetanyl groups in the molecule, or a blocked isocyanate compound is preferable.

In a case where the composition for forming an optical alignment layer contains the crosslinking agent C, the content of the crosslinking agent C is preferably 1 to 1,000 parts by mass and more preferably 10 to 500 parts by mass, with respect to 100 parts by mass of the constitutional unit a1 of the polymer A.

The composition for forming an optical alignment layer preferably contains a solvent from the viewpoint of workability in preparing the optical alignment layer. Examples of the solvent include water and an organic solvent.

Specific examples of the organic solvent include ketones (for example, acetone, 2-butanone, methylisobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethyl benzene), halocarbons (for example, dichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve and ethyl cellosolve), cellosolve acetates, sulfoxides (for example, dimethylsulfoxide), and amides (for example, dimethylformamide and dimethylacetamide). These may be used alone or, two or more kinds thereof may be used in combination.

The composition for forming an optical alignment layer may contain another component other than the above, and examples thereof include a crosslinking catalyst, an adhesion improver, a leveling agent, a surfactant, and a plasticizer.

<Method of Forming Optical Alignment Layer>

The method of forming an optical alignment layer is not particularly limited. For example, the optical alignment layer can be prepared by a manufacturing method which includes a coating step of coating a surface of a support with the above-described composition for forming an optical alignment layer and a light irradiation step of irradiating a coating film of the composition for forming an optical alignment layer with polarized light or non-polarized light in a direction diagonal from the surface of the coating film.

(Support)

Examples of the support include a glass substrate and a polymer film.

Examples of the material of the polymer film include a cellulose-based polymer; an acrylic polymer; a thermoplastic norbornene-based polymer; a polycarbonate-based polymer; a polyester-based polymer such as polyethylene terephthalate or polyethylene naphthalate; a styrene-based polymer such as polystyrene or an acrylonitrile-styrene copolymer (an AS resin); a polyolefin-based polymer such as polyethylene, polypropylene, or an ethylene-propylene copolymer; a vinyl chloride-based polymer; an amide-based polymer such as nylon or an aromatic polyamide; an imide-based polymer; a sulfone-based polymer; a polyether sulfone-based polymer; a polyether ether ketone polymer; a polyphenylene sulfide-based polymer; a vinylidene chloride-based polymer; a vinyl alcohol-based polymer; a vinyl butyral polymer; an allylate-based polymer; a polyoxymethylene-based polymer; an epoxy polymer; and a mixture of these polymers.

The thickness of the support is not particularly limited; however, it is preferably 5 to 60 μm and more preferably 5 to 30 μm.

(Coating Step)

The coating method in the coating step is not particularly limited and may be appropriately selected depending on the intended purpose. Examples thereof include spin coating, die coating, gravure coating, flexographic printing, and inkjet printing.

(Light Irradiation Step)

In the light irradiation step, the polarized light with which a coating film of the composition for forming an optical alignment layer is irradiated is not particularly limited, and examples thereof include linearly polarized light, circularly polarized light, and elliptically polarized light. Among them, linearly polarized light is preferable.

Further, the "diagonal direction" in which non-polarized light is applied is not particularly limited as long as it is a direction tilted by a polar angle θ (0<θ<90°) from the normal direction of the coating film surface, and can be appropriately selected depending on the intended purpose; however, θ is preferably 20° to 80°.

The wavelength of the polarized light or the non-polarized light is not particularly limited as long as it can impart the ability to control the alignment of liquid crystalline molecules to the coating film of the composition for forming an optical alignment layer, and example of the ray having such a wavelength include an ultraviolet ray, a near-ultraviolet ray, and a visible ray. Among them, a near-ultraviolet ray of 250 nm to 450 nm is particularly preferable.

Examples of the light source for irradiating polarized or non-polarized light include a xenon lamp, a high-pressure mercury lamp, an ultra high-pressure mercury lamp, and a metal halide lamp. In a case where an interference filter, a color filter, or the like is used for filtering the ultraviolet ray or the visible ray obtained from such a light source, the wavelength range for irradiation can be limited. In addition, in a case where a polarizing filter or a polarizing prism is used polarizing for the light from these light sources, linearly polarized light can be obtained.

The accumulated amount of polarized or non-polarized light is not particularly limited as long as the ability to control the alignment of liquid crystalline molecules is imparted to the coating film of the composition for forming an optical alignment layer, and is preferably 1 to 300 mJ/cm$^2$ and more preferably 5 to 100 mJ/cm$^2$.

The illuminance of polarized or non-polarized light is not particularly limited as long as the ability to control the alignment of liquid crystalline molecules is imparted to the coating film of the composition for forming an optical alignment layer, and is preferably 0.1 to 300 mW/cm$^2$ and more preferably 1 to 100 mW/cm$^2$.

The thickness of the optical alignment layer is not particularly limited and may be appropriately selected depending on the intended purpose; however, it is preferably 10 to 1,000 nm and more preferably 10 to 700 nm.

[Liquid Crystal Layer]

The liquid crystal layer included in the laminate according to the embodiment of the present invention is a layer formed from a liquid crystal composition containing a liquid crystal compound and a surfactant, and the liquid crystal compound is immobilized in a horizontal alignment state.

Hereinafter, each of the components contained in the liquid crystal composition will be described in detail.

<Liquid Crystal Compound>

The liquid crystal composition contains a liquid crystal compound.

The liquid crystal compound is preferably a liquid crystal compound that does not exhibit dichroism in the visible light range.

As the liquid crystal compound, any one of a low-molecular weight liquid crystal compound or a high-molecular weight liquid crystal compound can be used. Here, the "low-molecular weight liquid crystal compound" refers to a liquid crystal compound having no repeating units in the chemical structure. In addition, the "high-molecular weight liquid crystal compound" refers to a liquid crystal compound having a repeating unit in the chemical structure.

Examples of the low-molecular weight liquid crystal compound include the liquid crystal compound described in JP2013-228706A.

Examples of the high-molecular weight liquid crystal compound include thermotropic liquid crystal polymer described in JP2011-237513A. Further, the high-molecular weight liquid crystal compound may have a crosslinkable group (for example, an acryloyl group and a methacryloyl group) at the terminal thereof.

The liquid crystal compound may be used alone, or two or more thereof may be used in combination.

The content of the liquid crystal compound is preferably 25 to 2,000 parts by mass, more preferably 33 to 1,000 parts by mass, and still more preferably 50 to 500 parts by mass, with respect to 100 parts by mass of the content of the dichroic substance in the present composition. In a case where the content of the liquid crystal compound is within the above range, the alignment degree of the polarizer is further improved.

Due to the reason that the alignment degree of the obtained liquid crystal layer is higher, the liquid crystal compound is preferably a high-molecular weight liquid crystal compound and more preferably a high-molecular weight liquid crystal compound containing a repeating unit represented by Formula (1) (hereinafter, also abbreviated as a "repeating unit (1)").

In Formula (1), P1 represents a main chain of the repeating unit, L1 represents a single bond or a divalent linking group, SP1 represents a spacer group, M1 represents a mesogenic group, and T1 represents a terminal group.

Specific examples of the main chain of the repeating unit represented by P1 include groups represented by Formulae (P1-A) to (P1-D). Among these, a group represented by Formula (P1-A) is preferable from the viewpoint of the diversity of monomers as raw materials and ease of handling.

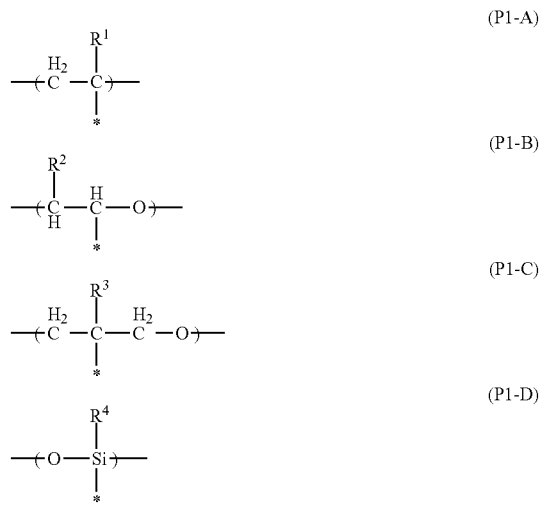

In Formulae (P1-A) to (P1-D), "*" represents a bonding position to L1 in Formula (1).

In Formulae (P1-A) to (P1-D), R$^1$, R$^2$, R$^3$, and R$^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or may be an alkyl group (a cycloalkyl group) having a cyclic structure. The alkyl group preferably has 1 to 5 carbon atoms.

The group represented by Formula (P1-A) is preferably an unit of a partial structure of a poly(meth)acrylic acid ester obtained by polymerizing a (meth)acrylic acid ester.

The group represented by Formula (P1-B) is preferably an ethylene glycol unit formed by subjecting an epoxy group of a compound having an epoxy group to ring-opening polymerization.

The group represented by Formula (P1-C) is preferably a propylene glycol unit formed by subjecting an oxetane group of a compound having an oxetane group to ring-opening polymerization.

The group represented by Formula (P1-D) is preferably a siloxane unit of a polysiloxane obtained by polycondensation of a compound having at least one of an alkoxysilyl group or a silanol group. Here, examples of the compound having at least one of an alkoxysilyl group or a silanol group include a compound having a group represented by Formula SiR$^{14}$(OR$^{15}$)$_2$—. In the formula, R$^{14}$ is synonymous with R$^{14}$ in (P1-D), and a plurality of R$^{15}$'s each independently represent a hydrogen atom or an alkyl group having 1 to 10 carbon atoms.

In Formula (1), L1 is a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formula, R$^3$ and R$^4$ each independently represent a hydrogen atom or an alkyl group having 1 to 6 carbon atoms, which may have a substituent.

In a case where P1 is a group represented by Formula (P1-A), L1 is preferably a group represented by —C(O)O— due to the reason that the alignment degree of the obtained liquid crystal layer is higher.

In a case where P1 is a group represented by Formulae (P1-B) to (P1-D), L1 is preferably a single bond due to the reason that the alignment degree of the obtained liquid crystal layer is higher.

In Formula (1), the spacer group represented by SP1 preferably includes at least one structure selected from the group consisting of an oxyethylene structure, an oxypropylene structure, a polysiloxane structure, and a fluorinated alkylene structure, due to the easy exhibition of liquid crystallinity, raw material availability, and the like.

Here, the oxyethylene structure represented by SP1 is preferably a group represented by *—(CH$_2$—CH$_2$O)$_{n1}$—*. In the formula, n1 represents an integer of 1 to 20, and * represents a bonding position to L1 or M1 in Formula (1). n1 is preferably an integer of 2 to 10, more preferably an integer of 2 to 4, and most preferably 3, due to the reason that the alignment degree of the obtained liquid crystal layer is higher.

In addition, the oxypropylene structure represented by SP1 is preferably represented by *—(CH(CH$_3$)—CH$_2$O)$_{n2}$—* due to the reason that the alignment degree of the obtained liquid crystal layer is higher. In the formula, n2 represents an integer of 1 to 3, and * represents a bonding position to L1 or M1.

In addition, the polysiloxane structure represented by SP1 is preferably represented by *—(Si(CH$_3$)$_2$—O)$_{n3}$—* due to the reason that the alignment degree of the obtained liquid crystal layer is higher. In the formula, n3 represents an integer of 6 to 10, and * represents a bonding position to L1 or M1.

In addition, the fluorinated alkylene structure represented by SP1 is preferably represented by *—(CF$_2$—CF$_2$)$_{n4}$—* due to the reason that the alignment degree of the obtained liquid crystal layer is higher. In the formula, n4 represents an integer of 6 to 10, and * represents a bonding position to L1 or M1.

In Formula (1), the mesogenic group represented by M1 is a group indicating the main skeleton of liquid crystalline molecules contributing to the formation of liquid crystal. The liquid crystalline molecule exhibits liquid crystallinity in an intermediate state (a mesophase) between a crystalline state and an isotropic liquid state. The mesogenic group is not particularly limited, and for example, the description on pages 7 to 16 of "Flussige Kristalle in Tabellen II" (VEB Deutsche Verlag fur Grundstoff Industrie, Leipzig, 1984) and the description in Chapter 3 of Liquid Crystal Handbook (Maruzen, 2000) edited by Liquid Crystal Handbook Editing Committee can be referred to.

The mesogenic group is preferably a group having at least one cyclic structure selected from the group consisting of an aromatic hydrocarbon group, a heterocyclic group, and an alicyclic group.

The mesogenic group preferably has an aromatic hydrocarbon group, more preferably 2 to 4 aromatic hydrocarbon groups, and still more preferably 3 aromatic hydrocarbon groups, due to the reason that the alignment degree of the obtained liquid crystal layer is higher.

The mesogenic group is preferably a group represented by Formula (M1-A) or Formula (M1-B) and more preferably a group represented by Formula (M1-B), from the viewpoints of the exhibition of liquid crystallinity, the adjustment of the liquid crystal phase transition temperature, and the availability and the synthetic suitability of raw materials, and due to the fact that the effects of the present invention are more excellent.

(M1-A)

(M1-B)

In Formula (M1-A), A1 is a divalent group selected from the group consisting of an aromatic hydrocarbon group, a heterocyclic group, and an alicyclic group. These groups may be substituted with an alkyl group, a fluorinated alkyl group, an alkoxy group, or a substituent.

The divalent group represented by A1 is preferably a 4- to 6-membered ring. The divalent group represented by A1 may be monocyclic or condensed.

* represents a bonding position to SP1 or T1.

Examples of the divalent aromatic hydrocarbon group represented by A1 include a phenylene group, a naphthylene group, a fluorene-diyl group, anthracene-diyl group, and a tetracene-diyl group, and from the viewpoint of the diversity of the design of a mesogenic skeleton and raw material availability, a phenylene group or a naphthylene group is preferable, and a phenylene group is more preferable.

The divalent heterocyclic group represented by A1 may be aromatic or non-aromatic; however, it is preferably a divalent aromatic heterocyclic group from the viewpoint of a further improvement in the alignment degree.

Examples of the atom other than the carbon atoms of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different from each other.

Specific examples of the divalent aromatic heterocyclic group include a pyridylene group (a pyridine-diyl group), a pyridazine-diyl group, an imidazole-diyl group, a thienylene (a thiophene-diyl group), a quinolylene group (a quinoline-diyl group), an isoquinolylene group (an isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same or different from each other.

In Formula (M1-B), A2 and A3 each independently represent a divalent group selected from the group consisting of an aromatic hydrocarbon group, a heterocyclic group, and an alicyclic group. Since specific examples and preferred aspects of A2 and A3 are the same as those of A1 of Formula (M1-A), the description thereof will be omitted.

In Formula (M1-B), a2 represents an integer of 1 to 10. In a case where a2 is 2 or more, a plurality of A2's may be the same or different from each other, a plurality of A3's may be the same or different each other, and a plurality of LA1's may be the same or different from each other. a2 is preferably an integer of 2 or more and more preferably 2, due to the reason that the alignment degree of the obtained liquid crystal layer is higher.

In Formula (M1-B), in a case where a2 is 1, LA1 is a divalent linking group. In a case where a2 is 2 or more, a plurality of LA1's each independently represent a single bond or a divalent linking group, and at least one of the plurality of LA1's is a divalent linking group. In a case where a2 is 2, one of the two LA1's is preferably a divalent linking group and the other is preferably a single bond, due to the reason that the alignment degree of the obtained liquid crystal layer is higher.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among them, —C(O)O— is preferable due to the reason that the alignment degree of the obtained liquid crystal layer is higher. LA1 may be a group formed by combining two or more of the above groups.

Specific examples of M1 include the following structures. In the following specific examples, "Ac" represents an acetyl group.

-continued
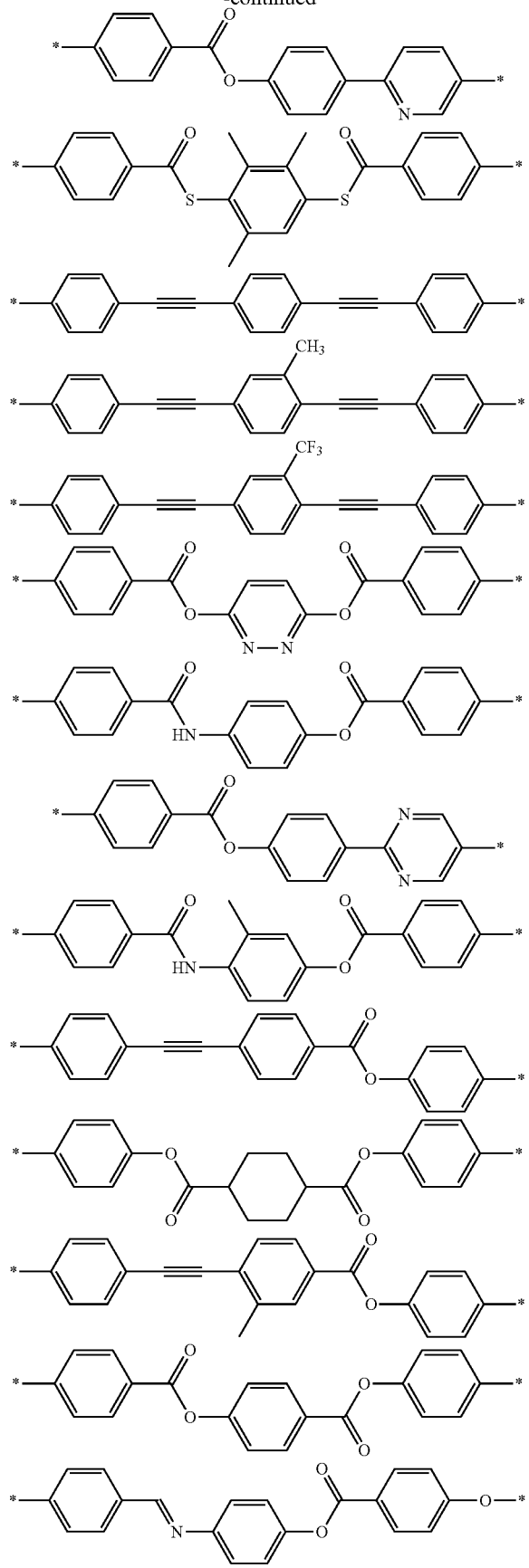
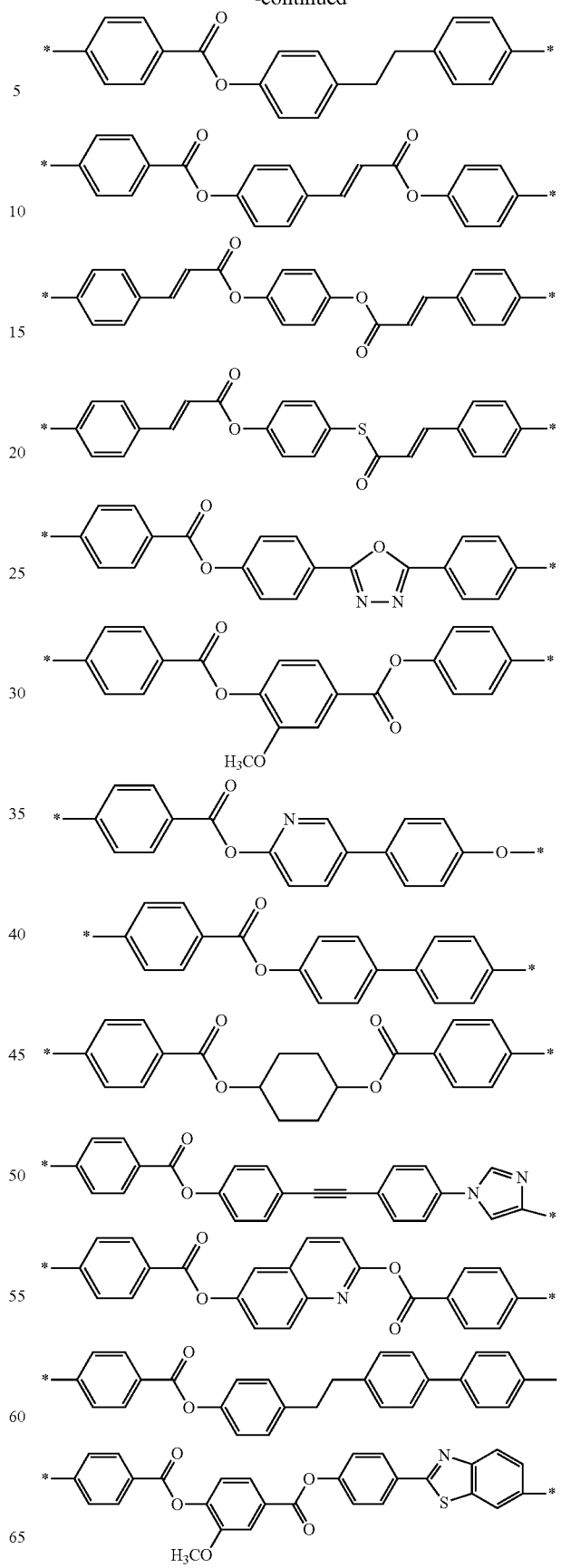

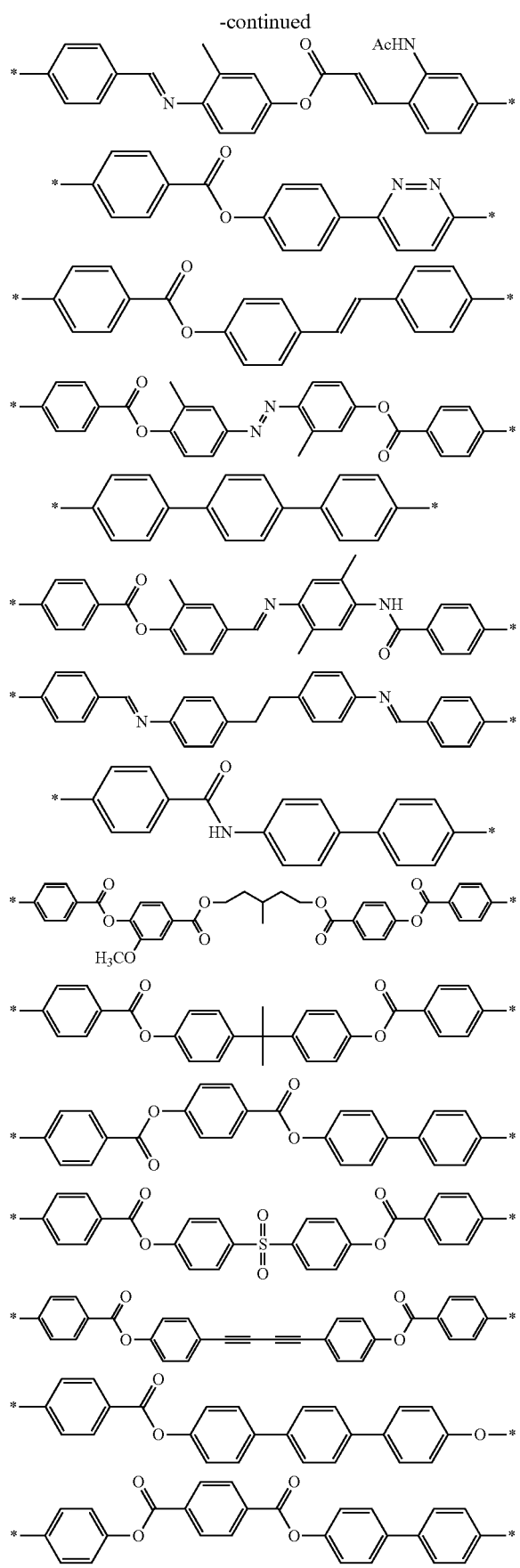
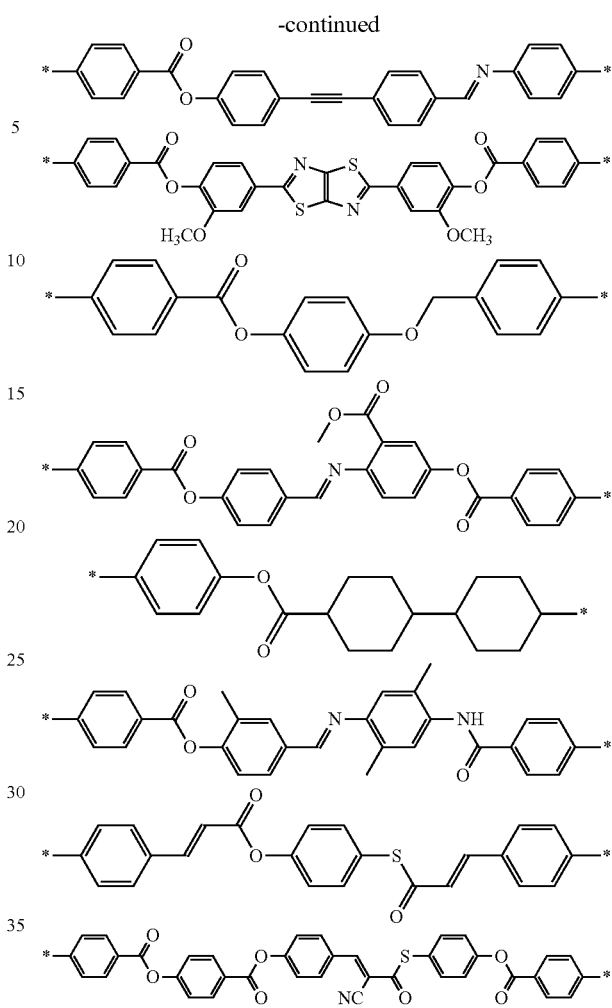

In Formula (1), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group (ROC(O)—: R is an alkyl group) having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, where specific examples of the linking group are the same as those of L1 and SP1 described above, and A represents an (meth) acryloyloxy group).

T1 is preferably an alkoxy group having 1 to 10 carbon atoms, more preferably an alkoxy group having 1 to 5 carbon atoms, and still more preferably a methoxy group, due to the reason that the alignment degree of the obtained liquid crystal layer is higher. These terminal groups may be further substituted with these groups or the polymerizable groups described in JP2010-244038A.

The number of atoms in the main chain of T1 is preferably 1 to 20, more preferably 1 to 15, still more preferably 1 to 10, and particularly preferably 1 to 7, due to the reason that the alignment degree of the obtained liquid crystal layer is higher. In a case where the number of atoms in the main chain of T1 is 20 or less, the alignment degree of the polarizer is further improved. Here, the "main chain" of T1 means the longest molecular chain bonded to M1, and hydrogen atoms are not counted as the atoms in the main chain of T1. For example, in a case where T1 is an n-butyl group, the main chain has 4 atoms, and in a case where T1 is a sec-butyl group, the main chain has 3 atoms.

The content of the repeating unit (1) is preferably 20% to 100% by mass with respect to 100% by mass of all the repeating units contained in the high-molecular weight liquid crystal compound, due to the reason that the alignment degree of the obtained liquid crystal layer is higher.

In the present invention, the content of each of the repeating units contained in the high-molecular weight liquid crystal compound is calculated based on the charged amount (mass) of each of the monomers used to obtain each of the repeating units.

The high-molecular weight liquid crystal compound may contain only one kind of repeating unit (1) or may contain two or more kinds thereof. Among the above, it is preferable that two kinds of repeating units (1) are contained in the high-molecular weight liquid crystal compound due to the reason that the alignment degree of the obtained liquid crystal layer is higher.

In a case where the high-molecular weight liquid crystal compound contains two kinds of repeating units (1), the terminal group represented by T1 in one kind (a repeating unit A) is preferably an alkoxy group and the terminal group represented by T1 in the other kind (a repeating unit B) is preferably a group other than the alkoxy group, due to the reason that the alignment degree of the obtained liquid crystal layer is higher.

The terminal group represented by T1 in the repeating unit B is preferably an alkoxycarbonyl group, a cyano group, or a (meth)acryloyloxy group-containing group and more preferably an alkoxycarbonyl group or a cyano group, due to the reason that the alignment degree of the obtained liquid crystal layer is higher.

The ratio (A/B) of the content of the repeating unit A in the high-molecular weight liquid crystal compound to the content of the repeating unit B in the high-molecular weight liquid crystal compound is preferably 50/50 to 95/5, more preferably 60/40 to 93/7, and still more preferably 70/30 to 90/10, due to the reason that the alignment degree of the obtained liquid crystal layer is higher.

(Weight-Average Molecular Weight)

The weight-average molecular weight (Mw) of the high-molecular weight liquid crystal compound is preferably 1,000 to 500,000 and more preferably 2,000 to 300,000 due to the reason that the alignment degree of the obtained liquid crystal layer is higher. In a case where Mw of the high-molecular weight liquid crystal compound is within the above range, the high-molecular weight liquid crystal compound is easily handled.

Particularly, from the viewpoint of suppressing cracking at the time of coating, the weight-average molecular weight (Mw) of the high-molecular weight liquid crystal compound is preferably 10,000 or more and more preferably 10,000 to 300,000.

From the viewpoint of the temperature latitude of the alignment degree, the weight-average molecular weight (Mw) of the high-molecular weight liquid crystal compound is preferably less than 10,000 and more preferably 2,000 or more and less than 10,000.

Here, in the present invention, the weight-average molecular weight and the number-average molecular weight are values measured by gel permeation chromatography (GPC).

Solvent (eluent): N-methylpyrrolidone
Device name: TOSOH HLC-8220GPC
Column: TOSOH TSK gel Super AWM-H (6 mm×15 cm) (three columns are connected and used)
Column temperature: 25° C.
Sample concentration: 0.1% by mass
Flow rate: 0.35 mL/min
Calibration curve: A calibration curve obtained using seven TSK standard polystyrene samples, manufactured by TOSOH Corporation, in a range of Mw=2,800,000 to 1,050 (Mw/Mn=1.03 to 1.06) is used.

(Content)

In the present invention, the content of the liquid crystal compound is such an amount that the content thereof is preferably 8% to 99% by mass and more preferably 8% to 96% by mass with respect to the solid content in the liquid crystal composition.

Here, the "solid content in the liquid crystal composition" refers to components excluding the solvent, and specific examples of the solid content include the above-described liquid crystal compound, a dichroic substance, a polymerization initiator, and an interface improver, which will be described later.

<Surfactant>

The surfactant contained in the liquid crystal composition is a copolymer having a repeating unit containing a fluorinated alkyl group (hereinafter, also abbreviated as a "repeating unit F") and a repeating unit containing a mesogenic group (hereinafter, also abbreviated as a "repeating unit M").

(Repeating Unit F)

The repeating unit F contained in the copolymer is preferably a repeating unit represented by Formula (a).

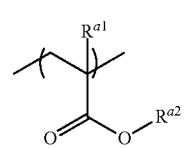

(a)

In Formula (a), $R^{a1}$ represents a hydrogen atom or an alkyl group having 1 to 20 carbon atoms, and $R^{a2}$ represents an alkyl group having 1 to 20 carbon atoms or an alkenyl group having 2 to 20 carbon atoms, at least one carbon atom of which has a fluorine atom as a substituent.

In Formula (a), $R^{a2}$ is preferably an alkyl group having 1 to 10 carbon atoms or an alkenylene group having 2 to 10 carbon atoms, at least one carbon atom of which has a fluorine atom as a substituent, and more preferably an alkyl group having 1 to 10 carbon atoms, and it is particularly preferable that equal to or more than half of the carbon atoms contained in $R^{a2}$ have a fluorine atom as a substituent, due to the reason that the alignment defects of the obtained liquid crystal layer are further suppressed.

In the present invention, the repeating unit F contained in the copolymer is more preferably a repeating unit represented by Formula (b).

(b)

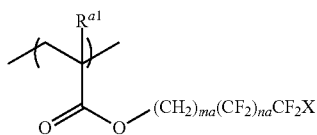

In Formula (b), $R^{a1}$ represents a hydrogen atom or an alkyl group having 1 to 20 carbon atoms, ma and na each independently represent an integer of 0 or more, and X is a hydrogen atom or a fluorine atom.

Here, ma is preferably an integer of 1 or more and 10 or less, and na is preferably 4 or more and 12 or less.

Specific examples of the monomer that forms the repeating unit F (hereinafter, also abbreviated as a "fluoroalkyl group-containing monomer") contained in the copolymer include 2,2,2-trifluoroethyl (meth)acrylate, 2,2,3,3,3-pentafluoropropyl (meth)acrylate, 2-(perfluorobutyl)ethyl (meth)acrylate, 2-(perfluorohexyl)ethyl (meth)acrylate, 2-(perfluoroctyl) (meth)acrylate, 2-(perfluorodecyl)ethyl (meth)acrylate, 2-(perfluoro-3-methylbutyl)ethyl (meth)acrylate, 2-(perfluoro-5-methylhexyl)ethyl (meth)acrylate, 2-(perfluoro-7-methyloctyl)ethyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H,1H,9H-hexadecafluorononyl (meth) acrylate, 1H-1-(trifuolomethyl)trifluoroethyl (meth)acrylate, 1H,1H,3H-hexafluorobutyl (meth)acrylate, 3-perfluorobutyl-2-hydroxypropyl (meth)acrylate, 3-perfluorohexyl-2-hydroxypropyl (meth)acrylate, 3-perfluorooctyl-2-hydroxypropyl (meth)acrylate, 3-(perfluoro-3-methylbutyl)-2-hydroxypropyl (meth)acrylate, 3-(perfluoro-5-methylhexyl)-2-hydroxypropyl (meth)acrylate, and 3-(perfluoro-7-methyloctyl)-2-hydroxypropyl (meth)acrylate.

In the present invention, the ratio of the fluoroalkyl group-containing monomer to be copolymerized with respect to 1 mol of the monomer having a mesogenic group which will be described later is preferably 0.01 to 100 mol, more preferably 0.1 to 50 mol, and still more preferably 1 to 30 mol, from the viewpoint of reactivity and surface modification effect.

(Repeating Unit M)

The repeating unit M contained in the copolymer is an unit containing a mesogenic group.

The mesogenic group is preferably the same as M1 in Formula (1) described in the above-described liquid crystal compound (the high-molecular weight liquid crystal compound), for example, a group having at least one cyclic structure selected from the group consisting of an aromatic hydrocarbon group, a heterocyclic group, and an alicyclic group, and more preferably a group represented by Formula (M1), due to the reason that the alignment defects of the obtained liquid crystal layer is further suppressed.

(M1)

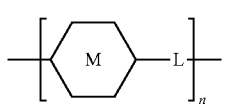

In Formula (M1), M represents at least one cyclic structure selected from the group consisting of an aromatic hydrocarbon group which may have a substituent, a heterocyclic group, and an alicyclic group.

In addition, n represents an integer of 3 or more.

In addition, L represents a single bond or an alkylene group having 1 to 4 carbon atoms.

Here, one or more pieces of —$CH_2$— constituting an alkylene group, represented by L, may be substituted with at least one group selected from the group consisting of a single bond, —O—, —S—, —N($R^{31}$)—, —C(=O)—, —C(=S)—, —C($R^{32}$)=C($R^{32}$)—, —C≡C—, —Si($R^{33}$)($R^{34}$)—, —N=N—, —$CR^{35}$=N—N=$CR^{36}$—, —$CR^{37}$=N—, and —$SO_2$—, $R^{31}$ to $R^{37}$ are each independently represent a hydrogen atom, a halogen atom, a cyano group, a nitro group or a linear or branched alkyl group having 1 to 10 carbon atoms.

Further, in a case where L represents an alkylene group, hydrogen atoms contained in one or more pieces of —$CH_2$— constituting an alkylene group may be substituted with at least one group selected from the group consisting of a halogen atom, a cyano group, a nitro group, a hydroxyl group, a linear alkyl group having 1 to 10 carbon atoms, and a branched alkyl groups having 1 to 10 carbon atoms.

The repeating unit M contained in the copolymer may be, for example, the same unit as the repeating unit (1) described above; however, it is more preferably a repeating unit formed by radically polymerizing a compound having a mesogenic group derived from at least one liquid crystal compound selected from a rod-like liquid crystal compound and a disk-like liquid crystal compound, and having two or more polymerizable groups.

Preferably used examples of the rod-like liquid crystal compound that forms a mesogenic group include azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy substituted phenylpyrimidines, phenyldioxanes, tolanes, and alkenylcyclohexylbenzonitriles.

As the rod-like liquid crystal compound, a compound described in Macromol. Chem., Vol. 190, page 2255 (1989), Advanced Materials Vol. 5, page 107 (1993), U.S. Pat. Nos. 4,683,327A, 5,622,648, 5,770,107A, WO1995/022586A, WO1995/024455A, WO1997/000600A, WO1998/023580A, WO1998/052905A, JP1989-272551A (JP-H1-272551A), JP1994-016616A (JP-H6-016616A), JP1995-110469A (JP-H7-110469A), JP1999-080081A (JP-H11-080081A), JP2001-329873A, or the like can be used. Further, the mesogenic group derived from the rod-like liquid crystal compound preferably contains a structure derived from the compound represented by Formula (X) below.

General Formula (X)

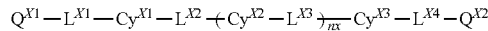

In the formula, $Q^{X1}$ and $Q^{X2}$ each independently represent a polymerizable group, $Q^{X1}$ and $L^{X4}$ each independently represent a divalent linking group, $L^{X2}$ and $L^{X3}$ each independently represent a single bond or a divalent linking group, $Cy^{X1}$, $Cy^{X2}$, and $Cy^{X3}$ represent a divalent cyclic group, and nx represents an integer of 0 to 3.

The rod-like liquid crystal compound represented by General Formula (X) will be further described below.

In the formula, $Q^{X1}$ and $Q^{X2}$ are each independently a polymerizable group. The polymerization reaction of the polymerizable group is preferably addition polymerization. In other words, the polymerizable group is preferably a functional group capable of undergoing an addition polymerization reaction. Examples of the polymerizable group include Formulae (M-1) to (M-6).

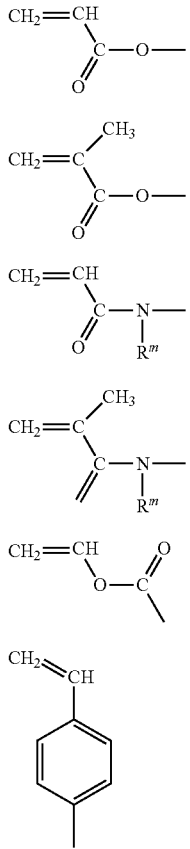

In Formulae (M-3) and (M-4), $R^m$ represents a hydrogen atom or an alkyl group having 1 to 20 carbon atoms, is more preferably an alkyl group having 1 to 7 carbon atoms, and is most preferably a hydrogen atom or methyl group.

Among Formulae (M-1) to (M-6), (M-1) or (M-2) is preferable, and (M-1) is more preferable.

$L^{X1}$ and $L^{X4}$ are each independently a divalent linking group. $L^{X1}$ and $L^{X4}$ are each independently preferably a divalent linking group selected from the group consisting of —O—, —S—, —CO—, —NR$^{x1}$—, —C=N—, a divalent chain-like group, a divalent cyclic group, and a combination thereof. R' is a hydrogen atom or an alkyl group having 1 to 7 carbon atoms. Examples of the divalent linking group consisting of the combination are as follows. Here, the left side is bonded to Q ($Q^{X1}$ or $Q^{X2}$), and the right side is bonded to Cy ($Cy^{X1}$ or $Cy^{X3}$).

Lx-1: —C(=O)O-divalent chain-like group-O—
Lx-2: —C(=O)O-divalent chain-like group-OC(=O)—
Lx-3: —C(=O)O-divalent chain-like group-OC(=O)O—
Lx-4: —C(=O)O-divalent chain-like group-O-divalent cyclic group-
Lx-5: —C(=O)O-divalent chain-like group-O-divalent cyclic group-C(=O)O—
Lx-6: —C(=O)O-divalent chain-like group-O-divalent cyclic group-OC(=O)—
Lx-7: —C(=O)O-divalent chain-like group-O-divalent cyclic group-divalent chain-like group-
Lx-8: —C(=O)O-divalent chain-like group-O-divalent cyclic group-divalent chain-like group-C(=O)O—
Lx-9: —C(=O)O-divalent chain-like group-O-divalent cyclic group-divalent chain-like group-OC(=O)—
Lx-10: —C(=O)O-divalent chain-like group-OC(=O)-divalent cyclic group-
Lx-11: —C(=O)O-divalent chain-like group-OC(=O)-divalent cyclic group-C(=O)O—
Lx-12: —C(=O)O-divalent chain-like group-OC(=O)-divalent cyclic group-OC(=O)—
Lx-13: —C(=O)O-divalent chain-like group-OC(=O)-divalent cyclic group-divalent chain-like group-Lx-14: —C(=O)O-divalent chain-like group-OC(=O)-divalent cyclic group-divalent chain-like group-C(=O)O—
Lx-15: —C(=O)O-divalent chain-like group-OC(=O)-divalent cyclic group-divalent chain-like group-OC(=O)—
Lx-16: —C(=O)O-divalent chain-like group-OC(=O)O-divalent cyclic group-
Lx-17: —C(=O)O-divalent chain-like group-OC(=O)O-divalent cyclic group-C(=O)O—
Lx-18: —C(=O)O-divalent chain-like group-OC(=O)O-divalent cyclic group-OC(=O)—
Lx-19: —C(=O)O-divalent chain-like group-OC(=O)O-divalent cyclic group-divalent chain-like group-
Lx-20: —C(=O)O-divalent chain-like group-OC(=O)O-divalent cyclic group-divalent chain-like group-C(=O)O—
Lx-21: —C(=O)O-divalent chain-like group-OC(=O)O-divalent cyclic group-divalent chain-like group-OC(=O)—

The divalent chain-like group means an alkylene group, a substituted alkylene group, an alkenylene group, a substituted alkenylene group, an alkynylene group, or a substituted alkynylene group. An alkylene group, a substituted alkylene group, an alkenylene group, or a substituted alkenylene group is preferable, and an alkylene group or an alkenylene group is more preferable.

The alkylene group may be branched. The alkylene group preferably has 1 to 12 carbon atoms, more preferably 2 to 10 carbon atoms, and most preferably 2 to 8 carbon atoms.

The alkylene moiety of the substituted alkylene group is the same as that of the alkylene group described above. Examples of the substituent include halogen atoms.

The alkenylene group may be a branched alkenylene group. The alkenylene group preferably has 2 to 12 carbon atoms, more preferably 2 to 10 carbon atoms, and most preferably 2 to 8 carbon atoms.

The alkenylene moiety of the substituted alkenylene group is the same as that of the alkenylene group described above. Examples of the substituent include halogen atoms.

The alkynylene group may be a branched alkynylene group. The alkynylene group preferably has 2 to 12 carbon atoms, more preferably 2 to 10 carbon atoms, and most preferably 2 to 8 carbon atoms.

The alkynylene moiety of the substituted alkynylene group is the same as that of the alkynylene group described above. Examples of the substituent include halogen atoms.

Specific examples of the divalent chain-like group include ethylene, trimethylene, propylene, tetramethylene, 2-methyl-tetramethylene, pentamethylene, hexamethylene, octamethylene, 2-butenylene, and 2-butynylene.

The definition and the examples of the divalent cyclic group are the same as the definition and the examples of $Cy^{X1}$, $Cy^{X2}$, and $Cy^{X3}$, which will be described later.

$L^{X2}$ or $L^{X3}$ are each independently a single bond or divalent linking group. $L^{X2}$ and $L^{X3}$ are each independently preferably a divalent linking group selected from the group consisting of —O—, —S—, —CO—, —NR$^{x2}$, —C=N—, a divalent chain-like group, a divalent cyclic group, and a combination thereof, or a single bond. The above R$^{X2}$ is a hydrogen atom or an alkyl group having 1 to 7 carbon atoms, preferably a hydrogen atom or an alkyl group having 1 to 4 carbon atoms, still more preferably a hydrogen atom, a methyl group, or an ethyl group, and most preferably a hydrogen atom. The definitions of the divalent chain-like group and the divalent cyclic group are the same as those in L$^{X1}$ and L$^{X4}$.

Preferred examples of the divalent linking group as L$^{X2}$ or L$^{X3}$ include —C(=O)O—, —OC(=O)—, —OC(=O)O—, —OC(=O)NR$^{X2}$—, —COS—, —SCO—, —CONR$^{X2}$—, —NR$^{X2}$CO—, —(CR$^{Xa}$R$^{Xb}$)$_{jx}$—, —C=C—C(=O)O—, —C=N—, —C=N—N=C—.

Here, R$^{Xa}$ and R$^{Xb}$ each independently represent a hydrogen atom or an alkyl group (for example, an alkyl group having 1 to 3 carbon atoms and preferably, a methyl group), and jx represents an integer of 1 or more, where jx is preferably an integer in a range of 1 to 3.

In the compound represented by General Formula (X), nx represents 0, 1, 2, or 3. In a case where nx is 2 or 3, a plurality of L$^{X3}$'s may be the same or different from each other, and a plurality of Cy$^{X2}$'s may be the same or different from each other. nx is preferably 1 or 2 and more preferably 1.

In the compound represented by General Formula (X), Cy$^{X1}$, Cy$^{X2}$, and Cy$^{X3}$ are each independently a divalent cyclic group. The ring contained in the divalent cyclic group is preferably a 5-membered ring, a 6-membered ring, or a 7-membered ring, more preferably a 5-membered ring or a 6-membered ring, and most preferably a 6-membered ring. The ring contained in the cyclic group may be a fused ring. However, a monocyclic ring is preferable to a fused ring.

The ring contained in the cyclic group may be any of an aromatic ring, an aliphatic ring, and a heterocyclic ring. Examples of the aromatic ring include a benzene ring and a naphthalene ring. Examples of the aliphatic ring include a cyclohexane ring. Examples of the heterocyclic ring include a pyridine ring and a pyrimidine ring.

The cyclic group having a benzene ring is preferably 1,4-phenylene. The cyclic group having a naphthalene ring is preferably naphthalene-1,5-diyl or naphthalene-2,6-diyl. The cyclic group having a cyclohexane ring is preferably 1,4-cyclohexylene. The cyclic group having a pyridine ring is preferably pyridine-2,5-diyl. The cyclic group having a pyrimidine ring is preferably pyrimidine-2,5-diyl.

The cyclic group may have a substituent. Examples of the substituent include a halogen atom, a cyano group, a nitro group, an alkyl group having 1 to 5 carbon atoms, a halogen-substituted alkyl group having 1 to 5 carbon atoms, an alkoxy group having 1 to 5 carbon atoms, an alkylthio group having 1 to 5 carbon atoms, an acyloxy group having 2 to 6 carbon atoms, an alkoxycarbonyl group having 2 to 6 carbon atoms, a carbamoyl group, an alkyl-substituted carbamoyl group having 2 to 6 carbon atoms, and an acylamino group having 2 to 6 carbon atoms.

The structure derived from the compound represented by General Formula (X) most preferably includes at least one structure derived from a compound selected from the group consisting of a compound represented by Formula (X-I) and a compound represented by Formula (X-II).

General Formula (X-1)

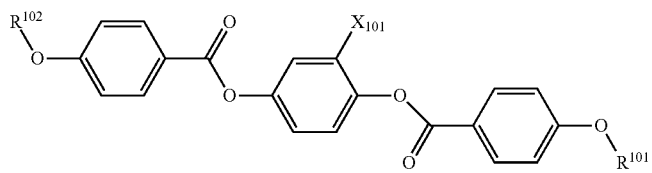

General Formula (X-II)

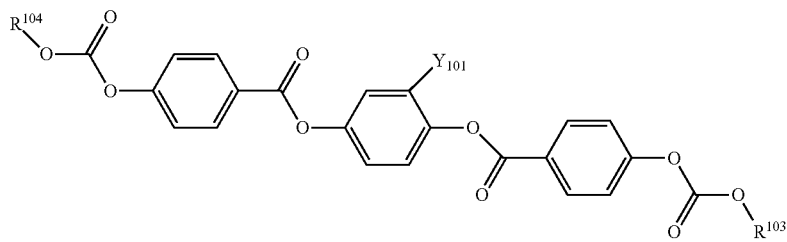

In General Formula (X-I) and General Formula (X-II), R$^{101}$ to R$^{104}$ each independently represent a polymerizable group, and X$_{101}$ and Y$_{101}$ are each independently represent a hydrogen atom, a methyl group, an ethyl group, a halogen atom, a fluorinated alkyl group, or an aldehyde group. Examples of the halogen atom include a chlorine atom and a bromine atom.

The definitions of R$^{101}$ to R$^{104}$ are the same as the definitions of Q$^{x1}$ and Q$^{x4}$, respectively; however, R$^{101}$ to R$^{104}$ are preferably a group represented by —(CH$_2$)$_{ny}$—O(O=)C—CH=C(R$^{Xc}$R$^{Xd}$). Here, R$^{Xc}$ and R$^{Xd}$ each independently represent a hydrogen atom or an alkyl group (for example, an alkyl group having 1 to 3 carbon atoms and preferably a methyl group), and ny is preferably an integer of 2 to 8.

From the viewpoint of suppressing crystal precipitation, X$_{101}$ and Y$_{101}$ in General Formula (X-I) or (X-II) preferably represent a methyl group. From the viewpoint of exhibiting liquid crystal properties, ny is preferably an integer of 4 to 8.

Examples of the compound represented by General Formula (X) are shown below. However, the present invention is not intended to be limited to these.

(X-1)
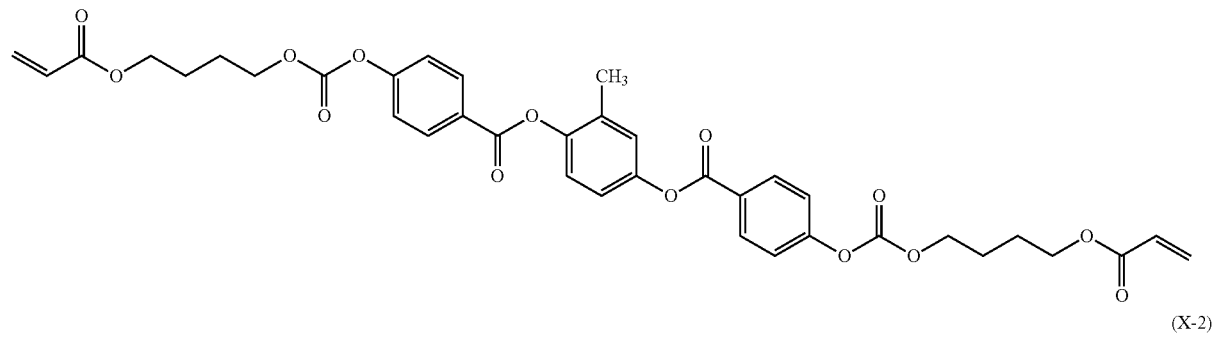
(X-2)
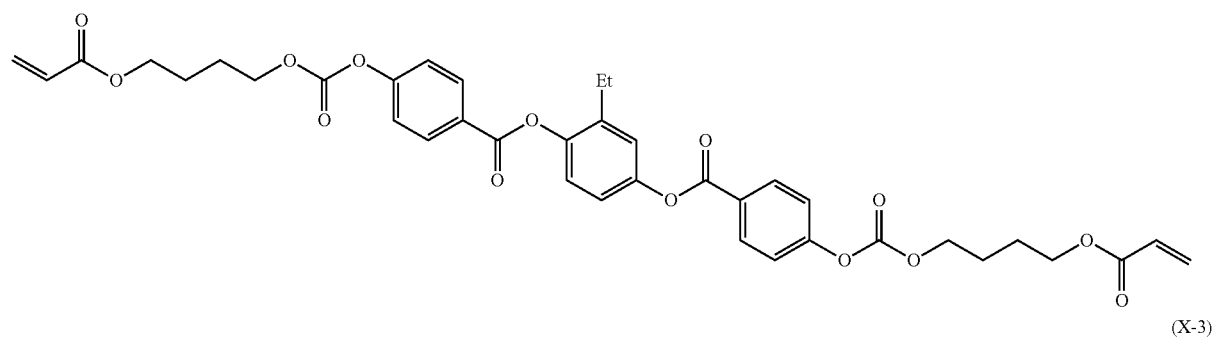
(X-3)
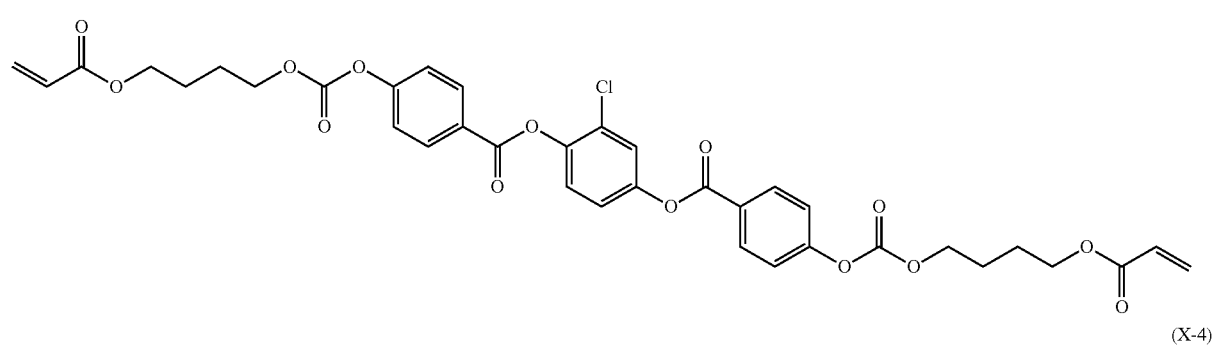
(X-4)
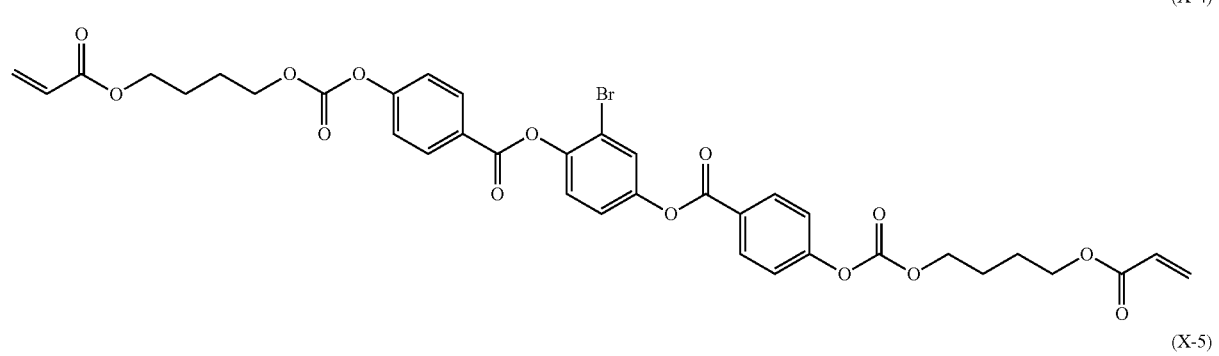
(X-5)
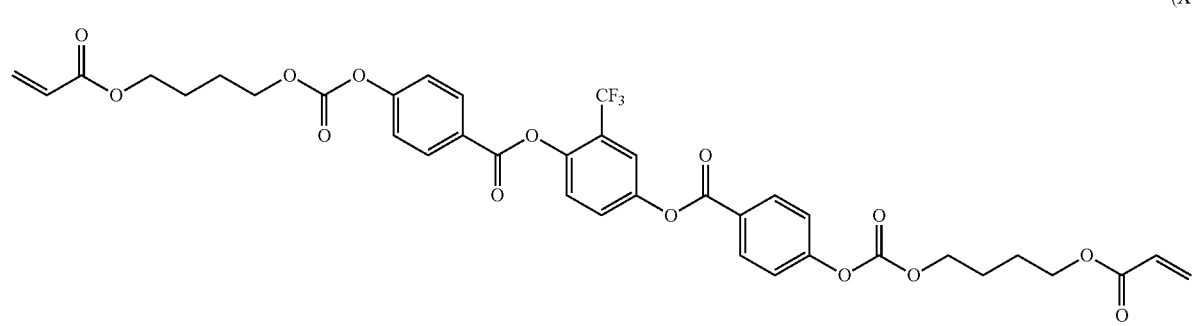

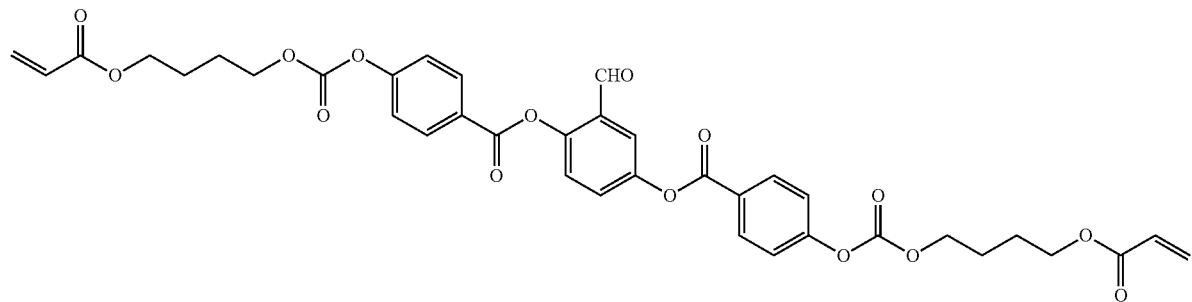
(X-6)
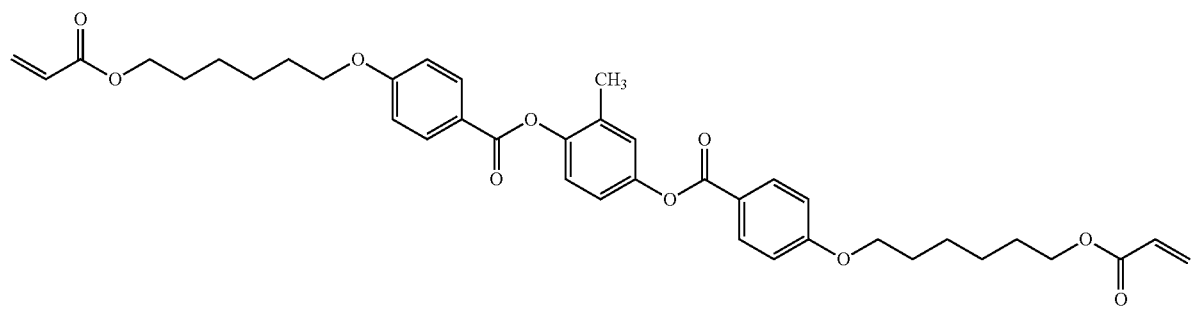
(X-7)
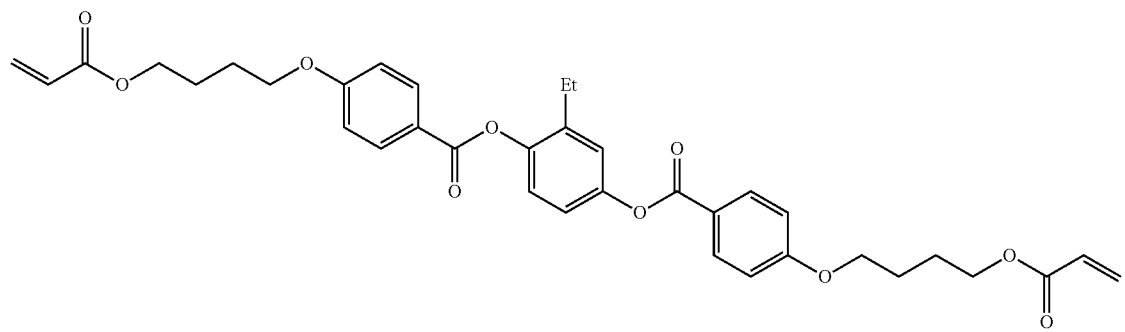
(X-8)
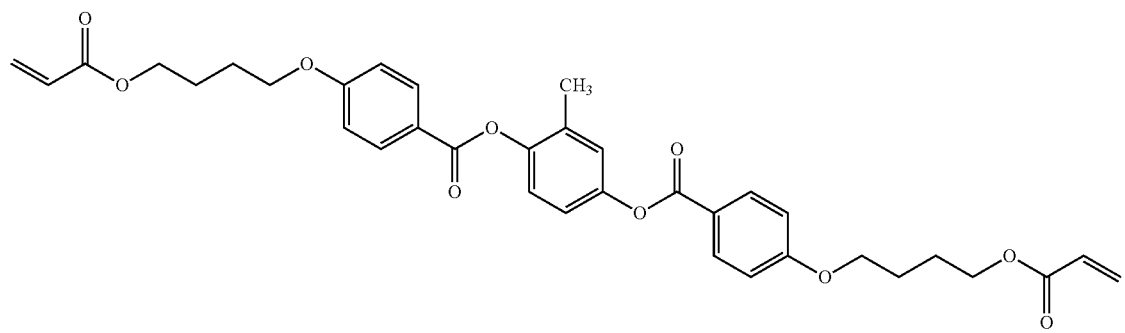
(X-9)

(X-10)
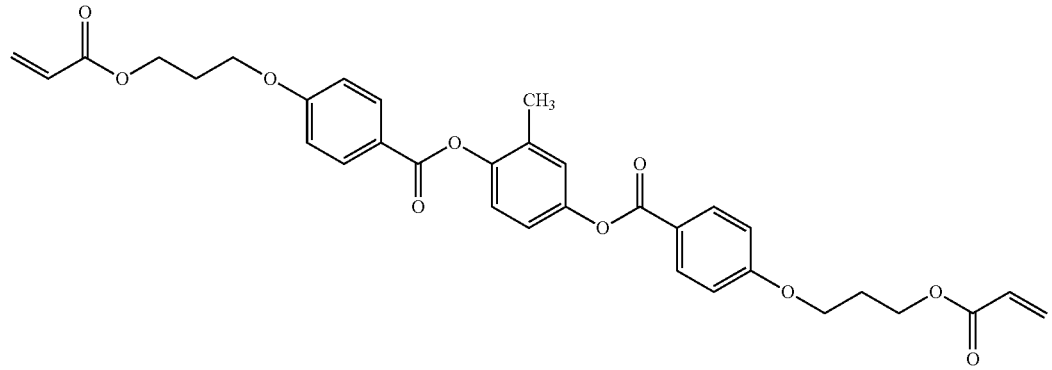
(X-11)
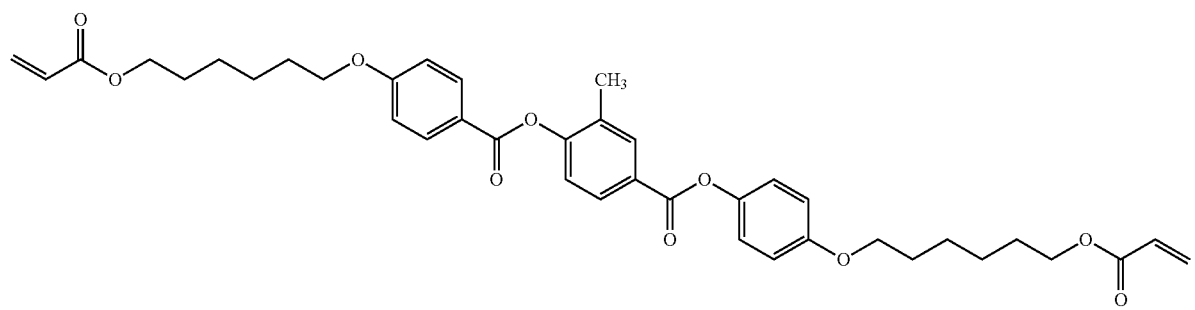
(X-12)
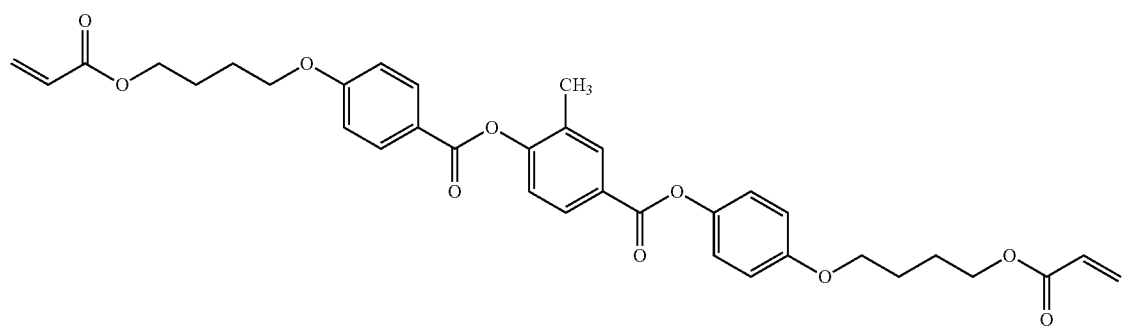
(X-13)
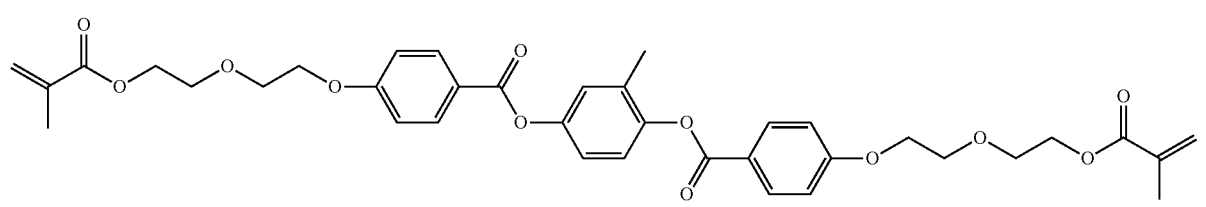
(X-14)
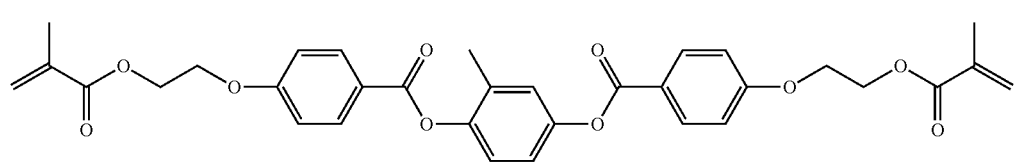
(X-15)
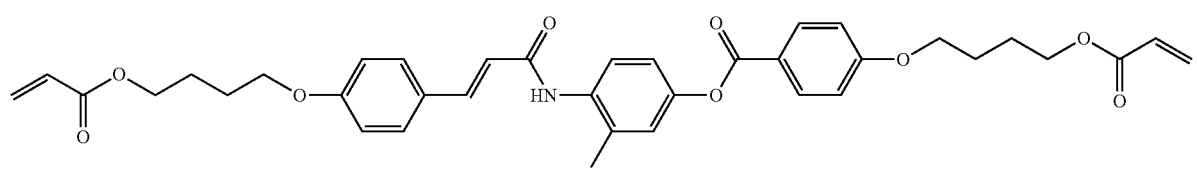

(X-16)
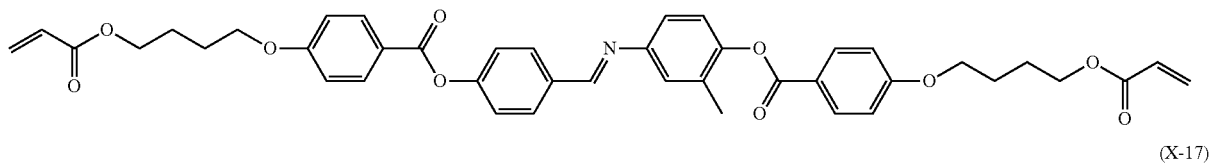
(X-17)
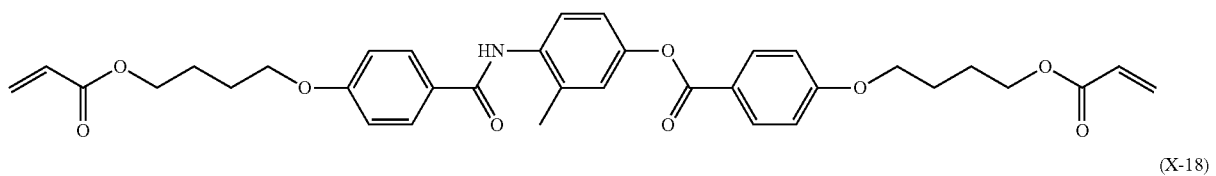
(X-18)
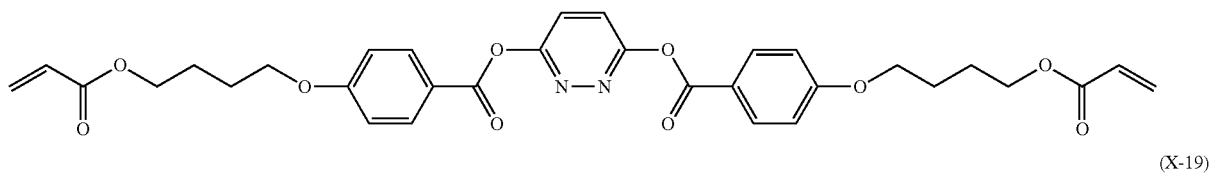
(X-19)
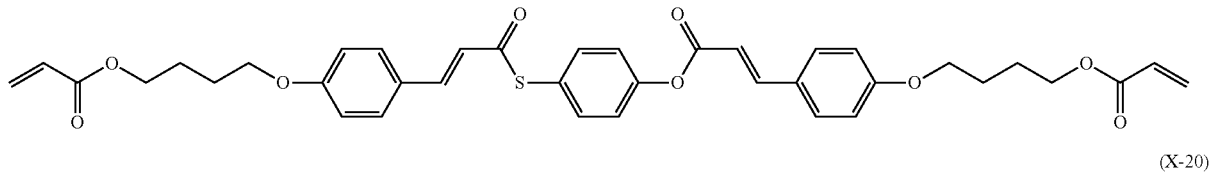
(X-20)
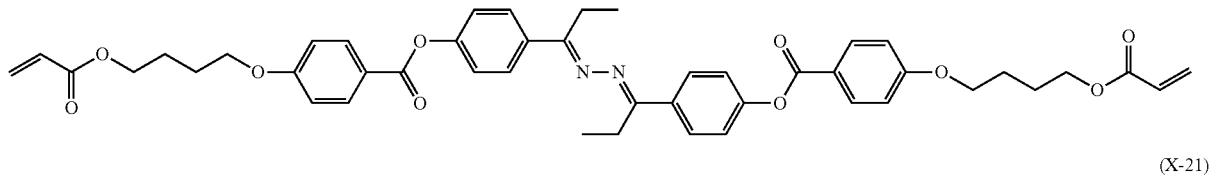
(X-21)
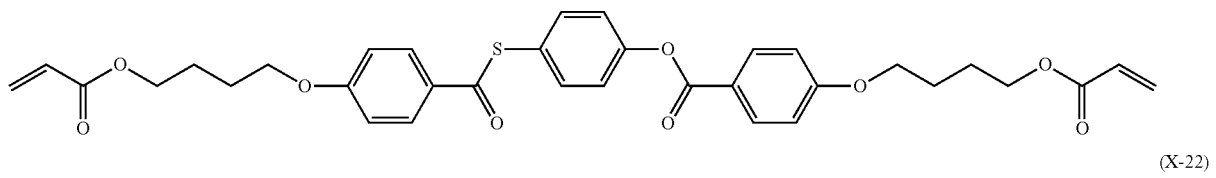
(X-22)
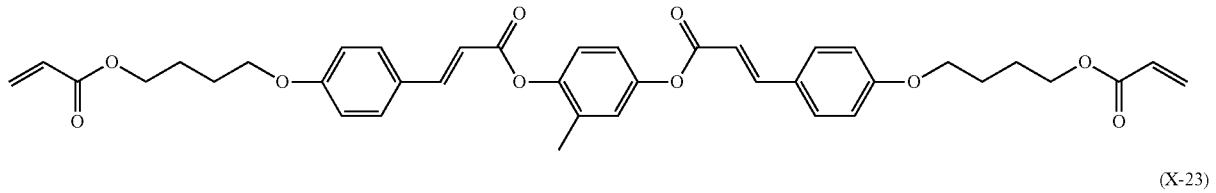
(X-23)
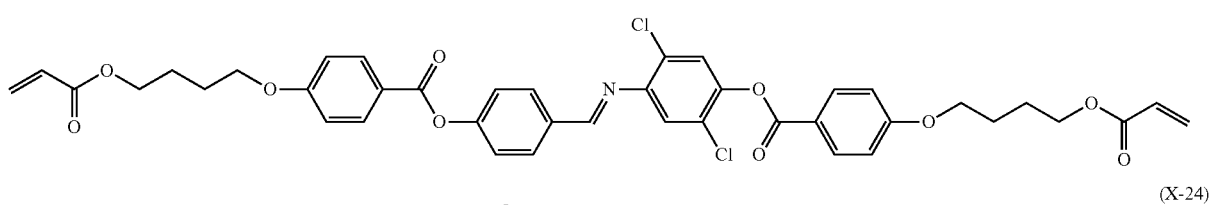
(X-24)
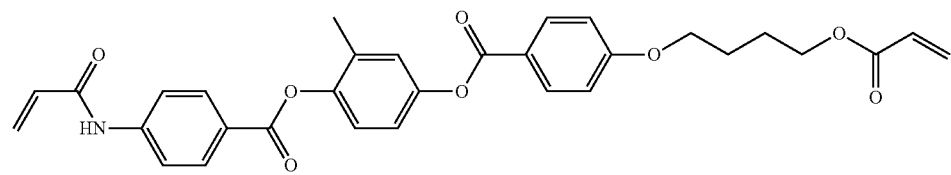

-continued
(X-25)
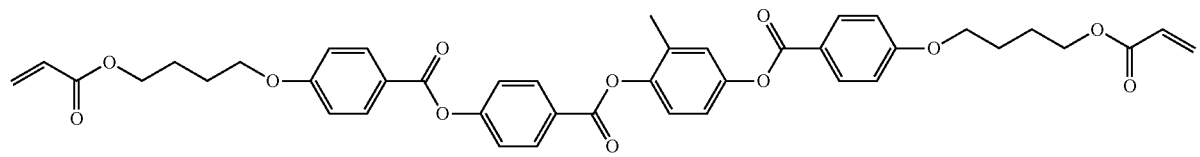
(X-26)
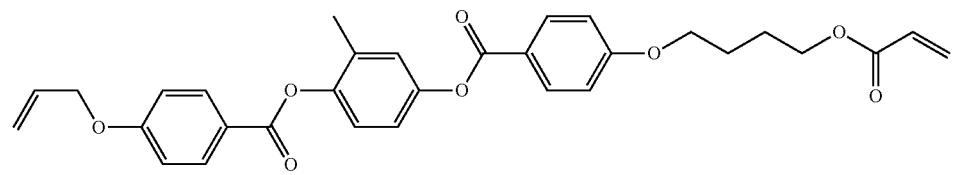
(X-27)
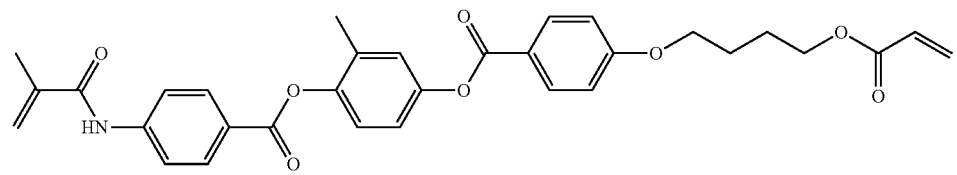
(X-28)
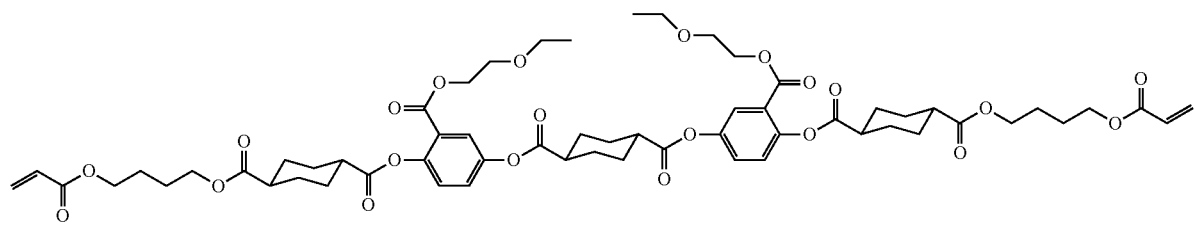
(X-29)
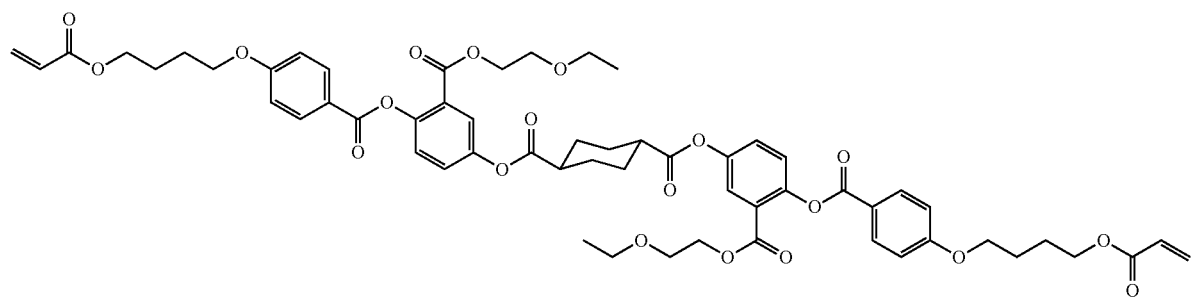
(X-30)
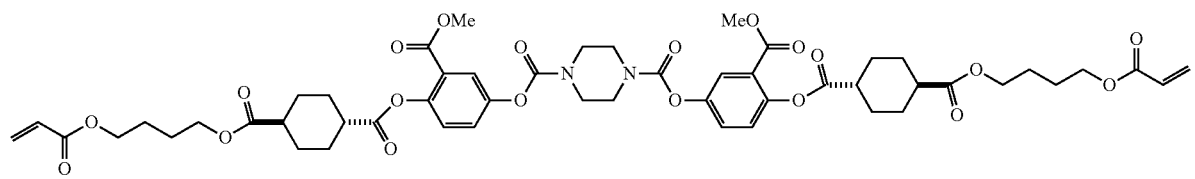
(X-31)
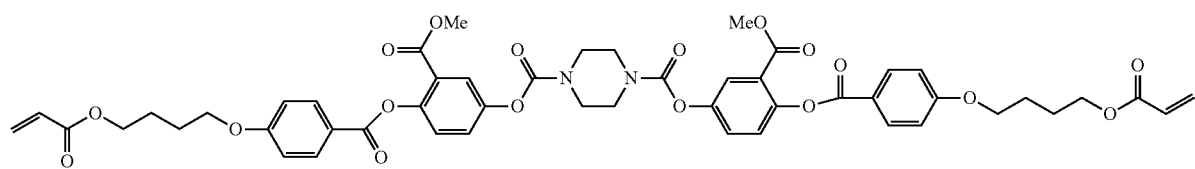

(X-32)
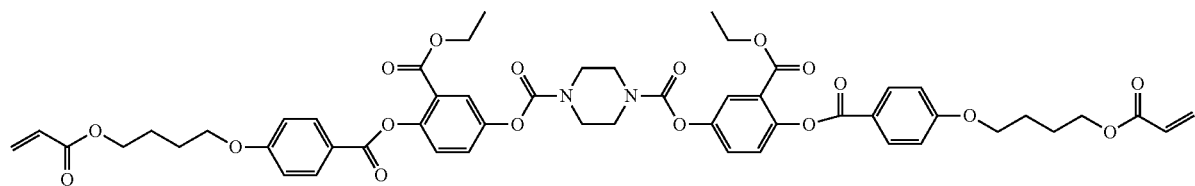
(X-33)
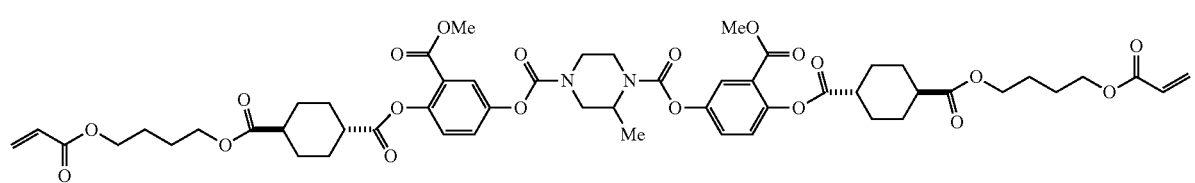
(X-34)
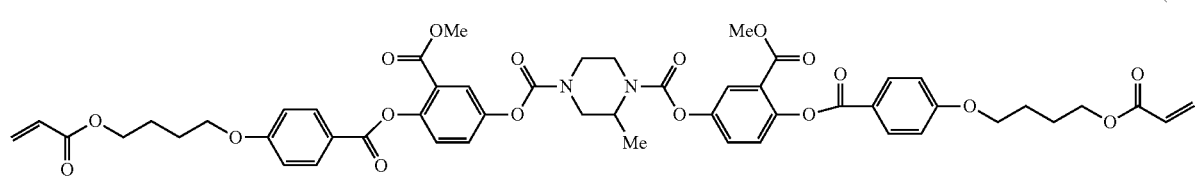
(X-35)
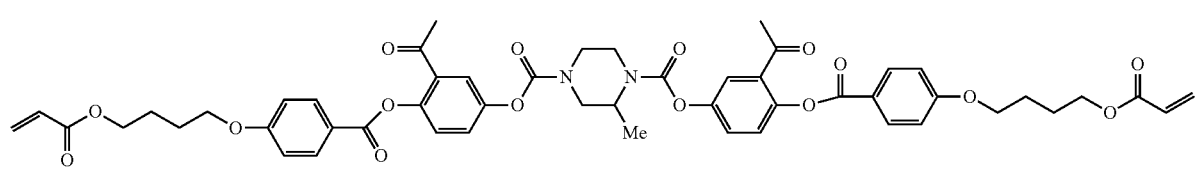
(X-36)
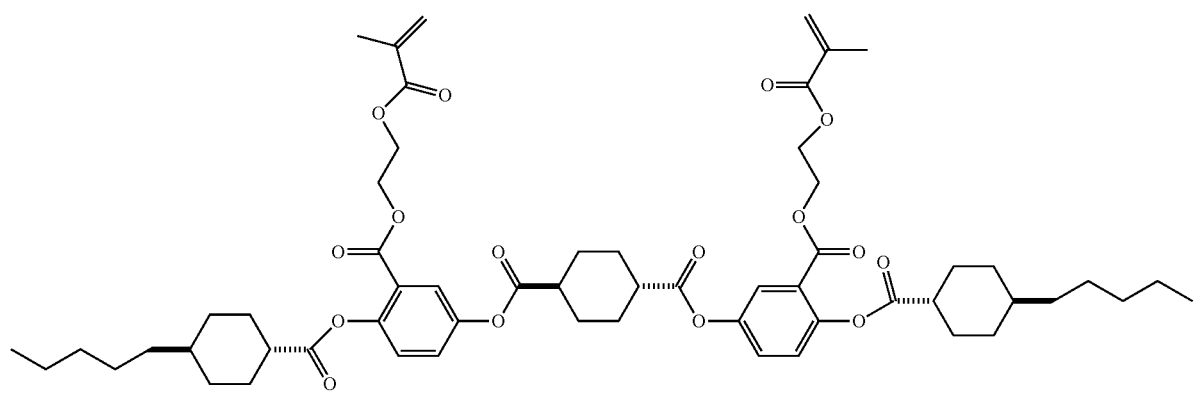
(X-37)
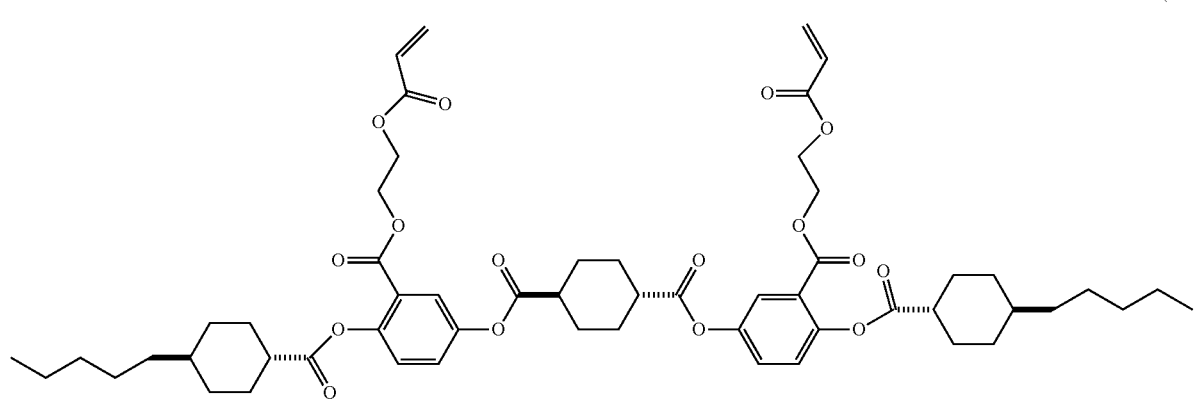

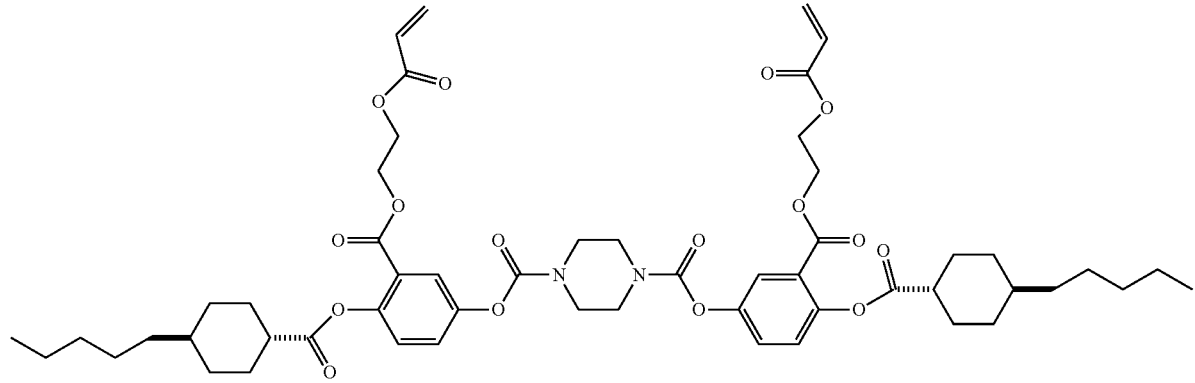
(X-38)
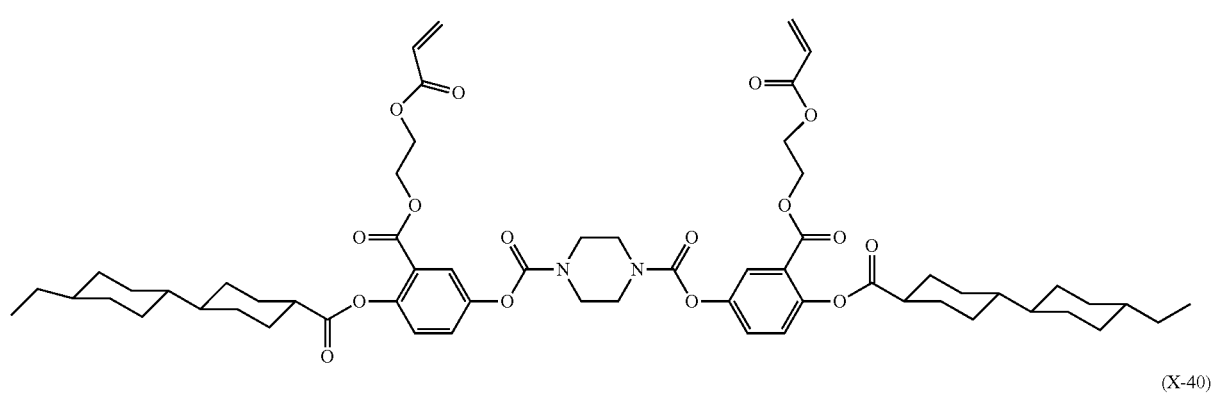
(X-39)
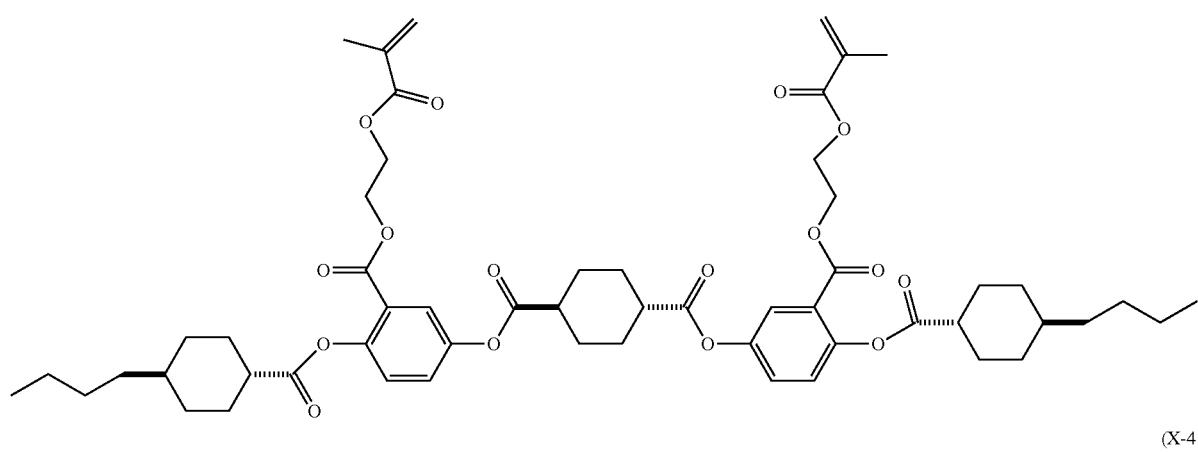
(X-40)
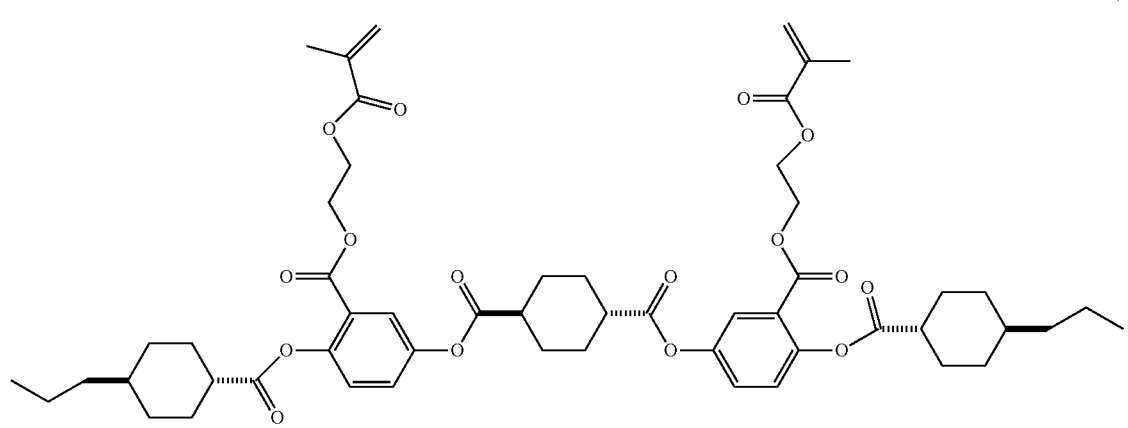
(X-41)

(X-42)
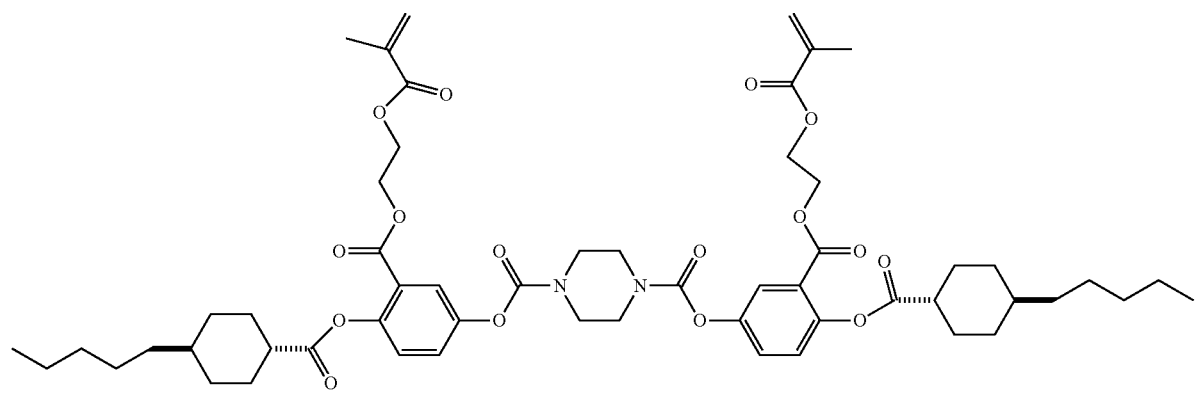
(X-43)
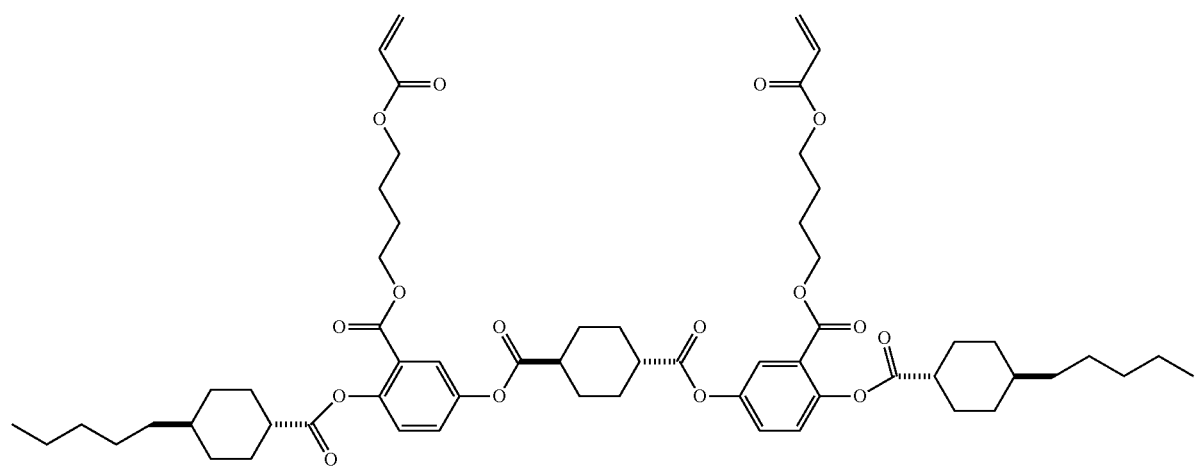
(X-44)
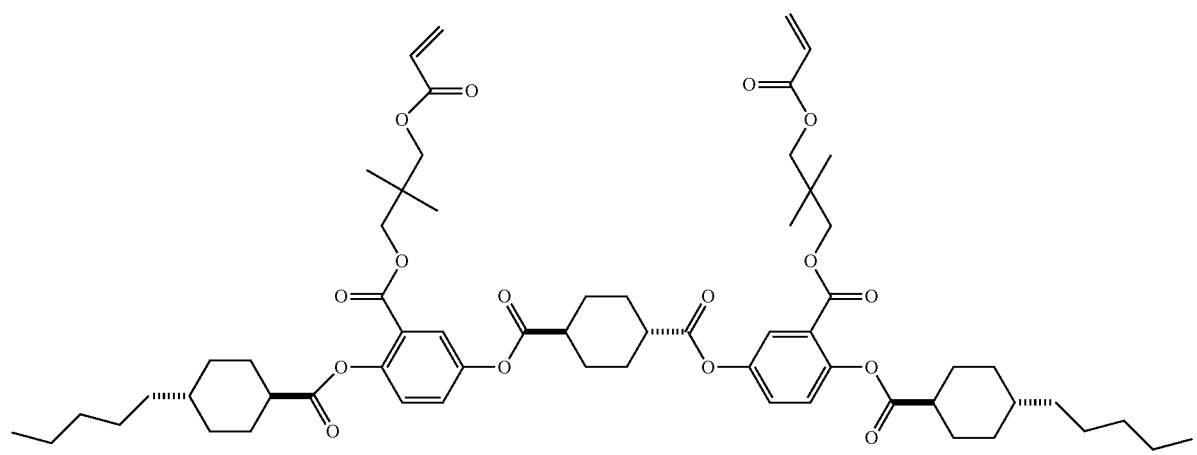

(X-45)

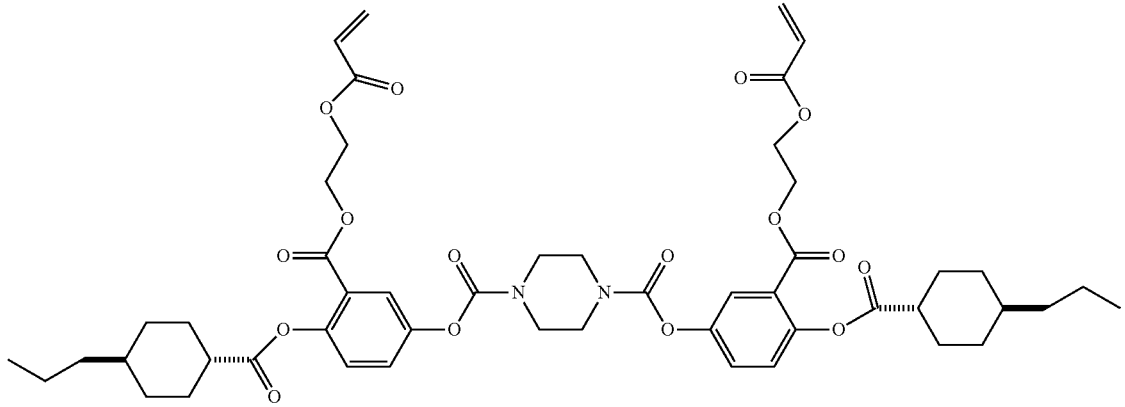

Examples of the rod-like liquid crystal compound represented by General Formula (X) include a rod-like liquid crystal compound having a mesogenic group and three or more polymerizable groups, preferred examples thereof include a rod-like liquid crystal compound having a mesogenic group and four polymerizable groups A, and specific examples thereof include the following rod-like liquid crystal compounds.

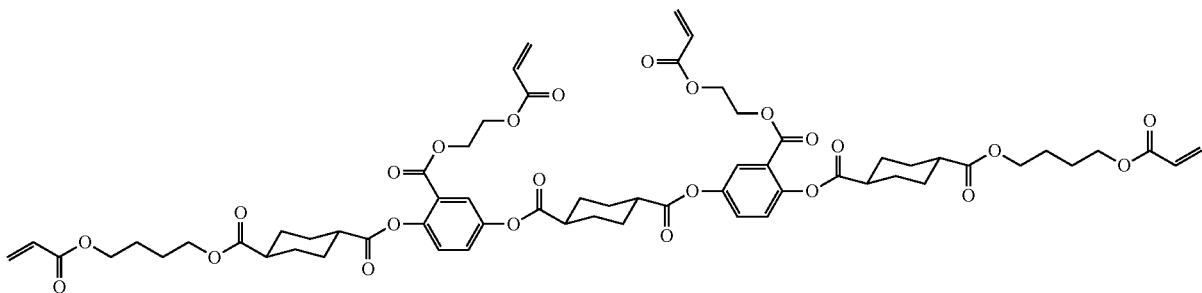

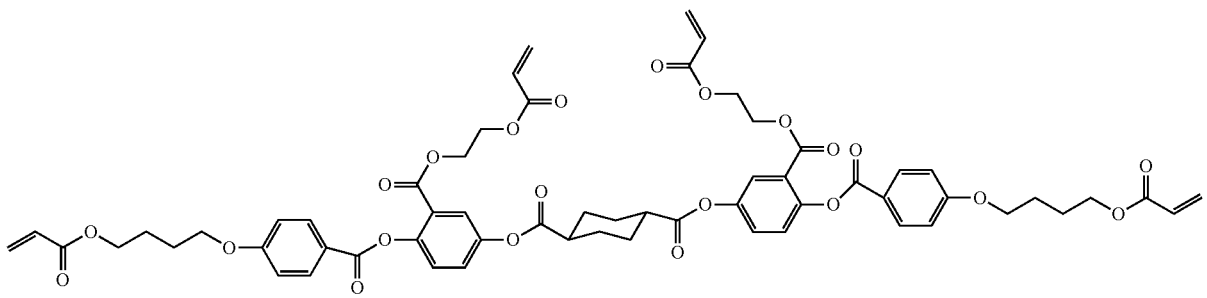

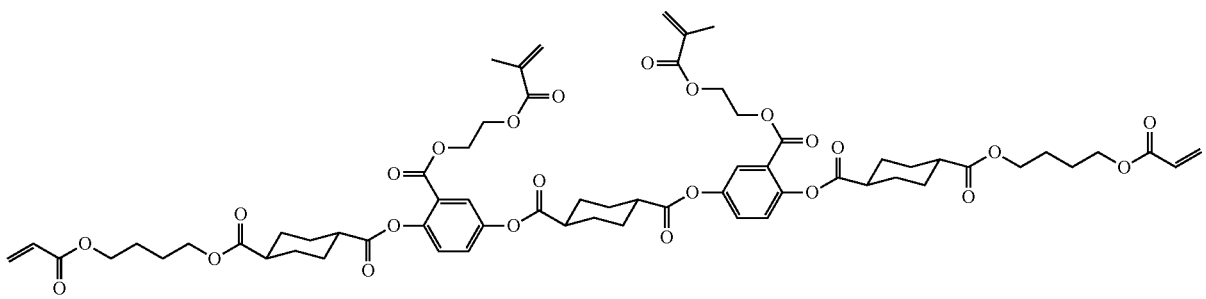

-continued

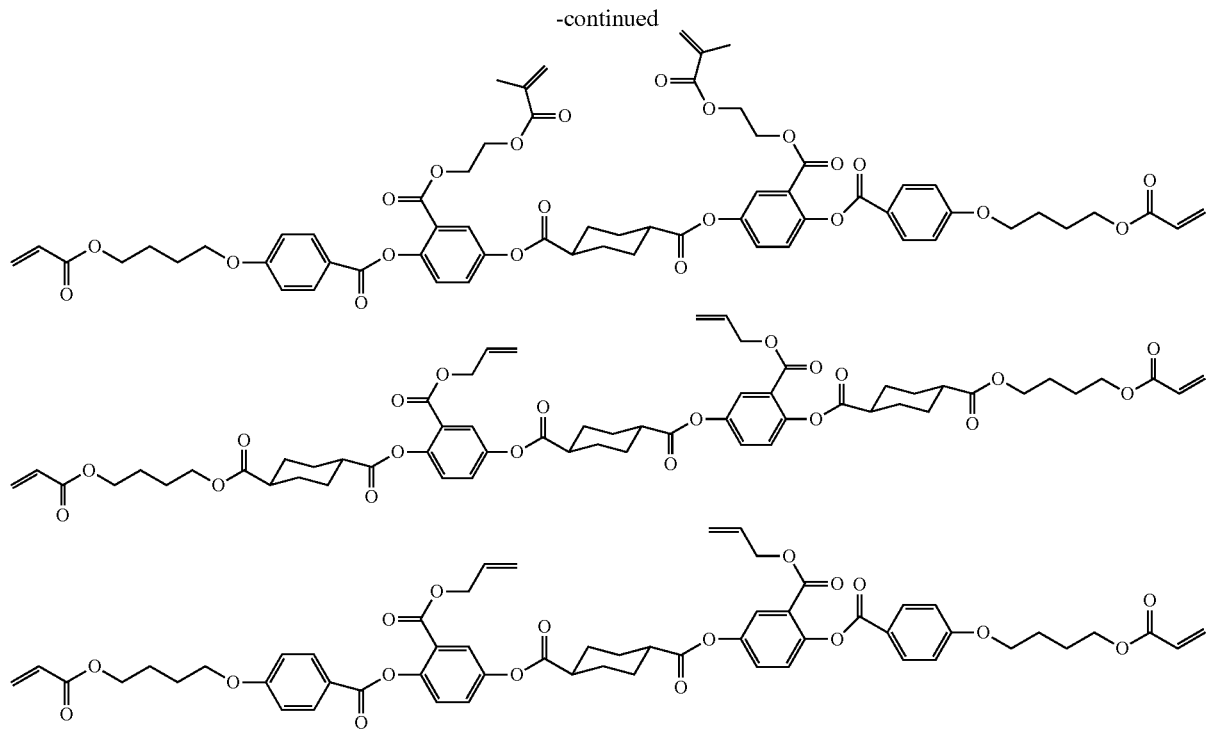

The mesogenic group derived from the disk-like liquid crystal compound also preferably contains a structure derived from the compound represented by Formula (I).

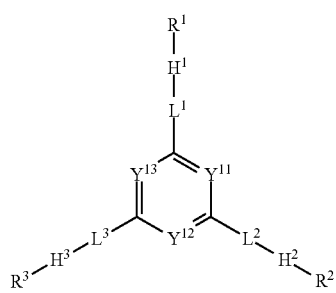

General Formula (I)

In General Formula (I), $Y^{11}$, $Y^{12}$, and $Y^{13}$ each independently represent a methine which may have a substituent, or a nitrogen atom, $L^1$, $L^2$, and $L^3$ each independently represent a single bond or a divalent linking group, and $H^1$, $H^2$, and $H^3$ each independently represent the group of General Formula (I-A) or (I-B).

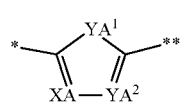

General Formula (I-A)

In General Formula (I-A), $YA^1$ and $YA^2$ each independently represent a methine which may have a substituent, or a nitrogen atom, XA represents an oxygen atom, a sulfur atom, a methylene, or an imino, * represents a position to which the $L^1$ to $L^3$ side in General Formula (I) is bonded, and ** represents a position to which the $R^1$ to $R^3$ side in General Formula (I) is bonded.

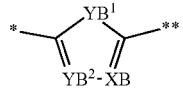

General Formula (I-B)

In General Formula (I-B), $YB^1$ and $YB^2$ each independently represent a methine which may have a substituent, or a nitrogen atom, XB represents an oxygen atom, a sulfur atom, methylene, or an imino, * represents a position to which the $L^1$ to $L^3$ side in General Formula (I) is bonded, and ** represents a position to which the $R^1$ to $R^3$ side in General Formula (I) is bonded.

$R^1$, $R^2$, and $R^3$ each independently represent Formula (I-R).

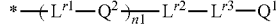

General Formula (I-R)

In General Formula (I-R), * represents a position that is bonded to the $H^1$ to $H^3$ side in General Formula (I), $L^{r1}$ represents a single bond or a divalent linking group, $Q^2$ represents a divalent group (a cyclic group) having at least one kind of cyclic structure, n1 represents an integer of 0 to 4, $L^{r2}$ and $L^{r3}$ each independently represent a divalent linking group, and $Q^1$ represents a polymerizable group or a hydrogen atom, where at least two of a plurality of $Q^1$'s represent a polymerizable group.

In General Formula (I), $Y^{11}$, $Y^{12}$, and $Y^{13}$ each independently represent a methine which may have a substituent, or a nitrogen atom, where the methine is preferably a methine which may have a substituent and more preferably an unsubstituted methine.

Preferred examples of the substituent that the methine may have include an alkyl group, an alkoxy group, an aryloxy group, an acyl group, an alkoxycarbonyl group, an acyloxy group, an acylamino group, an alkoxycarbonylamino group, an alkylthio group, an arylthio group, a halogen atom, and a cyano group. Among these substituents, an alkyl group, an alkoxy group, an alkoxycarbonyl group, an acyloxy group, a halogen atom, or a cyano group is more preferable, and an alkyl group having 1 to 12 carbon atoms, an alkoxy group having 1 to 12 carbon atoms, an alkoxycarbonyl group having 2 to 12 carbon atoms, an acyloxy group having 2 to 12 carbon atoms, a halogen atom, or a cyano group is more preferable.

$L^1$, $L^2$, and $L^3$ each independently represent a single bond or a divalent linking group.

In a case of being a divalent linking group, $L^1$, $L^2$, and $L^3$ are each independently preferably a divalent linking group selected from the group consisting of —O—, —S—, —C(=O)—, —NR$^7$—, —CH=CH—, —C≡C—, a divalent cyclic group, and a combination thereof. The above $R^7$ is a hydrogen atom or an alkyl group having 1 to 7 carbon atoms, preferably a hydrogen atom or an alkyl group having 1 to 4 carbon atoms, still more preferably a hydrogen atom, a methyl group, or an ethyl group, and most preferably a hydrogen atom.

The divalent cyclic group as $L^1$, $L^2$, and $L^3$ is a divalent linking group having at least one kind of cyclic structure (hereinafter, may be referred to as a cyclic group). The cyclic group is preferably a 5-membered ring, a 6-membered ring, or a 7-membered ring, more preferably a 5-membered ring or a 6-membered ring, and most preferably a 6-membered ring. The ring contained in the cyclic group may be a fused ring. However, a monocyclic ring is preferable to a fused ring. In addition, the ring contained in the cyclic group may be any of an aromatic ring, an aliphatic ring, and a heterocyclic ring. Preferred examples of the aromatic ring include a benzene ring and a naphthalene ring. Preferred examples of the aliphatic ring include a cyclohexane ring. The heterocyclic ring is preferably a ring containing at least one sulfur atom, one nitrogen atom, or one oxygen atom, and preferred examples thereof include a pyridine ring, a pyrimidine ring, and an oxadiazole ring. The cyclic group is more preferably an aromatic ring or a heterocyclic ring. The divalent cyclic group in the present invention is more preferably a divalent linking group consisting of a cyclic structure (however, a substituent may be contained therein) (hereinafter, the same is applied).

Among the divalent cyclic groups represented by $L^1$, $L^2$, and $L^3$, the cyclic group having a benzene ring is preferably a 1,4-phenylene group. The cyclic group having a naphthalene ring is preferably a naphthalene-1,5-diyl group or a naphthalene-2,6-diyl group. The cyclic group having a cyclohexane ring is preferably a 1,4-cyclohexylene group. The cyclic group having a pyridine ring is preferably a pyridine-2,5-diyl group. The cyclic group having a pyrimidine ring is preferably a pyrimidine-2,5-diyl group. The cyclic group having an oxadiazole ring is preferably a 1,2,4-oxadiazole-3,5-diyl group.

The divalent cyclic groups represented by $L^1$, $L^2$, and $L^3$, may have a substituent. Examples of the substituent include a halogen atom (preferably, a fluorine atom or a chlorine atom), a cyano group, a nitro group, an alkyl group having 1 to 16 carbon atoms, an alkenyl group having 2 to 16 carbon atoms, an alkynyl group having 2 to 16 carbon atoms, a halogen-substituted alkyl group having 1 to 16 carbon atoms, an alkoxy group having 1 to 16 carbon atoms, an acyl group having 2 to 16 carbon atoms, an alkylthio group having 1 to 16 carbon atoms, an acyloxy group having 2 to 16 carbon atoms, an alkoxycarbonyl group having 2 to 16 carbon atoms, a carbamoyl group, a carbamoyl group substituted with an alkyl group having 2 to 16 carbon atoms, and acylamino groups having 2 to 16 carbon atoms.

$L^1$, $L^2$, and $L^3$ are preferably a single bond, *—O—C(=O)—, *—C(=O)—O—, *—CH=CH—, *—C≡C—, *-divalent cyclic group-, *—O—C(=O)-divalent cyclic group-, *—C(=O)—O-divalent cyclic group-, *—CH=CH-divalent cyclic group-, *—C≡C-divalent cyclic group-, *-divalent cyclic group-O—C(=O)—, *-divalent cyclic group-C(=O)—O—, *-divalent cyclic group-CH=CH—, or *-divalent cyclic group-C≡C—. In particular, a single bond, *—CH=CH—, *—C≡C—, *—CH=CH-divalent cyclic group-, or *—C≡C-divalent cyclic group-is preferable, and a single bond is most preferable. Here, * represents a position that is bonded to the 6-membered ring side, where the 6-membered ring contains $Y^{11}$, $Y^{12}$, and $Y^{13}$ in General Formula (I).

In General Formula (I), $H^1$, $H^2$, and $H^3$ each independently represent the group of General Formula (I-A) or (I-B).

General Formula (I-A)

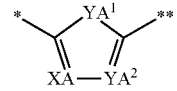

In General Formula (I-A), $YA^1$ and $YA^2$ each independently represent a methine which may have a substituent, or a nitrogen atom, XA represents an oxygen atom, a sulfur atom, a methylene, or an imino, * represents a position to which the L1 to L3 side in General Formula (I) is bonded, and ** represents a position to which the $R^1$ to $R^3$ side in General Formula (I) is bonded.

General Formula (I-B)

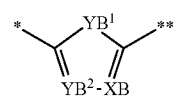

In General Formula (I-B), $YB^1$ and $YB^2$ each independently represent a methine which may have a substituent, or a nitrogen atom, XB represents an oxygen atom, a sulfur atom, a methylene, or an imino, * represents a position to which the $L^1$ to $L^3$ side in General Formula (I) is bonded, and ** represents a position to which the $R^1$ to $R^3$ side in General Formula (I) is bonded.

$R^1$, $R^2$, and $R^3$ each independently represent Formula (I-R).

General Formula (I-R)

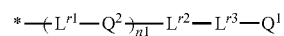

In General Formula (I-R), * represents a position to which the $H^1$ to $H^3$ side in General Formula (I) is bonded. $L^{r1}$ represents a single bond or a divalent linking group. $Q^2$ represents a divalent group (a cyclic group) having at least one kind of cyclic structure.

$L^{r1}$ represents a single bond or a divalent linking group. In a case of being a divalent linking group, $L^{r1}$ is preferably a divalent linking group selected from the group consisting of —O—, —S—, —C(=O)—, —NR$^7$—, —CH—CH—, and —C≡C—, and a combination thereof. The above R$^7$ is a hydrogen atom or an alkyl group having 1 to 7 carbon atoms, preferably a hydrogen atom or an alkyl group having 1 to 4 carbon atoms, still more preferably a hydrogen atom, a methyl group, or an ethyl group, and most preferably a hydrogen atom.

$L^{r1}$ is preferably any one of a single bond, *—O—CO—, *—CO—O—, *—CH=CH—, and *—C≡C— (here, *** represents the * side in General Formula (I-R)), and is more preferably a single bond.

$Q^2$ represents a divalent group (a cyclic group) having at least one kind of cyclic structure. Such a cyclic group is preferably a cyclic group having a 5-membered ring, a 6-membered ring, or a 7-membered ring, more preferably a cyclic group having a 5-membered ring or a 6-membered ring, and still more preferably a cyclic group having a 6-membered ring. The cyclic structure contained in the cyclic group may be a fused ring. However, a monocyclic ring is preferable to a fused ring. In addition, the ring contained in the cyclic group may be any of an aromatic ring, an aliphatic ring, and a heterocyclic ring. Preferred examples of the aromatic ring include a benzene ring, a naphthalene ring, an anthracene ring, and a phenanthrene ring. Preferred examples of the aliphatic ring include a cyclohexane ring. The heterocyclic ring is preferably a ring having at least one nitrogen atom or one oxygen atom, and preferred examples thereof include a pyridine ring, a pyrimidine ring, and an oxadiazole ring.

As the above $Q^2$, the cyclic group having a benzene ring is preferably a 1,4-phenylene group. The cyclic group having a naphthalene ring is preferably a naphthalene-1,4-diyl group, a naphthalene-1,5-diyl group, a naphthalene-1,6-diyl group, a naphthalene-2,5-diyl group, a naphthalene-2,6-diyl group, or a naphthalene-2,7-diyl group. The cyclic group having a cyclohexane ring is preferably a 1,4-cyclohexylene group. The cyclic group having a pyridine ring is preferably a pyridine-2,5-diyl group. The cyclic group having a pyrimidine ring is preferably a pyrimidine-2,5-diyl group. The oxadiazole ring is preferably a 1,2,4-oxadiazole-3,5-diyl group. Among the above, a 1,4-phenylene group, a naphthalene-2,6-diyl group, a 1,4-cyclohexylene group, or a 1,2,4-oxadiazole-3,5-diyl group is particularly preferable.

$Q^2$ may have a substituent. Examples of the substituent include a halogen atom (a fluorine atom, a chlorine atom, a bromine atom, or iodine atom), a cyano group, a nitro group, an alkyl group having 1 to 16 carbon atoms, an alkenyl group having 2 to 16 carbon atoms, an alkynyl group having 2 to 16 carbon atoms, a halogen-substituted alkyl group having 1 to 16 carbon atoms, an alkoxy group having 1 to 16 carbon atoms, an acyl group having 2 to 16 carbon atoms, an alkylthio group having 1 to 16 carbon atoms, an acyloxy group having 2 to 16 carbon atoms, an alkoxycarbonyl group having 2 to 16 carbon atoms, a carbamoyl group, a carbamoyl group substituted with an alkyl group having 2 to 16 carbon atoms, and acylamino groups having 2 to 16 carbon atoms. Among these, a halogen atom, a cyano group, an alkyl group having 1 to 6 carbon atoms, or an alkyl group having 1 to 6 carbon atoms and substituted with a halogen atom is preferable, a halogen atom, an alkyl group having 1 to 4 carbon atoms, or an alkyl group having 1 to 4 carbon atoms and substituted with a halogen atom is more preferable, and a halogen atom, an alkyl group having 1 to 3 carbon atoms, or a trifluoromethyl group is still more preferable.

n1 represents an integer of 0 to 4. n1 is preferably an integer of 1 to 3 and more preferably 1 or 2.

$L^{r2}$ presents —O—, —O—C(=O)—, —C(=O)—O—, —O—C(=O)—O—, —S—, —NH—, —SO$_2$—, —CH$_2$—, —CH=CH—, or —C≡C—, and ** represents a position to which $Q^2$ is bonded.

$L^{r2}$ is preferably —O—, —O—C(=O)—, —C(=O)—O—, —O—C(=O)—O—, —CH$_2$—, —CH=CH—, or —C≡C—, and more preferably —O—, —O—C(=O)—, —O—C(=O)—O—, or **—CH$_2$—.

In a case where $L^{r2}$ is a group containing a hydrogen atom, this hydrogen atom may be substituted with a substituent. Preferred examples of such a substituent include a halogen atom, a cyano group, a nitro group, an alkyl group having 1 to 6 carbon atoms, an alkyl group having 1 to 6 carbon atoms and substituted with a halogen atom, an alkoxy group having 1 to 6 carbon atoms, an acyl group having 2 to 6 carbon atoms, an alkylthio group having 1 to 6 carbon atoms, an acyloxy group having 2 to 6 carbon atoms, an alkoxycarbonyl group having 2 to 6 carbon atoms, a carbamoyl group, a carbamoyl group substituted with an alkyl group having 2 to 6 carbon atoms, and acylamino groups having 2 to 6 carbon atoms, and more preferred examples thereof include a halogen atom and an alkyl group having 1 to 6 carbon atoms.

$L^{r3}$ represents a divalent linking group selected from the group consisting of —O—, —S—, —C(=O)—, —SO$_2$—, —NH—, —CH$_2$—, —CH=CH—, and —C≡C—, and a combination thereof. Here, the hydrogen atoms of —NH—, —CH$_2$—, and —CH=CH— may be substituted with a substituent. Preferred examples of such a substituent include a halogen atom, a cyano group, a nitro group, an alkyl group having 1 to 6 carbon atoms, an alkyl group having 1 to 6 carbon atoms and substituted with a halogen atom, an alkoxy group having 1 to 6 carbon atoms, an acyl group having 2 to 6 carbon atoms, an alkylthio group having 1 to 6 carbon atoms, an acyloxy group having 2 to 6 carbon atoms, an alkoxycarbonyl group having 2 to 6 carbon atoms, a carbamoyl group, a carbamoyl group substituted with an alkyl group having 2 to 6 carbon atoms, and acylamino groups having 2 to 6 carbon atoms, and more preferred examples thereof include a halogen atom and an alkyl group having 1 to 6 carbon atoms. In a case of carrying out substitutions with these substituents, the solubility in the solvent used at the time of preparing a liquid crystal composition can be improved.

$L^{r3}$ is preferably selected from the group consisting of —O—, —C(=O)—, —CH$_2$—, —CH=CH—, and —C≡C, and a combination thereof. $L^{r3}$ preferably has 1 to 20 carbon atoms and more preferably has 2 to 14 carbon atoms. Further, $L^{r3}$ preferably has 1 to 16 pieces of —CH$_2$— and more preferably has 2 to 12 pieces of —CH$_2$—.

$Q^1$ represents a polymerizable group or a hydrogen atom, and at least two of a plurality of $Q^1$'s represent a polymerizable group. Further, all of the plurality of $Q^1$'s are preferably a polymerizable group. The definition of $Q^1$ is the same as the definitions of $Q^{X1}$ and $Q^{X4}$, and the preferred range thereof is also the same.

Among the compounds of General Formula (I), the compound represented by Formula (I') is more preferable.

General Formula (I')

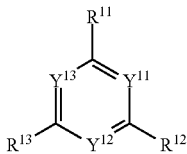

In General Formula (I'), $Y^{11}$, $Y^{12}$, and $Y^{13}$ are synonymous with $Y^{11}$, $Y^{12}$, and $Y_{13}$ in General Formula (I), and $R^{11}$, $R^{12}$, and $R^{13}$ each independently represent Formula (I'-A), Formula (I'-B), or Formula (I'-C).

General Formula (I'-A)

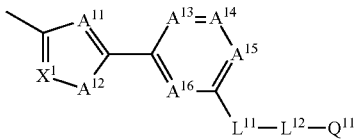

In General Formula (I'-A), $A^{11}$, $A^{12}$, $A^{13}$, $A^{14}$, $A^{15}$, and $A^{16}$ each independently represent a methine which may have a substituent, or a nitrogen atom, $X^1$ represents an oxygen atom, sulfur atom, methylene, or an imine, $L^{11}$ and $L^{12}$ each independently represent a divalent linking group, and $Q^{11}$ represents a polymerizable group or a hydrogen atom.

General Formula (I'-B)

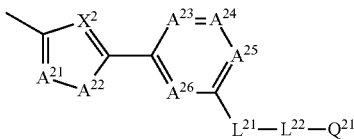

In General Formula, (I'-B), $A^{21}$, $A^{22}$, $A^{23}$, $A^{24}$, $A^{25}$, and $A^{26}$ each independently represent a methine which may have a substituent, or a nitrogen atom, $X^2$ represents an oxygen atom, sulfur atom, methylene, or an imine, $L^{21}$ and $L^{22}$ each independently represent a divalent linking group, and $Q^{21}$ represents a polymerizable group or a hydrogen atom.

General Formula (I'-C)

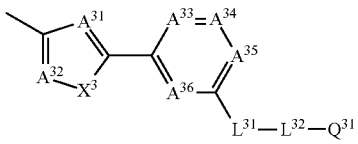

In General Formula (I'-C), $A^{31}$, $A^{32}$, $A^{33}$, $A^{34}$, $A^{35}$, and $A^{36}$ each independently represent a methine which may have a substituent, or a nitrogen atom, $X^3$ represents an oxygen atom, sulfur atom, methylene, or an imine, $L^{31}$ and $L^{32}$ each independently represent a divalent linking group, and $Q^{31}$ represents a polymerizable group or a hydrogen atom.

However, at least two of $Q^{11}$, $Q^{21}$, and $Q^{31}$ represent a polymerizable group.

In General Formula (I'), $Y^{11}$, $Y^{12}$, and $Y^{13}$ are synonymous with $Y^{11}$, $Y^{12}$, and $Y^{13}$ in General Formula (I), and the preferred ranges thereof are also the same.

$R^{11}$, $R^{12}$, and $R^{13}$ each independently represent Formula (I'-A), Formula (I'-B), or Formula (I'-C). In a case where the reduction of the wavelength dispersibility in the intrinsic birefringence is intended, General Formula (I'-A) or General Formula (I'-C) is preferable, and General Formula (I'-A) is more preferable. $R^{11}$, $R^{12}$, and $R^{13}$ are preferably $R^{11}=R^{12}=R^{13}$.

General Formula (I'-A)

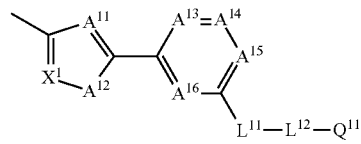

In General Formula (I'-A) $A^{11}$, $A^{12}$, $A^{13}$, $A^{14}$, $A^{15}$, and $A^{16}$ each independently represent a methine which may have a substituent, or a nitrogen atom.

At least one of $A^{11}$ or $A^{12}$ is preferably a nitrogen atom, and more preferably both of $A^{11}$ and $A^{12}$ are a nitrogen atom.

Among $A^{13}$, $A^{14}$, $A^{15}$, and $A^{16}$, preferably at least three of them are a methine which may have a substituent, and more preferably all of them are a methine which may have a substituent. Furthermore, these methines are preferably unsubstituted.

In a case where $A^{11}$, $A^{12}$, $A^{13}$, $A^{14}$, $A^{15}$, or $A^{16}$ is a methine which may have a substituent, examples of the substituent include a halogen atom (a fluorine atom, a chlorine atom, a bromine atom, or iodine atom), a cyano group, a nitro group, an alkyl group having 1 to 16 carbon atoms, an alkenyl group having 2 to 16 carbon atoms, an alkynyl group having 2 to 16 carbon atoms, a halogen-substituted alkyl group having 1 to 16 carbon atoms, an alkoxy group having 1 to 16 carbon atoms, an acyl group having 2 to 16 carbon atoms, an alkylthio group having 1 to 16 carbon atoms, an acyloxy group having 2 to 16 carbon atoms, an alkoxycarbonyl group having 2 to 16 carbon atoms, a carbamoyl group, a carbamoyl group substituted with an alkyl group having 2 to 16 carbon atoms, and acylamino groups having 2 to 16 carbon atoms. Among these, a halogen atom, a cyano group, an alkyl group having 1 to 6 carbon atoms, or an alkyl group having 1 to 6 carbon atoms and substituted with a halogen atom is preferable, a halogen atom, an alkyl group having 1 to 4 carbon atoms, or an alkyl group having 1 to 4 carbon atoms and substituted with a halogen atom is more preferable, and a halogen atom, an alkyl group having 1 to 3 carbon atoms, or a trifluoromethyl group is still more preferable.

$X^1$ represents an oxygen atom, a sulfur atom, a methylene, or an imino, and an oxygen atom is preferable.

General Formula (I'-B)

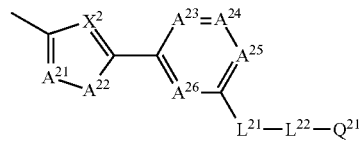

In General Formula (I'-B), $A^{21}$, $A^{22}$, $A^{23}$, $A^{24}$, $A^{25}$, and $A^{26}$ each independently represent a methine which may have a substituent, or a nitrogen atom.

At least one of $A^{21}$ or $A^{22}$ is preferably a nitrogen atom, and more preferably both of $A^{21}$ and $A^{22}$ are a nitrogen atom.

Among $A^{23}$, $A^{24}$, $A^{25}$, and $A^{26}$, preferably at least three of them are a methine which may have a substituent, and more preferably all of them are a methine which may have a substituent. Furthermore, these methines are preferably unsubstituted.

In a case where $A^{21}$, $A^{22}$, $A^{23}$, $A^{24}$, $A^{25}$, or $A^{26}$ is a methine which may have a substituent, examples of the substituent include a halogen atom (a fluorine atom, a chlorine atom, a bromine atom, or iodine atom), a cyano group, a nitro group, an alkyl group having 1 to 16 carbon atoms, an alkenyl group having 2 to 16 carbon atoms, an alkynyl group having 2 to 16 carbon atoms, a halogen-substituted alkyl group having 1 to 16 carbon atoms, an alkoxy group having 1 to 16 carbon atoms, an acyl group having 2 to 16 carbon atoms, an alkylthio group having 1 to 16 carbon atoms, an acyloxy group having 2 to 16 carbon atoms, an alkoxycarbonyl group having 2 to 16 carbon atoms, a carbamoyl group, a carbamoyl group substituted with an alkyl group having 2 to 16 carbon atoms, and acylamino groups having 2 to 16 carbon atoms. Among these, a halogen atom, a cyano group, an alkyl group having 1 to 6 carbon atoms, or an alkyl group having 1 to 6 carbon atoms and substituted with a halogen atom is preferable, a halogen atom, an alkyl group having 1 to 4 carbon atoms, or an alkyl group having 1 to 4 carbon atoms and substituted with a halogen atom is more preferable, and a halogen atom, an alkyl group having 1 to 3 carbon atoms, or a trifluoromethyl group is still more preferable.

$X^2$ represents an oxygen atom, a sulfur atom, a methylene, or an imino, and an oxygen atom is preferable.

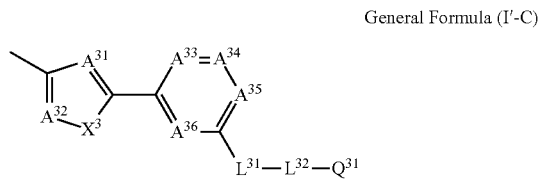

General Formula (I'-C)

In General Formula (I'-B), $A^{31}$, $A^{32}$, $A^{33}$, $A^{34}$, $A^{35}$, and $A^{36}$ each independently represent a methine which may have a substituent, or a nitrogen atom.

At least one of $A^{31}$ or $A^{32}$ is preferably a nitrogen atom, and more preferably both of $A^{31}$ and $A^{32}$ are a nitrogen atom.

Among, $A^{33}$, $A^{34}$, $A^{35}$, and $A^{36}$, preferably at least three of them are a methine which may have a substituent, and more preferably all of them are a methine which may have a substituent. Furthermore, these methines are preferably unsubstituted.

In a case where $A^{31}$, $A^{32}$, $A^{33}$, $A^{34}$, $A^{35}$, or $A^{36}$ is a methine which may have a substituent, the methine may have a substituent. Examples of the substituent include a halogen atom (a fluorine atom, a chlorine atom, a bromine atom, or iodine atom), a cyano group, a nitro group, an alkyl group having 1 to 16 carbon atoms, an alkenyl group having 2 to 16 carbon atoms, an alkynyl group having 2 to 16 carbon atoms, a halogen-substituted alkyl group having 1 to 16 carbon atoms, an alkoxy group having 1 to 16 carbon atoms, an acyl group having 2 to 16 carbon atoms, an alkylthio group having 1 to 16 carbon atoms, an acyloxy group having 2 to 16 carbon atoms, an alkoxycarbonyl group having 2 to 16 carbon atoms, a carbamoyl group, a carbamoyl group substituted with an alkyl group having 2 to 16 carbon atoms, and acylamino groups having 2 to 16 carbon atoms. Among these, a halogen atom, a cyano group, an alkyl group having 1 to 6 carbon atoms, or an alkyl group having 1 to 6 carbon atoms and substituted with a halogen atom is preferable, a halogen atom, an alkyl group having 1 to 4 carbon atoms, or an alkyl group having 1 to 4 carbon atoms and substituted with a halogen atom is more preferable, and a halogen atom, an alkyl group having 1 to 3 carbon atoms, or a trifluoromethyl group is still more preferable.

$X^3$ represents an oxygen atom, a sulfur atom, a methylene, or an imino, and an oxygen atom is preferable.

$L^{11}$ in General Formula (I'-A), $L^{21}$ in General Formula (I'-B), and $L^{31}$ in General Formula (I'-C) each independently represent —O—, —C(=O)—, —O—C(=O)—, —C(=O)—O—, —O—C(=O)—O—, —S—, —NH—, —SO$_2$—, —CH$_2$—, —CH=CH—, or —C≡C—. —O—, —C(=O)—, —O—C(=O)—, —C(=O)—O—, —O—C(=O)—O—, —CH$_2$—, —CH=CH—, or —C≡C— is preferable, and —O—, —O—C(=O)—, —C(=O)—O—, —O—C(=O)—O—, —O—C(=O)—O—, or —C≡C— is more preferable. In particular, $L^{11}$ in General Formula (I'-A), which can be expected to have a small intrinsic birefringence wavelength dispersibility, is preferably —O—, —C(=O)—O—, or —C≡C—, and among these, —C(=O)—O— is particularly preferable since the discotic nematic phase can be obtained at a higher temperature. In a case where the above-described group is a group containing a hydrogen atom, this hydrogen atom may be substituted with a substituent. Preferred examples of such a substituent include a halogen atom, a cyano group, a nitro group, an alkyl group having 1 to 6 carbon atoms, an alkyl group having 1 to 6 carbon atoms and substituted with a halogen atom, an alkoxy group having 1 to 6 carbon atoms, an acyl group having 2 to 6 carbon atoms, an alkylthio group having 1 to 6 carbon atoms, an acyloxy group having 2 to 6 carbon atoms, an alkoxycarbonyl group having 2 to 6 carbon atoms, a carbamoyl group, a carbamoyl group substituted with an alkyl group having 2 to 6 carbon atoms, and acylamino groups having 2 to 6 carbon atoms, and more preferred examples thereof include a halogen atom and an alkyl group having 1 to 6 carbon atoms.

$L^{12}$ in General Formula (I'-A), $L^{22}$ in General Formula (I'-B), and $L^{32}$ in General Formula (I'-C) each independently represent a divalent linking group selected from the group consisting of —O—, —S—, —C(=O)—, —SO$_2$—, —NH—, —CH$_2$—, —CH=CH—, and C≡C—, and a combination thereof. Here, the hydrogen atoms of —NH—, —CH$_2$—, and —CH=CH— may be substituted with a substituent. Preferred examples of such a substituent include a halogen atom, a cyano group, a nitro group, a hydroxyl group, a carboxyl group, an alkyl group having 1 to 6 carbon atoms, an alkyl group having 1 to 6 carbon atoms and substituted with a halogen atom, an alkoxy group having 1 to 6 carbon atoms, an acyl group having 2 to 6 carbon atoms, an alkylthio group having 1 to 6 carbon atoms, an acyloxy group having 2 to 6 carbon atoms, an alkoxycarbonyl group having 2 to 6 carbon atoms, a carbamoyl group, a carbamoyl group substituted with an alkyl group having 2 to 6 carbon atoms, and acylamino groups having 2 to 6 carbon atoms, more preferred examples thereof include a halogen atom, a hydroxyl group, and an alkyl group having 1 to 6 carbon atoms, and particularly preferred examples thereof include a halogen atom, a methyl group, and an ethyl group.

L12, L$^{22}$, and L$^{32}$ are each independently preferably selected from the group consisting of —O—, —C(=O)—, —CH$_2$—, —CH=CH—, and —C≡C—, and a combination thereof.

L$^{12}$, L$^{22}$, and L$^{32}$ each independently has preferably 1 to 20 carbon atoms and more preferably 2 to 14 carbon atoms. L$^{12}$, L$^{22}$, and L$^{32}$ preferably has 2 to 14 carbon atoms, more preferably 1 to 16 pieces of —CH$_2$—, and still more preferably 2 to 12 pieces of —CH$_2$—.

The number of carbon atoms constituting L$^{12}$, L$^{22}$, and L$^{32}$ affects the phase transition temperature of the liquid crystal and the solubility of the compound in the solvent. Generally, as the number of carbon atoms increases, the transition temperature from the discotic nematic phase (the ND phase) to the isotropic liquid tends to decrease. In addition, the solubility in the solvent generally tends to improve as the number of carbon atoms increases.

Q$^{11}$ in General Formula (I'-A), Q$^{21}$ in General Formula (I'-B), and Q$^{31}$ in General Formula (I'-C) each independently represent a polymerizable group or a hydrogen atom, and at least two thereof represent a polymerizable group. Further, all of Q$^{11}$, Q$^{21}$, and Q$^{31}$ are preferably a polymerizable group. The examples of the polymerizable group are the same as those of the polymerizable group represented by Q$^{X1}$ or Q$^{X2}$ in General Formula (X), and the same applies to the preferred examples.

Specific examples of the compound represented by General Formula (I) include the exemplary compounds described in paragraphs [0068] to [0077] of JP2010-244038A and paragraphs [0040] to [0063] of JP2007-002220A. However, the present invention is not limited to these compounds.

The above compounds can be synthesized by various methods, for example, can be synthesized by the method described in [0064] to [0070] of JP2007-002220A.

The discotic photo liquid crystal compound preferably exhibits the columnar phase and the discotic nematic phase (the ND phase) as a liquid crystal phase, and among these liquid crystal phases, the discotic nematic phase (the ND phase) exhibiting a good monodomain property is preferable.

The disk-like liquid crystal compound that forms the mesogenic group preferably includes a structure derived from the compound represented by Formula (1).

$$D^{41}\text{-}(L^{41}\text{-}Q^{41})_{n41} \qquad \text{General Formula (1)}$$

In the formula, D$^{41}$ represents a disk-like core, L$^{41}$ represents a divalent linking group, Q$^{41}$ represents a polymerizable group, and n41 represents an integer of 2 to 12.

Examples of the disk-like core (D$^{41}$) in the above formula are shown below. L represents a divalent linking group, and Q represents a polymerizable group.

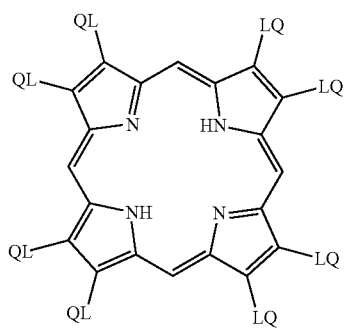

(D1)

-continued

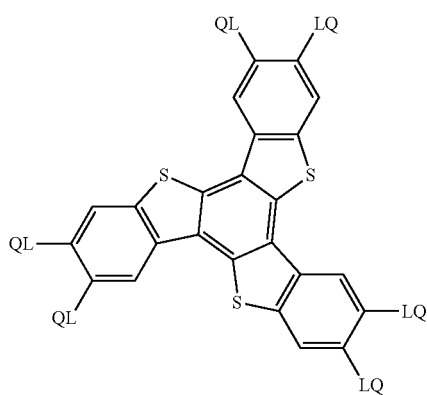

(D2)

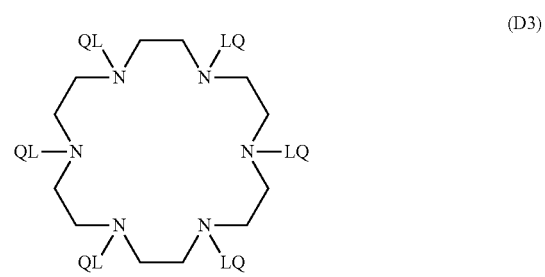

(D3)

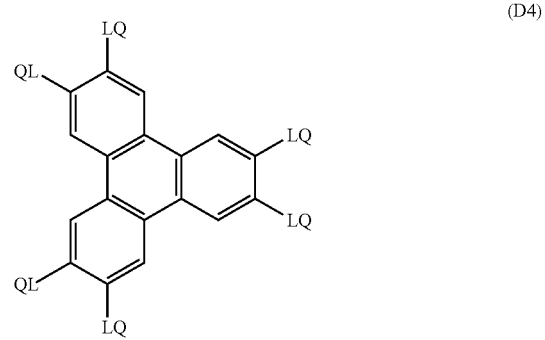

(D4)

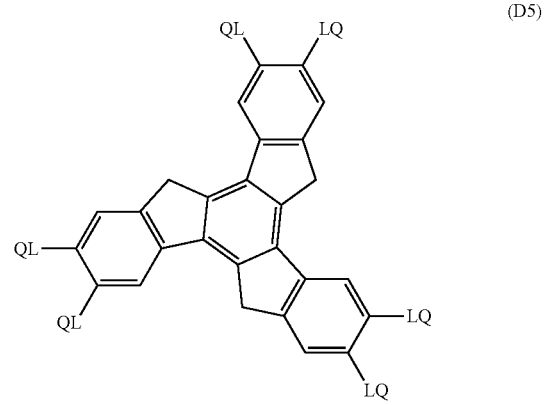

(D5)

(D6)
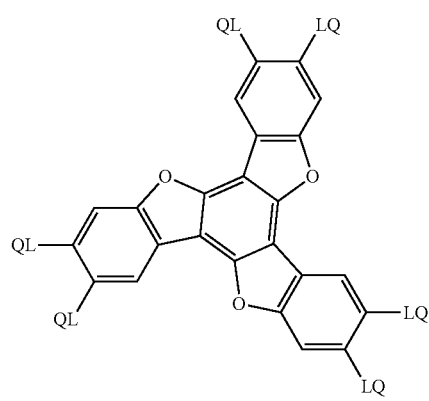
(D7)
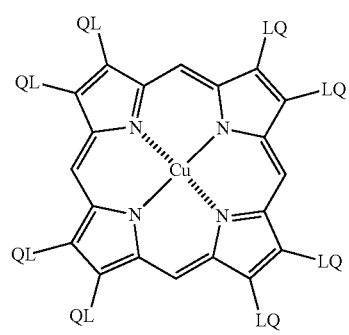
(D8)
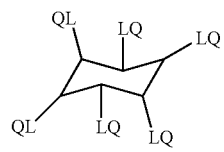
(D9)
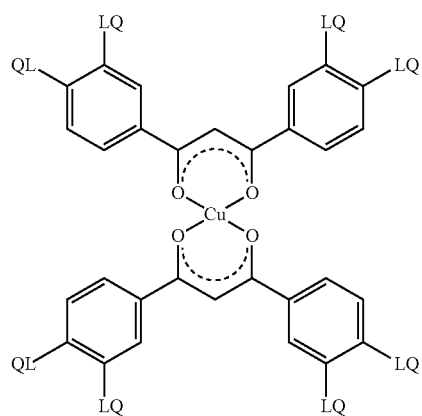
(D10)
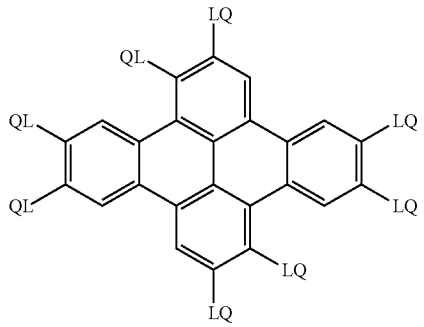
(D11)
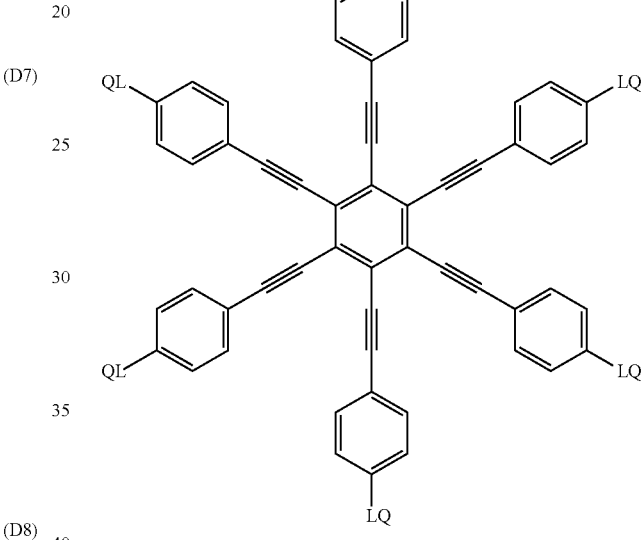
(D12)
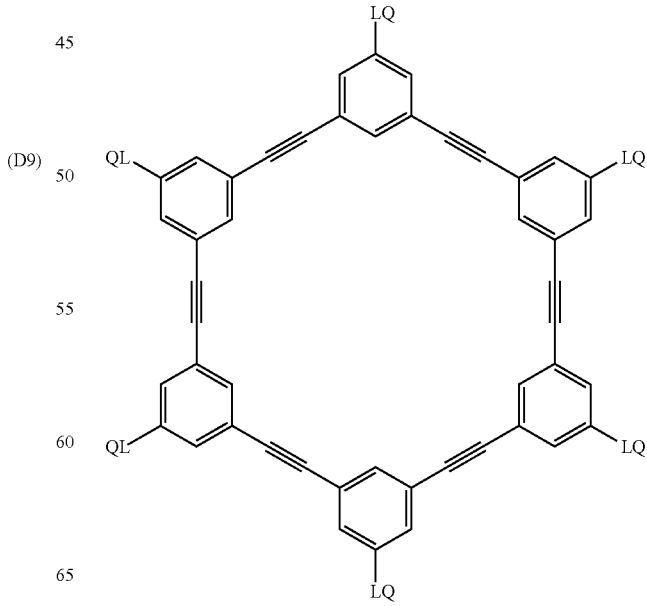

-continued

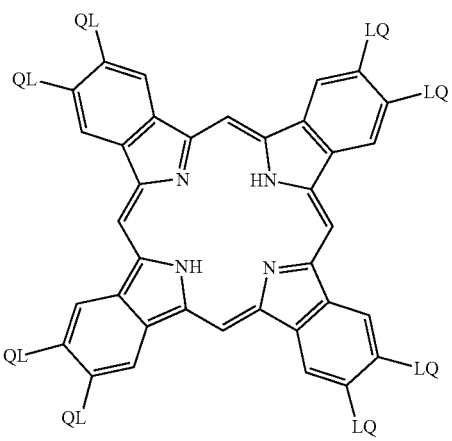
(D13)

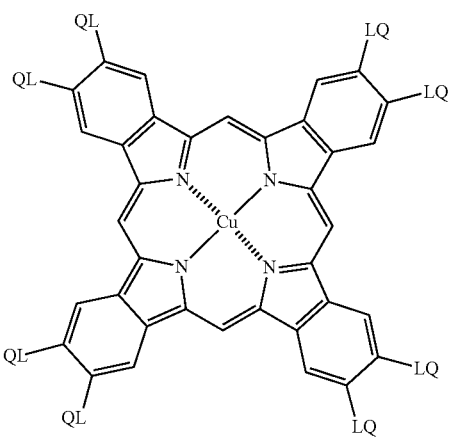
(D14)

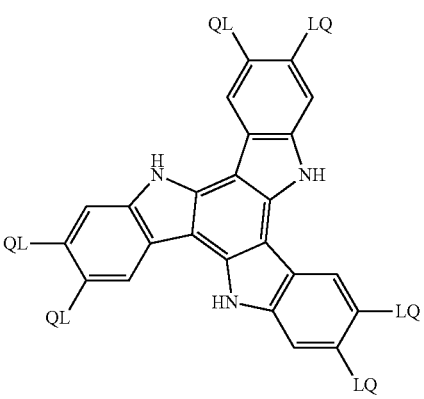
(D15)

In General Formula (1), the divalent linking group ($L^{41}$) is preferably a divalent linking group selected from the group consisting of an alkylene group, an alkenylene group, an arylene group, —CO—, —NH—, —O—, —S—, and a combination thereof. The divalent linking group ($L^{41}$) is still more preferably a group obtained by combing at least two divalent linking group selected from the group consisting of an alkylene group, an alkenylene group, an arylene group, —CO—, —NH—, —O—, and —S—. The divalent linking group ($L^{41}$) is most preferably a group obtained by combing at least two divalent linking groups selected from the group consisting of an alkylene group, an alkenylene group, an arylene group, —CO—, and —O—. The alkylene group preferably has 1 to 12 carbon atoms. The alkenylene group preferably has 2 to 12 carbon atoms. The arylene group preferably has 6 to 10 carbon atoms. The alkylene group, the alkenylene group, and the arylene group may have a substituent (for example, an alkyl group, a halogen atom, a cyano group, an alkoxy group, and an acyloxy group). Examples of the divalent linking group ($L^{41}$) are shown below. * is bonded to the disk-like core ($D^{41}$), and ** is bonded to the polymerizable group ($Q^{41}$). AL means an alkylene group or an alkenylene group, and AR means an arylene group.

$L_{41}$-1: *-AL-CO—O-AL-**
$L_{41}$-2: *-AL-CO—O-AL-O—**
$L_{41}$-3: *-AL-CO—O-AL-O-AL-**
$L_{41}$-4: *-AL-CO—O-AL-O—CO—**
$L_{41}$-5: *—CO-AR-O-AL-**
$L_{41}$-6: *—CO-AR-O-AL-O—**
$L_{41}$-7: *—CO-AR-O-AL-O—CO—**
$L_{41}$-8: *—CO—NH-AL-**
$L_{41}$-9: *—NH-AL-O—**
$L_{41}$-10: *—NH-AL-O—CO—**
$L_{41}$-11: *—O-AL-**
$L_{41}$-12: *—O-AL-O—**
$L_{41}$-13: *—O-AL-O—CO—**
$L_{41}$-14: *—O-AL-O—CO—NH-AL-**
$L_{41}$-15: *—O-AL-S-AL-**
$L_{41}$-16: *—O—CO-AL-AR-O-AL-O—CO—**
$L_{41}$-17: *—O—CO-AR-O-AL-CO—**
$L_{41}$-18: *—O—CO-AR-O-AL-O—CO—**
$L_{41}$-19: *—O—CO-AR-O-AL-O-AL-O—CO—**
$L_{41}$-20: *—O—CO-AR-O-AL-O-AL-O-AL-O—CO—**
$L_{41}$-21: *—S-AL-**
$L_{41}$-22: *—S-AL-O—**
$L_{41}$-23: *—S-AL-O—CO—**
$L_{41}$-24: *—S-AL-S-AL-**
$L_{41}$-25: *—S-AR-AL-**

$Q^{41}$ represents a polymerizable group and is synonymous with the polymerizable group represented by $Q^{X1}$ or $Q^{X2}$ in General Formula (X). In a case where n41 is 2 or more, the combinations of a plurality of $L^{41}$'s and a plurality of $Q^{41}$'s may be the same or different from each other; however, the combinations are preferably the same.

Preferred examples of the structure derived from the compound represented by General Formula (1) include the triphenylene derivatives represented by General Formulae (1) to (3) described in JP1995-306317A (JP-H7-306317A), the triphenylene derivative represented by General Formula (I) described in JP1995-309813A (JP-H7-309813A), and the triphenylene derivative represented by General Formula (I) described in JP2001-100028A. Among the triphenylene derivatives, the following compound having a linking group between the triphenylene structure and the polymerizable group is most preferable.

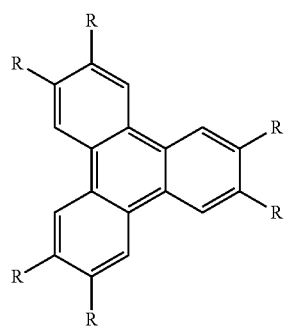

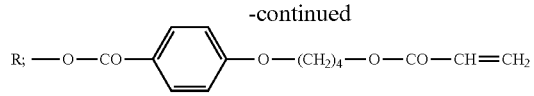

The repeating unit M may contain a mesogenic group derived from a rod-like liquid crystal compound different from the compound represented by General Formula (X), or a disk-like liquid crystal compound different from the compound represented by General Formula (I). For example, the repeating unit M may contain a mesogenic group derived from a rod-like liquid crystal compound or a disk-like liquid crystal compound, having one polymerizable group.

Further, the repeating unit M may contain a mesogenic group derived from a rod-like liquid crystal compound and a disk-like liquid crystal compound in the same molecule.

From the viewpoint of compatibility, the repeating unit M preferably contains a mesogenic group derived from any one of a rod-like liquid crystal compound or a disk-like liquid crystal compound.

In a case where a mesogenic group derived from a rod-like liquid crystal compound different from the compound represented by General Formula (X) or a mesogenic group derived from a disk-like liquid crystal compound different from the compound represented by General Formula (I) is contained, this mesogenic group is preferably similar to the compound represented by General Formula (X) or the compound represented by General Formula (I).

(Content)

In the present invention, due to the reason that the alignment degree of the obtained liquid crystal layer is higher, the content of the above-described surfactant is preferably 0.05 to 15 parts by mass, more preferably 0.08 to 10 parts by mass, and still more preferably 0.1 to 5 parts by mass, with respect to 100 parts by mass of the above-described liquid crystal compound.

<Dichroic Substance>

The liquid crystal composition preferably contains a dichroic substance due to the reason that the alignment defects of the obtained liquid crystal layer is further suppressed.

The dichroic substance is not particularly limited, and examples thereof include a visible light-absorbing substance (a dichroic dye), a luminescent substance (a fluorescent substance, a phosphorescent substance, or the like), an ultraviolet light-absorbing substance, an infrared light-absorbing substance, a nonlinear optical substance, a carbon nanotube, and an inorganic substance (for example, a quantum rod), and a conventionally known dichroic substance (a dichroic dye) can be used.

Specific examples of the dichroic substance include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic substances may be used in combination. For example, from the viewpoint of making the color of the obtained liquid crystal layer close to black, at least one kind of dichroic substance having a maximum absorption wavelength in a wavelength range of 370 to 550 nm and at least one kind of dichroic substance having a maximum absorption wavelength in a wavelength range of 500 to 700 nm are preferably used in combination.

The dichroic substance may have a crosslinkable group. Specific examples of the crosslinkable group include a (meth)acryloyl group, an epoxy group, an oxetanyl group, and a styryl group, and among these, a (meth)acryloyl group is preferable.

(Content)

In a case where the liquid crystal composition contains a dichroic substance, due to the reason that the alignment degree of the obtained liquid crystal layer is higher, the content of the dichroic substance is preferably 1 to 400 parts by mass, more preferably 2 to 100 parts by mass, and still more preferably 5 to 30 parts by mass, with respect to 100 parts by mass of the above-described liquid crystal compound.

<Polymerization Initiator>

The liquid crystal composition preferably contains a polymerization initiator.

The polymerization initiator is not particularly limited; however, a photosensitive compound, that is, a photopolymerization initiator is preferable.

As the photopolymerization initiator, various kinds of compounds can be used without particular limitations. Examples of the photopolymerization initiator include α-carbonyl compounds (the specifications of U.S. Pat. Nos. 2,367,661A and 2,367,670A), an acyloin ether (the specification of U.S. Pat. No. 2,448,828A), an aromatic acyloin compound substituted with α-hydrocarbon (the specification of U.S. Pat. No. 2,722,512A), polynuclear quinone compounds (the specifications of U.S. Pat. Nos. 3,046,127A and 2,951,758A), a combinations of a triarylimidazole dimer and a p-aminophenyl ketone (the specification of U.S. Pat. No. 3,549,367A), acridine and a phenazine compound (the specifications of JP1985-105667A (JP-S60-105667A) and U.S. Pat. No. 4,239,850A), an oxadiazole compound (the specification of U.S. Pat. No. 4,212,970A), and acylphosphine oxide compounds (JP1988-040799B (JP-S63-040799B), JP1993-029234B (JP-H5-029234B), JP1998-095788A (JP-H10-095788A), and JP1998-029997A (JP-H10-029997A)).

As such a photopolymerization initiator, a commercially available product can also be used, and examples thereof include IRGACURE-184, IRGACURE-907, IRGACURE-369, IRGACURE-651, IRGACURE-819, IRGACURE-OXE-01, and IRGACURE-OXE-02, which are manufactured by BASF SE.

In a case where the liquid crystal composition contains a polymerization initiator, the content of the polymerization initiator is preferably 0.01 to 30 parts by mass, and more preferably 0.1 to 15 parts by mass with respect to a total of 100 parts by mass of the dichroic substance and the high-molecular weight liquid crystal compound in the liquid crystal composition. In a case where the content of the polymerization initiator is 0.01 parts by mass or more, the durability of a light absorption anisotropic film is improved, and in a case where the content of the polymerization initiator is 30 parts by mass or less, the alignment degree of a light absorption anisotropic film is improved.

The polymerization initiator may be used alone, or two or more thereof may be used in combination. In a case where two or more kinds of polymerization initiators are contained, the total amount thereof is preferably within the above range.

<Solvent>

From the viewpoint of workability and the like, the liquid crystal composition according to the embodiment of the present invention preferably contains a solvent.

Examples of the solvent include organic solvents such as ketones (for example, acetone, 2-butanone, methylisobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimethyl benzene), halocarbons (for example, dichloromethane, dichloroethane, trichloromethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethylsulfoxide), and amides (for example, dimethylformamide and dimethylacetamide), and a heterocyclic compound (for example, pyridine), and water. These solvents may be used alone, or two or more thereof may be used in combination.

Among these solvents, an organic solvent is preferably used, and halocarbons or ketones are more preferably used.

In a case where the liquid crystal composition contains a solvent, the content of the solvent is preferably 80% to 99% by mass, more preferably 83% to 97% by mass, and particularly preferably 85% to 95% by mass with respect to the total mass of the liquid crystal composition.

The solvent may be used alone, or two or more thereof may be used in combination. In a case where two or more kinds of solvents are contained, the total amount thereof is preferably within the above range.

<Method of Forming Liquid Crystal Layer>

The method of forming a liquid crystal layer is not particularly limited, and examples thereof include a method including, in order, a step of coating the above-described optical alignment layer with the above-described liquid crystal composition to form a coating film (hereinafter, also referred to as a "coating film forming step") and a step of aligning a liquid crystalline component contained in the coating film (hereinafter, also referred to as an "alignment step").

The liquid crystalline component is a component that includes not only the above-described liquid crystal compound but also the above-described dichroic substance having liquid crystallinity in a case where the dichroic substance described above has liquid crystallinity.

(Coating Film Forming Step)

The coating film forming step is a step of coating an optical alignment layer with a liquid crystal composition to form a coating film.

In a case where a liquid crystal composition containing the above-described solvent used or a liquid material such as a molten liquid obtained by heating the liquid crystal composition is used, the optical alignment layer can be easily coated with the liquid crystal composition.

Specific examples of the method of carrying out coating with a liquid crystal composition include known methods such as a roll coating method, a gravure printing method, a spin coating method, a wire bar coating method, an extrusion coating method, a direct gravure coating method, a reverse gravure coating method, a die coating method, a spray method, and an ink jet method.

(Alignment Step)

The alignment step is a step of aligning a liquid crystalline component contained in the coating film. By this step, a liquid crystal layer is obtained.

The alignment step may include a drying treatment. In a case where drying treatment is carried out, a component such as a solvent can be removed from the coating film. The drying treatment may be carried out by a method of leaving the coating film for a predetermined time at room temperature (for example, natural drying) or by a method of carrying out heating and/or air blowing.

Here, the liquid crystalline component contained in the liquid crystal composition may be aligned by the above-described coating film forming step or drying treatment. For example, in an aspect in which the liquid crystal composition is prepared as a coating liquid containing a solvent, the coating film is dried to remove the solvent from the coating film, whereby a coating film (that is, light absorption anisotropic film) having light absorption anisotropy is obtained.

In a case where the drying treatment is carried out at a temperature equal to or higher than the transition temperature of the liquid crystalline component contained in the coating film to the liquid crystal phase, the heating treatment which will be described later may not be carried out.

The transition temperature of the liquid crystalline component contained in the coating film to the liquid crystal phase is preferably 10° C. to 250° C. and more preferably 25° C. to 190° C. from the viewpoint of manufacturing suitability and the like. In a case where the transition temperature is 10° C. or higher, a cooling treatment or the like for lowering the temperature to a temperature range in which a liquid crystal phase is exhibited is not required, which is preferable. Further, in a case where the transition temperature is 250° C. or lower, a high temperature is not required even in a case of making the liquid crystalline component be in an isotropic liquid state in which the temperature is much higher than the temperature range in which once the liquid crystal phase is exhibited, which is preferable since waste of heat energy, and deformation and alteration of substrate can be reduced.

The alignment step preferably has a heating treatment. Accordingly, the liquid crystalline component contained in the coating film can be aligned, and thus the coating film after the heating treatment can be preferably used as a light absorption anisotropic film.

The heating treatment is preferably carried out at 10° C. to 250° C. and more preferably at 25° C. to 190° C. in terms of manufacturing suitability or the like. The heating time is preferably 1 to 300 seconds and more preferably 1 to 60 seconds.

The alignment step may have a cooling treatment that is carried out after the heating treatment. The cooling treatment is a treatment for cooling the coating film after the heating to about 20° C. to 25° C. of room temperature. Accordingly, the alignment of the liquid crystalline component contained in the coating film can be fixed. The cooling means is not particularly limited, and the cooling can be carried out by a conventionally known method.

By the above steps, a light absorption anisotropic film can be obtained.

In the present aspect, examples of the method of aligning the liquid crystalline component contained in the coating film include the drying treatment and the heating treatment; however, the examples are not limited thereto, and a conventionally known alignment treatment can be used.

(Other Steps)

The method of forming a liquid crystal layer may have a step of curing the liquid crystal layer (hereinafter, also referred to as "curing step") after the alignment step.

The curing step is carried out, for example, by heating and/or light irradiation (exposure) in a case where the liquid crystal layer has a crosslinkable group (a polymerizable group). Among the above, light irradiation is preferably carried out to carrying out the curing step.

As the light source that is used for curing, various light sources such as infrared rays, visible light, and ultraviolet rays can be used, and ultraviolet rays are preferable. At the time of curing, ultraviolet rays may be applied while heating or may be applied through a filter that transmits only a specific wavelength.

In a case where the exposure is carried out while heating, the heating temperature at the time of exposure is preferably 25° C. to 140° C., although it depends on the transition temperature of the liquid crystalline component contained in the light absorption anisotropic film to the liquid crystal phase.

In addition, the exposure may be carried out under a nitrogen atmosphere. In a case where the light absorption anisotropic film is cured by radical polymerization, the inhibition of polymerization by oxygen is reduced, and thus the exposure is preferably carried out under a nitrogen atmosphere.

The thickness of the liquid crystal layer is not particularly limited; however, it is preferably 100 to 8,000 nm and more preferably 300 to 5,000 nm from the viewpoint of flexibility in a case where the laminate according to the embodiment of the present invention which will be described later is used for the polarizing element.

[λ/4 Plate]

The laminate according to the embodiment of the present invention preferably has a λ/4 plate on the liquid crystal layer described above.

Here, the "λ/4 plate" is a plate having a λ/4 function, and is specifically, a plate having a function of converting linearly polarized light having a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In another aspect in which the λ/4 plate has a multilayered structure, specific examples of the plate include a broadband λ/4 plate obtained by laminating a λ/4 plate and a λ/2 plate.

The λ/4 plate and the light absorption anisotropic film may be provided to be in contact with each other, or another layer may be provided between the λ/4 plate and the light absorption anisotropic film. Examples of the layer include a pressure-sensitive adhesive layer and an adhesive layer for securing adhesiveness.

[Barrier Layer]

The laminate according to the embodiment of the present invention preferably has a barrier layer on the light absorption anisotropic film (the λ/4 plate in a case of having the above-described λ/4 plate).

Here, the barrier layer is also called a gas barrier layer (an oxygen barrier layer) and has the function of protecting the polarizing element of the present invention from a gas such as oxygen in the atmosphere, moisture, or a compound contained in the adjacent layer.

Regarding the barrier layer, the descriptions in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Pressure-Sensitive Adhesive Layer]

The laminate according to the embodiment of the present invention may have a pressure-sensitive adhesive layer on the surface to which the λ/4 plate is bonded from the viewpoint of bonding the above-described λ/4 plate.

Examples of the pressure-sensitive adhesive contained in the pressure-sensitive adhesive layer include a rubber-based pressure-sensitive adhesive, an acrylic pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinyl pyrrolidone-based pressure-sensitive adhesive, a polyacrylamide-based pressure-sensitive adhesive, and a cellulose-based pressure-sensitive adhesive.

Among these, an acrylic pressure-sensitive adhesive (a pressure-sensitized adhesive) is preferable from the viewpoint of transparency, weather resistance, heat resistance, and the like.

The pressure-sensitive adhesive layer can be formed, for example, by a method in which a release sheet is coated with a solution of a pressure-sensitive adhesive, dried, and then transferred onto a surface of a transparent resin layer; and a method in which a surface of a transparent resin layer is directly coated with a solution of a pressure-sensitive adhesive and then dried.

A solution of a pressure-sensitive adhesive is prepared as a solution in which about 10% to 40% by mass of a pressure-sensitive adhesive is dissolved or dispersed in a solvent such as toluene or ethyl acetate.

As the coating method, a roll coating method such as reverse coating or gravure coating, a spin coating method, a screen coating method, a fountain coating method, a dipping method, a spray method, or the like can be adopted.

Examples of the constituent material of the release sheet include foliate bodies such as a synthetic resin film such as polyethylene, polypropylene, or polyethylene terephthalate; a rubber sheet; paper; fabric; non-woven fabric; a net; a foam sheet; and a metal foil.

In the present invention, the thickness of any pressure-sensitive adhesive layer is not particularly limited; however, it is preferably 3 μm to 50 μm, more preferably 4 μm to 40 μm, and still more preferably 5 μm to 30 μm.

[Usage]

The laminate according to the embodiment of the present invention can be used as a polarizing element (a polarizing plate), and for example, can be used as a linearly polarizing plate or a circularly polarizing plate.

In a case where the laminate according to the embodiment of the present invention has no optically anisotropic layer such as the λ/4 plate, the laminate can be used as a linearly polarizing plate.

In a case where the laminate according to the embodiment of the present invention has the λ/4 plate, the laminate can be used as a circularly polarizing plate.

[Image Display Device]

The image display device according to the embodiment of the present invention has the above-described laminate according to the embodiment of the present invention.

The display element that is used for the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, as the image display device according to the embodiment of the present invention, a liquid crystal display device using a liquid crystal cell as a display element, or an organic EL display device using an organic EL display panel as a display element is preferable, and a liquid crystal display device is more preferable.

[Liquid Crystal Display Device]

The liquid crystal display device which is one example of the image display device according to the embodiment of the present invention is a liquid crystal display device having the above-described laminate according to the embodiment of the present invention (however, the λ/4 plate is not included) and a liquid crystal cell.

In the present invention, the laminate according to the embodiment of the present invention is preferably used as a polarizing element on the front side among laminates that are provided on both sides of a liquid crystal cell, and the laminate according to the embodiment of the present invention is more preferably used as a polarizing element on the front side and the rear side.

Hereinafter, the liquid crystal cell of the liquid crystal display device will be described in detail.

<Liquid Crystal Cell>

The liquid crystal cell that is used for the liquid crystal display device preferably has a vertical alignment (VA) mode, an optically compensated bend (OCB) mode, an in-plane-switching (IPS) mode, or a twisted nematic (TN) mode; however, the mode is not limited thereto.

In a TN mode liquid crystal cell, without the application of a voltage, rod-like liquid crystalline molecules (rod-like liquid crystal compounds) are substantially horizontally aligned, and further, twist-aligned by 60° to 120°. The TN mode liquid crystal cell is most frequently used as a color TFT liquid crystal display device and is described in many documents.

In a VA mode liquid crystal cell, rod-like liquid crystalline molecules are substantially vertically aligned without the application of a voltage. The VA mode liquid crystal cell includes (1) a narrowly-defined VA mode liquid crystal cell in which rod-like liquid crystalline molecules are substantially vertically aligned without the application of a voltage, and are substantially horizontally aligned with the application of a voltage (described in JP1990-176625A (JP-H2-176625A)), (2) a (multi-domain vertical alignment (MVA) mode) liquid crystal cell in which the VA mode is made into multi-domains in order to expand the viewing angle (described in SID97, Digest of tech. Papers (proceedings) 28 (1997) 845), (3) an (n-type axially symmetric aligned microcell (n-ASM) mode) liquid crystal cell in which rod-like liquid crystalline molecules are substantially vertically aligned without the application of a voltage, and are twisted and aligned in multi-domains with the application of a voltage (described in the proceedings 58 and 59 of Japanese Liquid Crystal Symposium (1998)), and (4) a SURVIVAL mode liquid crystal cell (announced at Liquid Crystal Display (LCD) International 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. Methods of improving the viewing angle by reducing light leakage caused when a black image is displayed in a diagonal direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the embodiment of the present invention preferably has an aspect in which the above-described laminate according to the embodiment of the present invention (however, a pressure-sensitive adhesive layer and a λ/4 plate are included) and an organic EL display panel are included in order from the visual recognition side. In this case, in the laminate, a transparent support, an alignment film that is provided as necessary, a light absorption anisotropic film, a transparent resin layer, a pressure-sensitive adhesive layer, and a λ/4 plate disposed in order from the visual recognition side.

In addition, the organic EL display panel is a display panel having a configuration using an organic EL element in which an organic light emitting layer (organic electroluminescence layer) is interposed between electrodes (between a cathode and an anode). The configuration of the organic EL display panel is not particularly limited, and a conventionally known configuration is employed.

EXAMPLES

Hereinafter, the present invention will be described in more detail based on Examples. In the following examples, materials, amounts thereof used, ratios thereof, the details of treatments, treatment procedures, and the like can be suitably modified without departing from the scope of the present invention. Therefore, the scope of the present invention should not be restrictively interpreted by the following Examples.

[Synthesis Example of Photo-Alignable Polymer P1]

In a reaction vessel equipped with a stirrer, a thermometer, a dropping funnel, and a reflux cooling pipe, 100.0 parts by mass of 2-(3,4-epoxycyclohexyl)ethyltrimethoxysilane, 500 parts by mass of methylisobutyl ketone, and 10.0 parts by mass of triethylamine were charged, and the resultant mixture was stirred at room temperature. Next, 100 parts by mass of deionized water was added dropwise to the obtained mixture from a dropping funnel over 30 minutes, and then the mixture was reacted at 80° C. for 6 hours while mixing the mixture under reflux. After the completion of the reaction, an organic phase was taken out, and the organic phase was washed with an aqueous solution of 0.2% by mass ammonium nitrate until the water used in washing became neutral. Then, the solvent and the water were distilled off from the obtained organic phase under reduced pressure to obtain a polyorganosiloxane having an epoxy group, as a viscous transparent liquid.

This polyorganosiloxane having an epoxy group was subjected to a $^1$H-nuclear magnetic resonance (NMR) analysis, and from the analysis results, a peak based on the oxiranyl group was obtained near a chemical shift (δ)=3.2 ppm according to theoretical intensity, whereby it was confirmed that no side reaction of the epoxy group occurred during the reaction. The weight-average molecular weight Mw of the polyorganosiloxane having an epoxy group was 2,200, and the epoxy equivalent was 186 g/mol.

Next, a 100 mL three-neck flask was charged with 10.1 parts by mass of the polyorganosiloxane having an epoxy group obtained above, 0.1 part by mass of an acryloyl group-containing carboxylic acid (TOAGOSEI Co., Ltd., trade name "ARONIX M-5300", acrylic acid ω-carboxy-polycaprolactone (polymerization degree n≈2)), 20 parts by mass of butyl acetate, 1.5 parts by mass of the cinnamic acid derivative obtained by the method of Synthesis Example 1 of JP2015-026050A, and, 0.3 parts by mass of tetrabutylammonium bromide, and the obtained mixture was stirred at 90° C. for 12 hours. After stirring, the obtained mixture was diluted with the same amount (mass) of butyl acetate as that of the obtained mixture, and the diluted mixture was further washed with water three times. The operation of concentrating the obtained mixture and diluting the concentrated mixture with butyl acetate was repeated twice, and finally, a solution containing a polyorganosiloxane having a photo-alignable group (hereinafter, a photo-alignable polymer P1) was obtained. The weight-average molecular weight Mw of this photo-alignable polymer P1 was 9,000. In addition, as a result of the $^1$H-NMR analysis, the content of the component having a cinnamate group in the photo-alignable polymer P1 was 24.0% by mass.

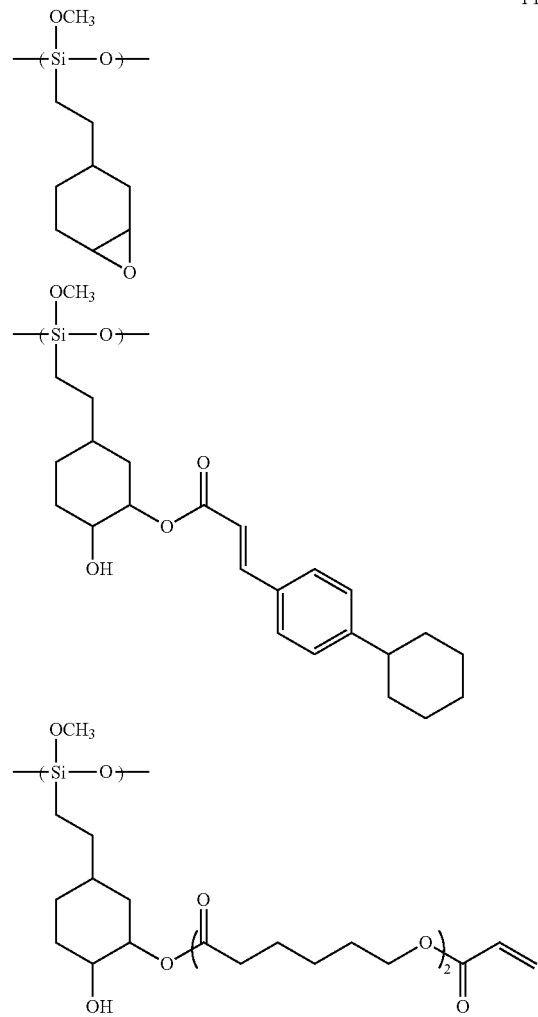

[Synthesis of High-Molecular Weight Liquid Crystal Compound L1]

A high-molecular weight liquid crystal compound L1 was synthesized according to the following procedures.

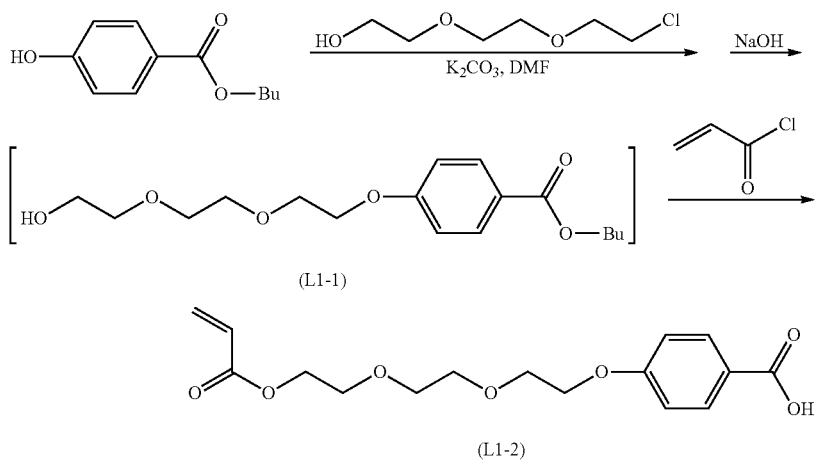

As shown in the above scheme, 2-chloroethoxyethoxyethanol (244 g) and potassium carbonate (200 g) were added to an N,N-dimethylformamide (DMF) solution (300 mL) of butylparaben (201 g). After stirring at 95° C. for 9 hours, toluene (262 mL) and water (660 mL) were added thereto, and concentrated hydrochloric acid (147 g) was further added dropwise thereto. After stirring for 10 minutes, the mixture was allowed to stand, and then the reaction solution was washed by a liquid separation operation. A 28% by mass sodium methoxide methanol solution (500 g) and water (402 mL) were added to the obtained organic layer, and the mixture was stirred at 50° C. for 2 hours. Then, the organic solvent was distilled off by concentration, water (402 mL) was added, and concentration was carried out again at 50° C. until the weight reached 1.13 kg. Water (478 mL) was added to the obtained solution, and concentrated hydrochloric acid (278 g) was further added dropwise thereto. Ethyl acetate (1.45 kg) was added thereto, and the mixture was stirred at 30° C. for 10 minutes, and the aqueous layer was removed by a liquid separation operation. Next, a 20% by mass aqueous salt solution (960 mL) was added thereto, the mixture was stirred at 30° C. for 10 minutes, and the aqueous layer was removed by a liquid separation operation. N-methylpyrrolidone (824 g) was added to the obtained organic layer, and a concentration operation was carried out at 70° C. for 4 hours to obtain 1.13 kg of an N-methylpyrrolidone solution containing a compound (L1-1).

The next step was carried out using 1,085 g of the obtained N-methylpyrrolidone solution containing the obtained compound (L1-1).

N,N-dimethylaniline (189 g) and 2,2,6,6-tetramethylpiperazine (1.5 g) were added to the obtained compound (L1-1)-containing N-methylpyrrolidone (NMP) solution (1,085 g), and after lowering the internal temperature by cooling, acrylic acid chloride (122 g) was further added dropwise thereto so that the internal temperature did not exceed 10° C. After stirring at an internal temperature of 10° C. for 2 hours, methanol (81 g) was added dropwise thereto and the mixture was stirred for 30 minutes. Ethyl acetate (1.66 kg), 10% by mass saline solution (700 mL), and 1N aqueous hydrochloric acid solution (840 mL) were added thereto, and then the aqueous layer was removed by a liquid separation operation. Next, a 10% by mass aqueous salt solution (800 mL) was added thereto, the mixture was stirred at 30° C. for 10 minutes, and the aqueous layer was removed by a liquid separation operation. Next, a 20% by mass aqueous salt solution (800 mL) was added thereto, the mixture was stirred at 30° C. for 10 minutes, and the aqueous layer was removed by a liquid separation operation. A mixed solvent of hexane/isopropyl alcohol (1,780 mL/900 mL) was added to the obtained organic layer, the mixture was cooled to 5° C., stirred for 30 minutes, and then filtered to obtain 209 g of a white solid compound (L1-2) (three-step yield: 65%). In the structural formula, Bu represents a butyl group.

$^1$H-NMR (solvent: CDCl$_3$) δ (ppm): 3.67 to 3.78 (m, 6H), 3.87 to 3.92 (m, 2H), 4.18 to 4.23 (m, 2H), 4.31 to 4.35 (m, 2H), 5.80 to 5.85 (m, 1H), 6.11 to 6.19 (m, 1H), 6.40 to 6.46 (m, 1H), 6.93 to 6.98 (m, 2H), 8.02 to 8.07 (m, 2H)

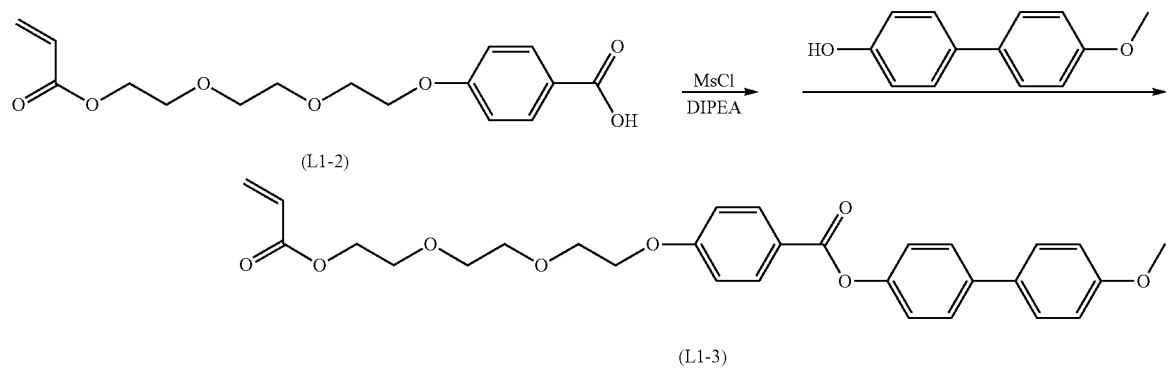

As shown in the above scheme, dibutyl hydroxytoluene (BHT) (200 mg) was added to a tetrahydrofuran (THF) solution (70 mL) of methanesulfonyl chloride (MSCl) (73.4 mmol, 5.7 mL), and then the resultant mixture was cooled to an internal temperature of −5° C. The compound (L1-2) (66.7 mmol, 21.6 g) and a THF solution of diisopropylethylamine (DIPEA) (75.6 mmol, 13.0 mL) were added dropwise thereto so that the internal temperature did not rise to 0° C. or higher. After stirring for 30 minutes at −5° C., N,N-dimethyl-4-aminopyridine (DMAP) (200 mg) was added thereto, and then a tetrahydrofuran (THF) and dimethylacetamide (DMAc) solution of diisopropylethylamine (75.6 mmol, 13.0 mL), and 4-hydroxy-4'-methoxybiphenyl (60.6 mmol, 12.1 g) were further added dropwise thereto so that the internal temperature did not rise to 0° C. or higher. Then, stirring was carried out for 4 hours at room temperature. The reaction was stopped by adding methanol (5 mL), and then water and ethyl acetate were added. The solvent was removed from the organic layer extracted with the ethyl acetate by a rotary evaporator, and purification by column chromatography using ethyl acetate and hexane was carried out to obtain 18.7 g of a compound (L1-3) as a white solid (yield: 61%).

$^1$H-NMR (solvent: CDCl$_3$) δ (ppm): 3.65 to 3.82 (m, 6H), 3.85 (s, 3H), 3.85 to 3.95 (m, 2H), 4.18 to 4.28 (m, 2H), 4.28 to 4.40 (m, 2H), 5.82 (dd, 1H), 6.15 (dd, 1H), 6.43 (dd, 1H), 6.90 to 7.05 (m, 4H), 7.20 to 7.30 (m, 2H), 7.45 to 7.65 (m, 4H), 8.10 to 8.20 (m, 2H)

The impurities include the following compound (L1-b).

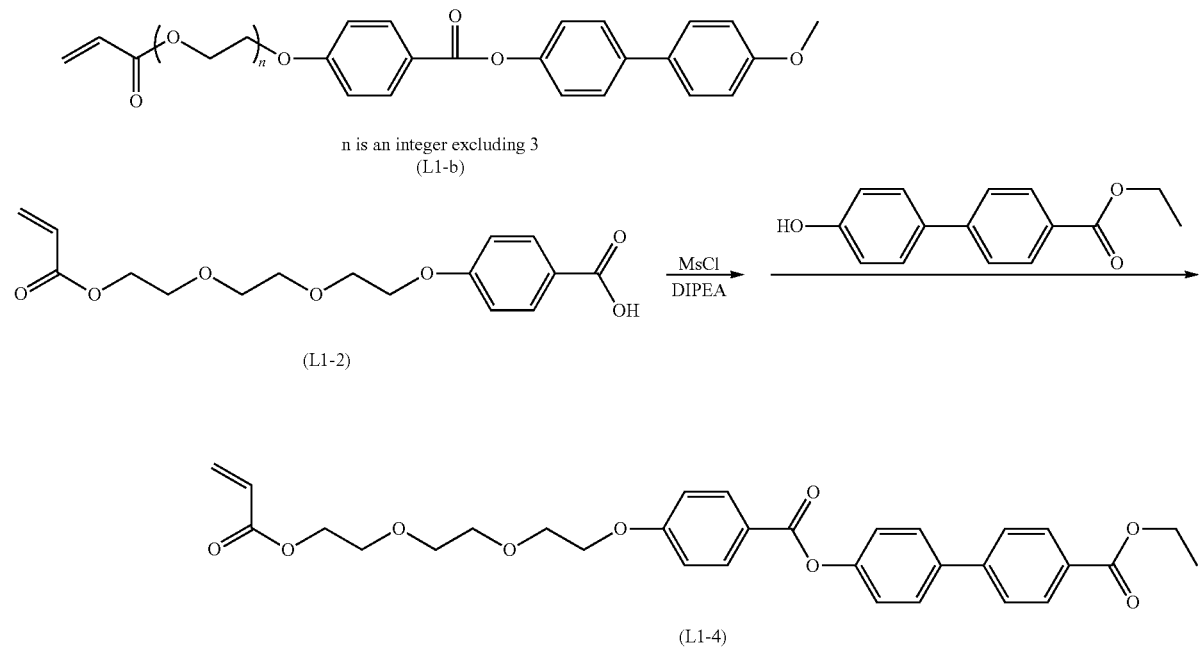

Ethyl 4-(4-hydroxyphenyl)benzoate that was used in the above scheme was synthesized by the method described in Macromolecules, 2002, Vol. 35, pages 1663 to 1671.

As shown in the above scheme, 2,2,6,6-tetramethylpiperidine-1-oxyl (68 mg) was added to an ethyl acetate solution (44 mL) of methanesulfonyl chloride (MSCl) (54.8 mmol, 6.27 g), and the resultant mixture was cooled to an internal temperature of −5° C. Ethyl 4-(4-hydroxyphenyl) benzoate (52.6 mmol, 17.1 g) and a THF solution of diisopropylethylamine (DIPEA) (57.0 mmol, 7.36 g) were added dropwise thereto so that the internal temperature did not rise to 0° C. or higher. After stirring at −5° C. for 30 minutes, a DMAc solution of ethyl 4-(4-hydroxyphenyl) benzoate (43.8 mmol, 10.6 g) and N-methyl-imidazole (NMI) (1.8 g) was added thereto, and then diisopropylethylamine (75.6 mmol, 13.0 mL) was further added dropwise thereto so that the internal temperature did not rise to 0° C. or higher. Then, stirring was carried out for 4 hours at room temperature. Water and ethyl acetate were added to terminate the reaction. The solvent was removed, by liquid separation, from the organic layer extracted with the ethyl acetate by a rotary evaporator, and purification by column chromatography using ethyl acetate and hexane was carried out to obtain 20.6 g of a compound (L1-4) as a white solid (yield: 86%).

$^1$H-NMR (solvent: CDCl$_3$) δ (ppm): 1.41 (t, 3H), 3.68 to 3.80 (m, 6H), 3.88 to 3.95 (m, 2H), 4.20 to 4.27 (m, 2H), 4.31 to 4.38 (m, 2H), 4.41 (q, 2H), 5.83 (dd, 1H), 6.16 (dd, 1H), 6.43 (dd, 1H), 6.97 to 7.05 (m, 2H), 7.28 to 7.35 (m, 2H), 7.64 to 7.72 (m, 4H), 8.08 to 8.20 (m, 4H)

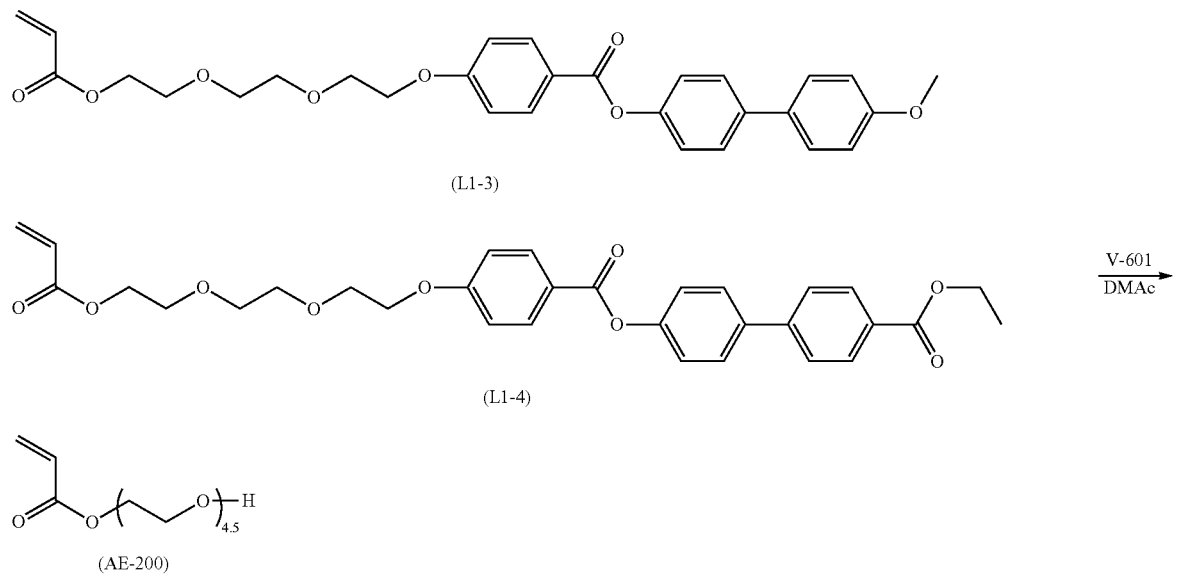

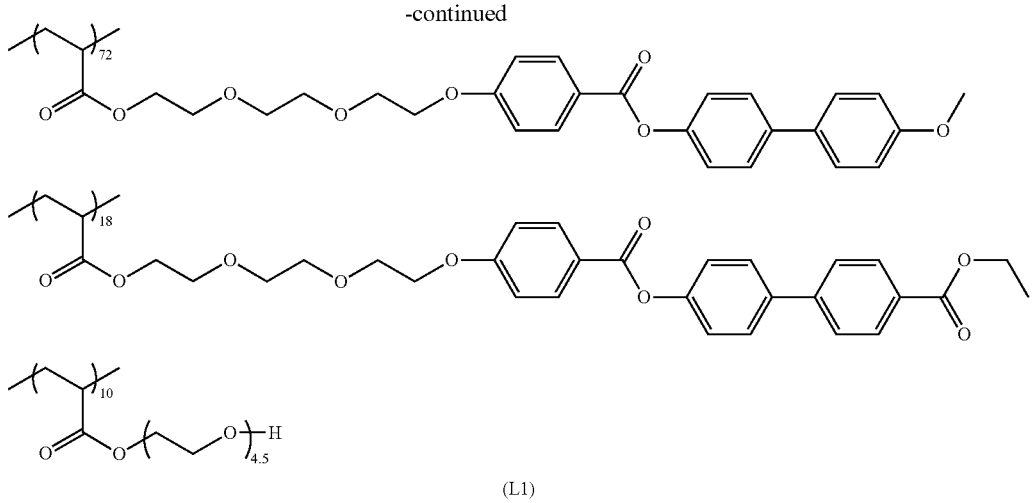

(L1)

As shown in the above scheme, a DMAc solution of the compound (L1-3) (0.72 g), the compound (L1-4) (0.18 g), and Blemmer (AE-200, manufactured by NOF CORPORATION)(0.10 g) (3.3 mL) was heated to an internal temperature of 80° C. under a nitrogen stream. A DMAc solution (0.5 mL) of 2,2'-azobis(2-methylpropionic acid)dimethyl (0.015 g) (trade name "V-601", manufactured by FUJIFILM Wako Pure Chemical Corporation) was added thereto, and stirring was carried out for 2 hours at 80° C. Thereafter, the disappearance of the polymerizable group was confirmed by $^{1}$H-NMR spectrum measurement, and the solution was cooled to room temperature. Methanol was added and filtration was carried out, and the residue was washed with methanol to obtain 0.91 g of a high-molecular weight liquid crystal compound L1 as a white solid. When the obtained high-molecular weight liquid crystal compound L1 was analyzed by gel permeation chromatography (GPC), the weight-average molecular weight (Mw) was 16,000 (in terms of polystyrene).

[Synthesis of Dichroic Substance Y1]

A dichroic substance Y1 was synthesized as follows.

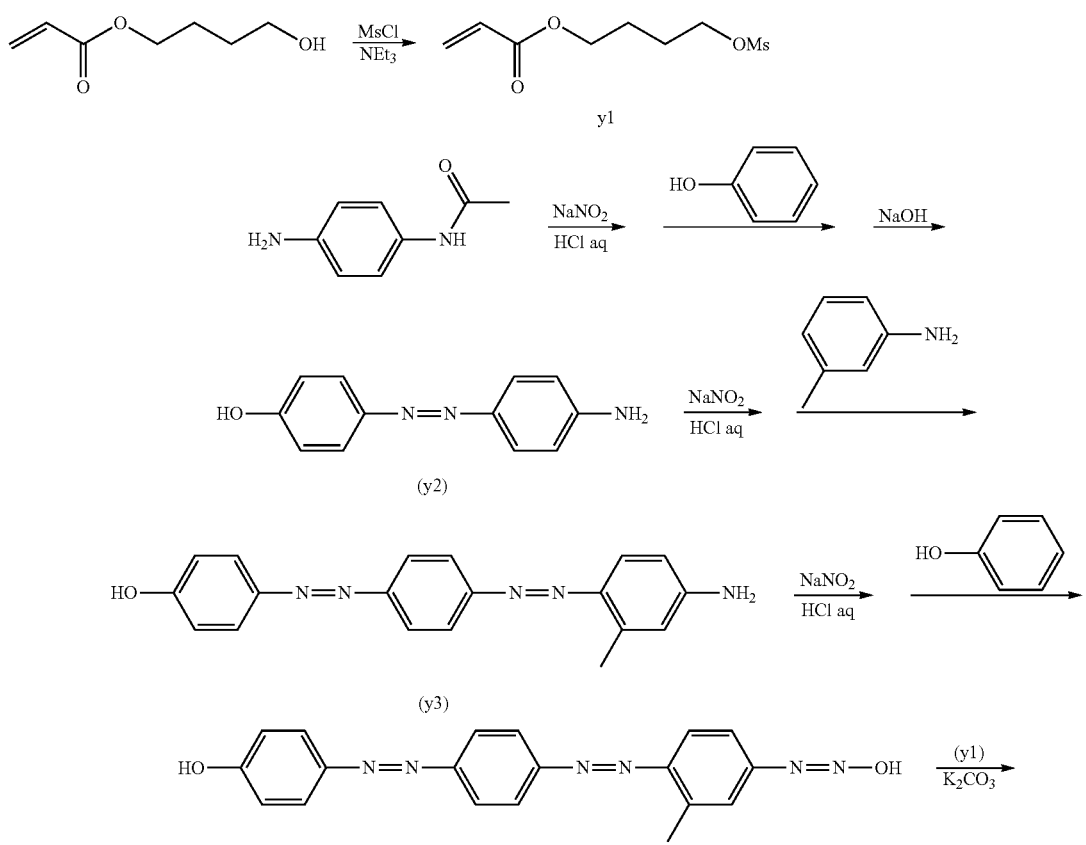

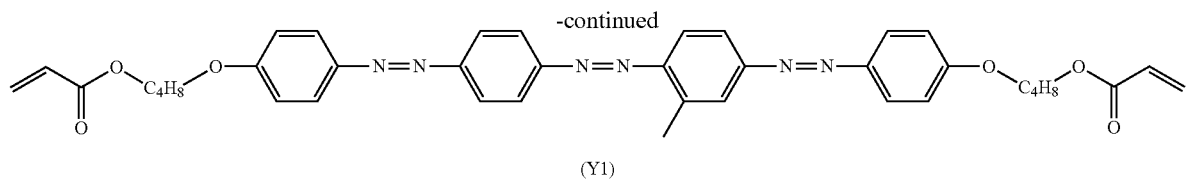

(Y1)

As shown in the above scheme, 4-hydroxybutylacrylate (20 g) and methanesulfonyl chloride (16.8 g, MsCl) were dissolved in ethyl acetate (90 mL), and then triethylamine (16.4 g, Net₃) was added dropwise thereto while carrying out cooling in an ice bath. Then, after stirring at room temperature for 2 hours, 1N HCl was added to carry out the liquid separation. The obtained organic layer was distilled off under reduced pressure to obtain a compound y1 (30 g).

Subsequently, a compound y2 (10 g) was synthesized according to the literature (Chem. Eur. J. 2004. 10. 2011).

The compound y2 (10 g) was dissolved in water (300 mL) and hydrochloric acid (17 mL), cooled in an ice bath, sodium nitrite (3.3 g) was added thereto, and the resultant mixture was stirred for 30 minutes. After further adding amidosul-
furic acid (0.5 g), m-toluidine (5.1 g) was added, and stirring was carried out at room temperature for 1 hour. After stirring, the solid obtained by neutralizing with hydrochloric acid was collected by suction filtration to obtain the compound y2 (3.2 g).

After the compound y2 (1 g) was dissolved in a THF solution consisting of tetrahydrofuran (30 mL, THF), water (10 mL), and hydrochloric acid (1.6 mL), the resultant mixture was cooled in an ice bath, sodium nitrite (0.3 g) was added thereto, stirring was carried out for 30 minutes, and then, amidosulfuric acid (0.5 g) was further added thereto. Separately, phenol (0.4 g) was dissolved in potassium carbonate (2.76 g) and water (50 mL). The resultant mixture was cooled in an ice bath, and then the above THF solution was added dropwise thereto, and stirring was carried out at room temperature for 1 hour. After stirring, water (200 mL) was added thereto, and the obtained compound y3 (1.7 g) was suction-filtered.

The compound y3 (0.6 g), the compound y1 (0.8 g), and potassium carbonate (0.95 g) were dissolved in DMAc (30 mL, dimethylacetamide), and stirring was carried out at 90° C. for 3.5 hours. After stirring, water (300 mL) was added thereto, and the obtained solid was suction-filtered to obtain a dichroic substance Y1 (0.3 g).

[Synthesis of Dichroic Substance M1]

A dichroic substance M1 was synthesized as follows.

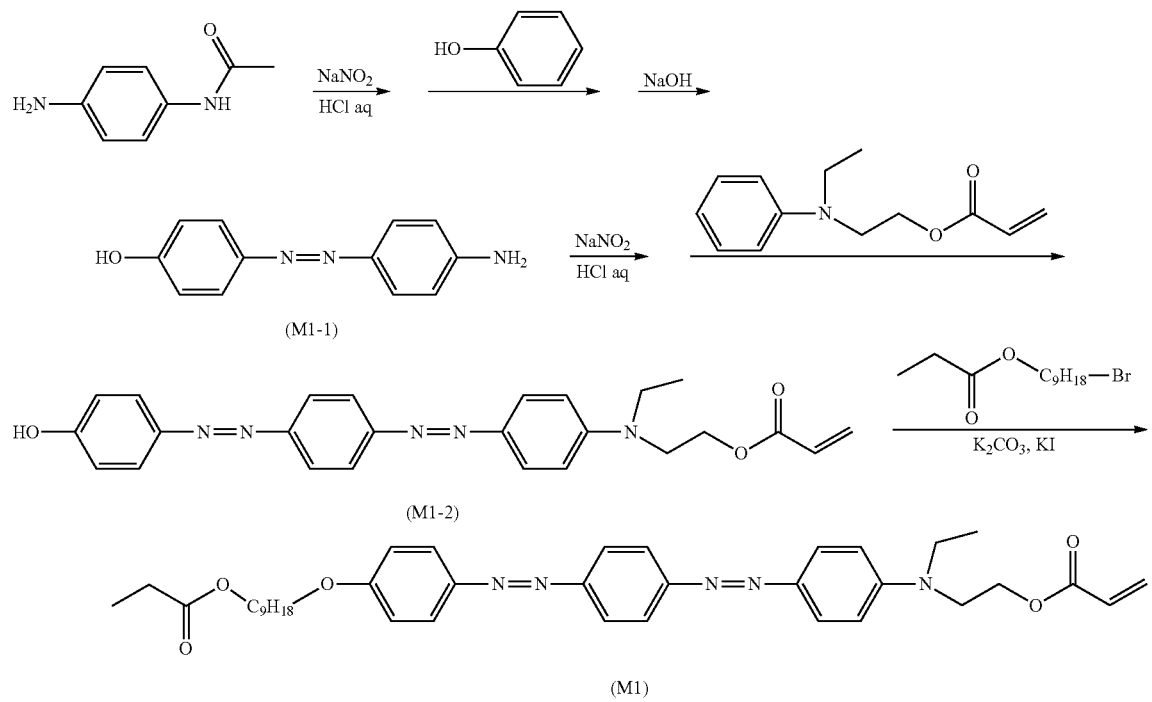

(M1-1)

(M1-2)

(M1)

As shown in the above scheme, 27 g of p-acetylaminoaniline was added to 100 ml of water, and the resultant solution was cooled to 0° C. and stirred. 66 ml of concentrated hydrochloric acid was added dropwise to this solution. Then, an aqueous solution prepared by dissolving 12.5 g of sodium nitrite (manufactured by FUJIFILM Wako Pure Chemical Corporation) in 30 ml of water was added dropwise. The internal temperature was kept at 0° C. to 5° C. After completion of the dropwise addition, stirring was carried out at 0° C. or lower for 1 hour, thereby preparing a diazonium salt solution.

20 ml of methanol was added to 17.5 g of phenol, and the solution was stirred and dissolved. An aqueous solution prepared by dissolving 28.8 g of NaOH in 150 ml of water was added to this solution, and the resultant solution was cooled to 0° C. and stirred. The diazonium salt solution prepared by the above method was added dropwise to this solution at 0° C. to 5° C. After completion of the dropwise addition, the mixture was stirred at 5° C. for 1 hour, and then stirring was carried out at room temperature for 1 hour to complete the reaction. Next, an aqueous solution prepared by dissolving 36.0 g of NaOH in 150 ml of water was added thereto, and the mixture was heated under reflux for 3 hours. After completion of the reaction, the mixture was cooled to room temperature, an aqueous hydrochloric acid solution was added thereto to adjust the pH to 7.0, and then precipitated crystals were filtered to obtain 40.2 g of a compound M1-1 (yield: 87.2%, brown crystals).

N-ethyl-N-(2-acryloyloxyethyl)aniline was synthesized from N-ethylaniline as a raw material according to U.S. Pat. No. 7,601,849B and a conventionally known method.

100 ml of acetic acid, 10 ml of water, and 20 ml of methanol were added to 5.0 g of the compound O1-1, and the solution was cooled to 0° C. and stirred. 7 ml of concentrated hydrochloric acid was added dropwise to this solution. Then, an aqueous solution prepared by dissolving 1.8 g of sodium nitrite in 5 ml of water was added dropwise thereto. The internal temperature was kept at 0° C. to 5° C. After completion of the dropwise addition, stirring was carried out at 0° C. or lower for 1 hour, thereby preparing a diazonium salt solution.

To 8.4 g of N-ethyl-N-(2-acryloyloxyethyl)aniline synthesized as described above, 7.7 g of sodium acetate, 100 ml of methanol, and 100 ml of water were added and dissolved by stirring, and the resultant mixture was cooled to 0° C. and stirred. The diazonium salt solution prepared by the above method was added dropwise to this solution at 0° C. to 5° C. After completion of the dropwise addition, the mixture was stirred at 5° C. for 1 hour, and then stirring was carried out at room temperature for 1 hour to complete the reaction. Precipitated crystals were filtered to obtain 6.2 g of a compound M1-2 (yield: 86.8%, brown crystals).

After 50.0 g of 1-bromononanol was dissolved in 500 ml of ethyl acetate, 26.5 g of triethylamine was added dropwise to the mixture, and stirring was carried out at 5° C. After 22.8 g of propionyl chloride was added dropwise to the mixture, the reaction was completed by stirring at room temperature for 1 hour. After completion of the reaction, 175 ml of water was added to carry out the liquid separation, and then 10 g of magnesium sulfate was added to the organic layer to carry out dehydration. The obtained organic layer was concentrated using a rotary evaporator to obtain propionic acid-9-bromononyl (52 g, a colorless and transparent liquid).

The compound O1-2 (7.2 g), potassium carbonate (7.7 g, 0.014 mmol), and potassium iodide (0.15 g, 0.002 mol) were added to 72 ml of dimethylacetamide, and the solution was heated and stirred at 80° C. 8.4 g of propionic acid-9-bromononyl synthesized as described above was added dropwise to this solution. After completion of the dropwise addition, the mixture was heated to 80° C. and stirred for 4 hours to complete the reaction. After completion of the reaction, the reaction solution was poured into water, and precipitated crystals were filtered and washed with water. The crystals were separated and purified by silica gel column chromatography (eluent: chloroform and subsequently chloroform/ethyl acetate=50/1 were used in order). Methanol was added to the residue, and the precipitated crystals were filtered, washed with methanol, and dried. In this manner, 5.5 g of the dichroic substance M1 (orange crystals) was obtained.

$^1$H-NMR (solvent: CDCl$_3$) δ (ppm): 1.13 (t, 3H), 1.25 (t, 3H), 1.29 (br-s, 8H), 1.49 (m, 2H), 1.64 (m, 2H), 1.82 (m, 2H), 2.33 (q, 2H), 2.53 (m, 2H), 2.73 (t, 2H), 4.03 (q, 4H), 4.38 (t, 2H), 5.86 (d, 1H), 6.12 (dd, 1H), 6.43 (d, 1H), 6.83 (d, 2H), 7.00 (d, 2H), 7.94 (m, 8H)

[Synthesis of Dichroic Substance C1]

The dichroic substance C1 was synthesized as follows.

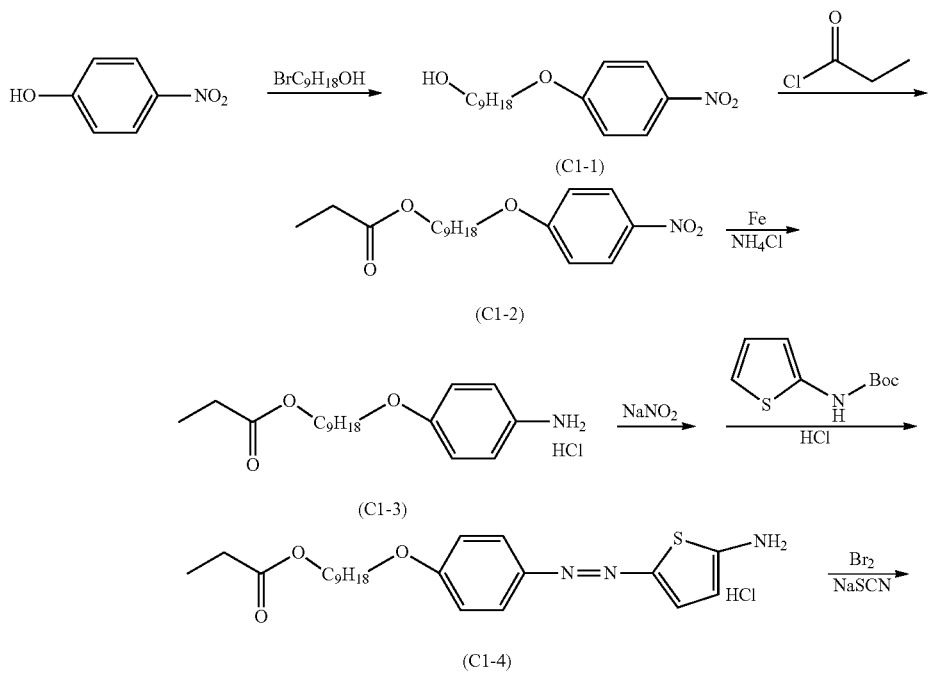

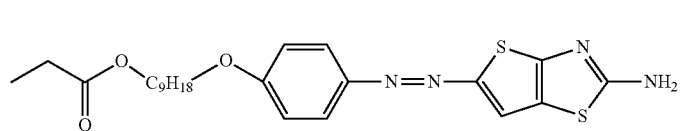
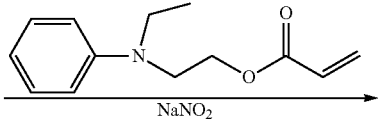

(C1-5)

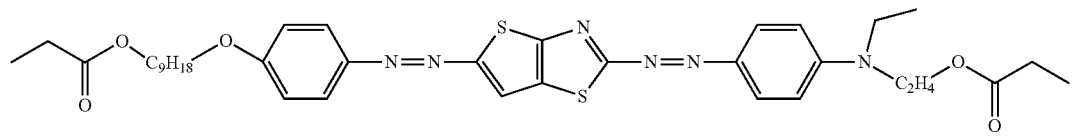

(C1)

As shown in the above scheme, 12.6 g of 4-nitrophenol, 20.0 g of 9-bromononanol, and 13.8 g of potassium carbonate were dissolved in 30 ml of N,N-dimethylacetamide (DMAc), and stirring was carried out at an external temperature of 105° C. for 2 hours. The temperature was lowered to room temperature, and the mixture was separated and washed with an aqueous solution of ethyl acetate and 10% ammonium chloride. The organic layer was dried over magnesium sulfate and then concentrated using a rotary evaporator to obtain a brown liquid (C1-1).

Next, 25 ml of DMAc was added to the obtained (C1-1), and the mixture was stirred in an ice bath. The temperature of the reaction system was maintained at 15° C. or lower, and 9.5 g of propionyl chloride was added dropwise, and after the dropwise addition, the mixture was stirred at room temperature for 1 hour. An aqueous solution of ethyl acetate and 10% ammonium chloride was added to carry out the liquid separation and washing. The separated liquid was dried over magnesium sulfate and then concentrated using a rotary evaporator to obtain a brown liquid (C1-2).

15.2 g of a Fe powder, 7.2 g of ammonium chloride, 20 ml of 2-propanol, and 10 ml of water were mixed and refluxed at an external temperature of 105° C. The yellow solid (M1-2) dissolved by heating in 30 ml of ethyl acetate was added dropwise to the refluxed system. After completion of the dropwise addition, the reaction was carried out under reflux for 30 minutes. After the temperature was lowered to room temperature, the iron powder was removed by filtration through celite, the filtrate was subjected to liquid separation with ethyl acetate/water, and the organic layer was washed with water three times.

The organic layer was concentrated using a rotary evaporator, and 15 ml of tetrahydrofuran (THF) and 15 ml of ethyl acetate were added thereto. A mixed solution of 240 ml of water and 20 ml of concentrated hydrochloric acid was added dropwise to this solution to obtain 15.3 g of the target (C1-3).

1H-NMR (solvent: CDCl$_3$) δ (ppm): 1.03 (t, 3H), 1.25 to 1.48 (m, 11H), 1.58 (m, 2H), 1.71 (m, 2H), 2.30 (m, 2H), 3.97 (m, 4H), 7.01 (d, 2H), 7.29 (d, 2H), 10.04 (br-s, 3H)

2-aminothiophene hydrochloride was synthesized from 2-nitrothiophene according to the method described in the literature (Journal of Medicinal Chemistry, 2005, Vol. 48, p. 5794).

6.2 g of the target (C1-3) obtained above was added to a mixed solution of 15 ml of 12 mol/L hydrochloric acid, 30 ml of water, and 30 ml of THF, cooled to an internal temperature of 5° C. or lower, and 1.4 g of sodium nitrite dissolved in 9 ml of water was added dropwise to the mixture. A diazonium solution was prepared by stirring at an internal temperature of 5° C. or lower for 1 hour.

Next, 2.4 g of 2-aminothiophene hydrochloride was dissolved in 12 ml of water and 6 ml of hydrochloric acid, and the diazonium solution prepared above was added dropwise thereto at an internal temperature of 0° C. The reaction solution was heated to room temperature and stirred for 2 hours. The precipitated solid was filtered and dried to obtain 6.3 g of a reddish orange solid (C1-4). In the formula, "Boc" means a tert-butoxycarbonyl group.

$^1$H-NMR (solvent: CDCl$_3$) δ (ppm): 1.01 (t, 3H), 1.29 to 1.40 (m, 11H), 1.55 (m, 2H), 1.69 (m, 2H), 2.29 (m, 2H), 3.17 (s, 2H), 3.97 (m, 4H), 6.88 (br-s, 1H), 6.97 (d, 2H), 7.39 (d, 2H), 7.85 (m, 1H)

5.6 g of the reddish orange solid (C1-4) obtained above was suspended and dissolved in 100 ml of acetic acid, and 1.5 g of sodium thiocyanate was added to the mixture at room temperature. 2.0 g of bromine was added dropwise while cooling with water and maintaining the internal temperature at 20° C. or lower.

After stirring at room temperature for 2 hours, 100 ml of water was added, and the obtained solid was filtered and dried to obtain 5.3 g of a black solid (C1-5).

$^1$H-NMR (solvent: CDCl$_3$) δ (ppm): 1.14 (t, 3H), 1.30 to 1.50 (m, 11H), 1.60 (m, 6H), 1.81 (m, 2H), 2.32 (q, 2H), 4.04 (m, 4H), 5.31 (br, 2H), 6.95 (d, 2H), 7.66 (s, 1H), 7.78 (d, 2H)

4.7 g of the black solid (C1-5) obtained above was added to 6 ml of hydrochloric acid and 6 ml of acetic acid, 5 ml of an aqueous solution of 0.72 g of sodium nitrite was added dropwise at 0° C. or lower with ice-cooling, and after stirring for 1 hour, 0.52 mg of amidosulfuric acid was added to the mixture to obtain a diazonium solution.

The diazonium solution was added dropwise to a 10 ml methanol solution of 2.2 g of N-ethyl-N-(2-acryloyloxyethyl)aniline while maintaining the temperature thereof at 0° C. or lower. The temperature was raised to room temperature, and after stirring for 1 hour, 30 ml of water was added to the solution, and the obtained solid was filtered. Purification was carried out using a column, thereby obtaining 0.6 g of a blackish green solid compound (a dichroic substance C1).

N-ethyl-N-(2-propionyloxy)aniline was synthesized from N-ethylaniline as a raw material according to U.S. Pat. No. 7,601,849B and a conventionally known method.

$^1$H-NMR (solvent: CDCl$_3$) δ (ppm): 1.13 (m, 6H), 1.25 to 1.52 (m, 15H), 1.82 (m, 2H), 2.35 (m, 4H), 3.54 (m, 2H), 3.72 (m, 2H), 4.08 (m, 4H), 4.31 (m, 2H), 6.81 (d, 2H), 7.00 (d, 2H), 7.86 (m, 3H) 7.94 (d, 2H)

Example 1

<Formation of Optical Alignment Layer>

A triacetyl cellulose (TAC) base material (TG40, manufactured by FUJIFILM Holdings Corporation) having a thickness of 40 μm, which had been subjected to the saponification treatment, was coated with a PVA coating solution A having the following composition using a wire bar of #17. Then, drying was carried out with warm air at 110° C. for 2 minutes to form a polyvinyl alcohol (PVA) layer on the TAC base material. In the case of the modified polyvinyl alcohol, the modified polyvinyl alcohol was added to the PVA coating liquid A so that the solid content concentration was 4% by weight.

| Composition of PVA coating liquid A | |
|---|---|
| Modified polyvinyl alcohol below | 2.00 parts by mass |
| Water | 74.08 parts by mass |
| Methanol | 23.86 parts by mass |
| Photopolymerization Initiator (IRGACURE 2959, manufactured by BASF SE) | 0.06 parts by mass |

Modified Polyvinyl Alcohol

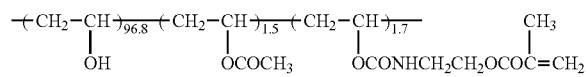

Next, a PVA film A was coated with a coating liquid P for an optical alignment layer having the following composition and dried at 135° C. for 2 minutes. The coating film was irradiated with linearly polarized ultraviolet rays (illuminance: 4 mW, irradiation dose: 8 mJ/cm$^2$) using a polarized ultraviolet ray exposure device to prepare an optical alignment layer P.

| Composition of coating liquid P for optical alignment layer | |
|---|---|
| Photo-alignable polymer above P1 | 5.56 parts by mass |
| Low-molecular weight compound PA below | 0.64 parts by mass |
| Low-molecular weight compound PB | 1.80 parts by mass |
| Butyl acetate | 73.60 parts by mass |
| Methyl ethyl ketone | 18.40 parts by mass |

PA

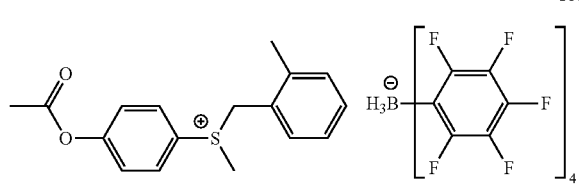

PB

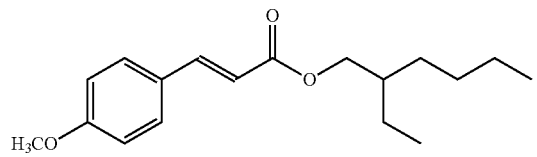

<Formation of Liquid Crystal Layer 1>

The obtained optical alignment layer P was coated with a liquid crystal composition 1 having the following composition using a wire bar of #7 to form a coating film. Next, the coating film was then heated at 140° C. for 40 seconds and cooled to 23° C. of room temperature. Next, the coating film was heated at 85° C. for 10 seconds and cooled again to room temperature.

Then, irradiation was carried out using a high-pressure mercury lamp for 60 seconds under an irradiation condition of an illuminance of 28 mW/cm$^2$, to form a liquid crystal layer 1 in which the high-molecular weight liquid crystal compound L1 is immobilized on the optical alignment layer P in a horizontal alignment state, whereby a laminate was prepared.

| Composition of liquid crystal composition 1 | |
|---|---|
| High-molecular weight liquid crystal compound L1 below | 4.677 parts by mass |
| Dichroic substance Y1 below | 0.200 parts by mass |
| Dichroic substance M1 below | 0.334 parts by mass |
| Dichroic substance C1 below | 0.668 parts by mass |
| Surfactant F1 below | 0.067 parts by mass |
| Polymerization Initiator I1 (IRGACURE 819, manufactured by BASF SE) | 0.053 parts by mass |
| Tetrahydrofuran | 47.000 parts by mass |
| Cyclopentanone | 47.000 parts by mass |

Examples 2 to 9 and Comparative Examples 1 to 3

A laminate was prepared in the same manner as in Example 1, except that the photo-alignable polymer, the liquid crystal compound, the dichroic substance, and the like were changed to the compounds shown in Table 1 below.

The structural formula of each of the compounds shown in Table 1 below is as follows. Further, in each of the surfactants F1 to F4 and H1 to H3, the numerical values in the parenthesis of the formula present the charging mass ratio of the monomers that form each of the repeating units.

P1
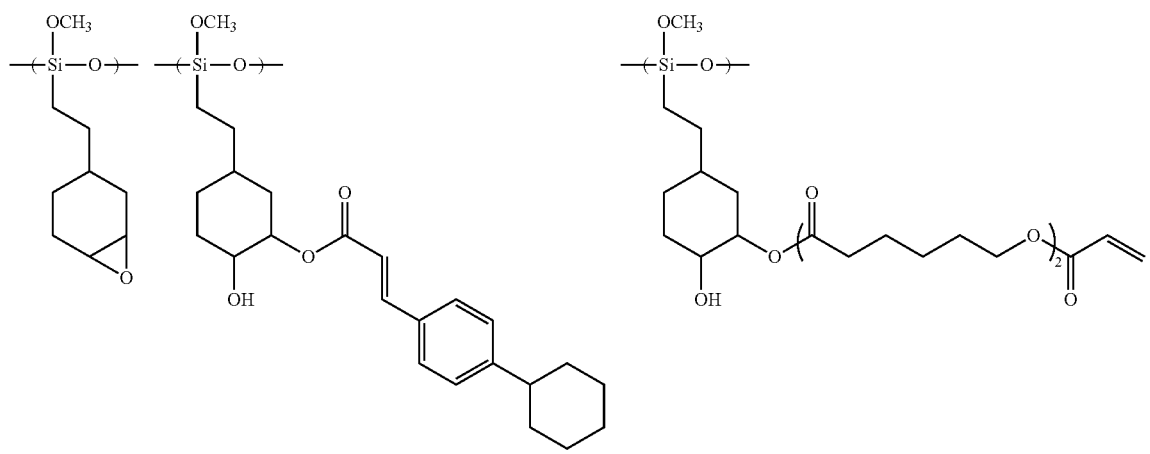
P2
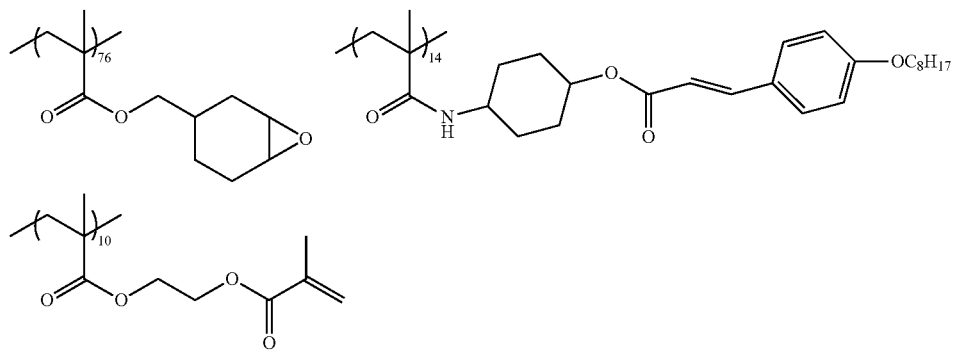
L1
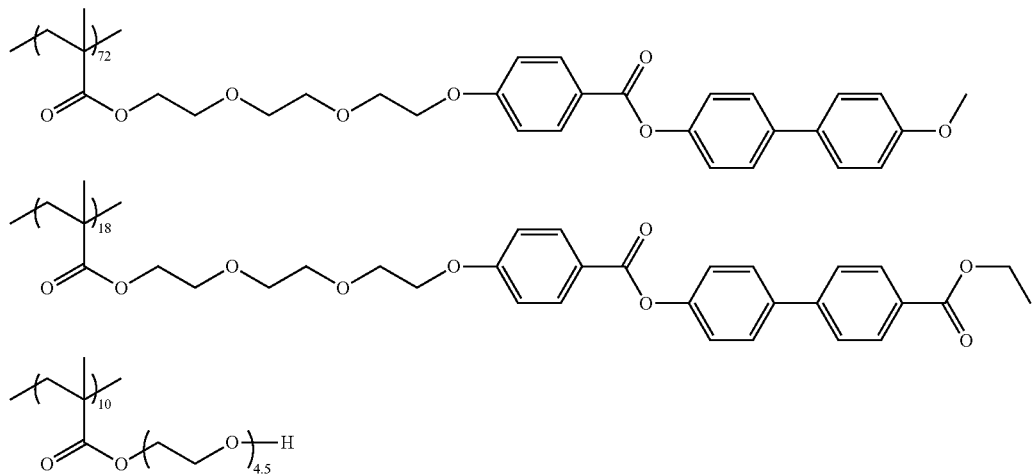
L2
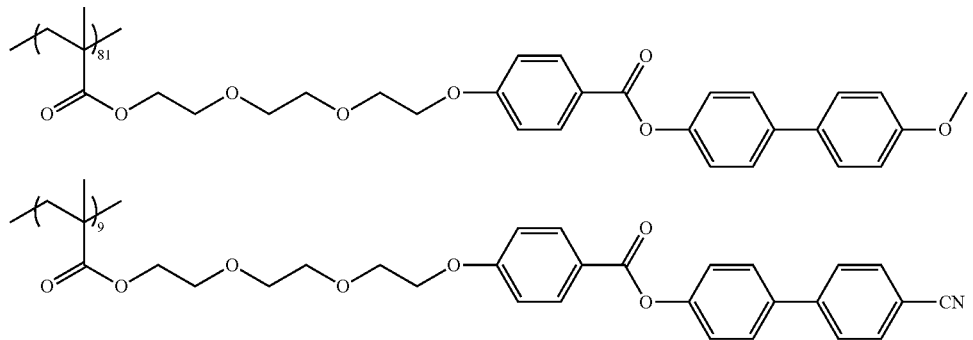

-continued
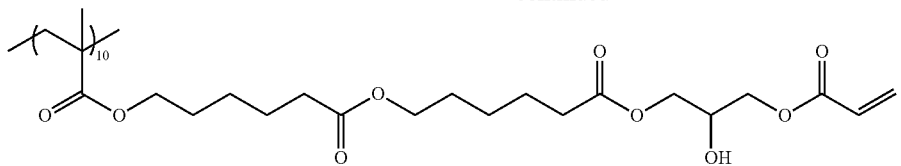
L3
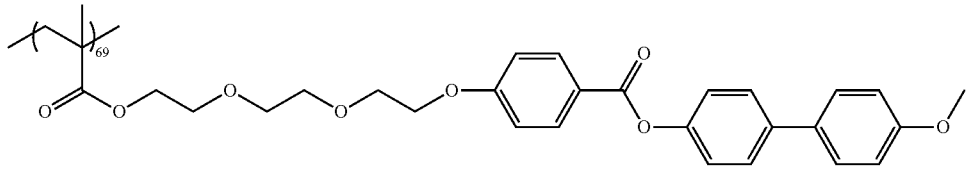
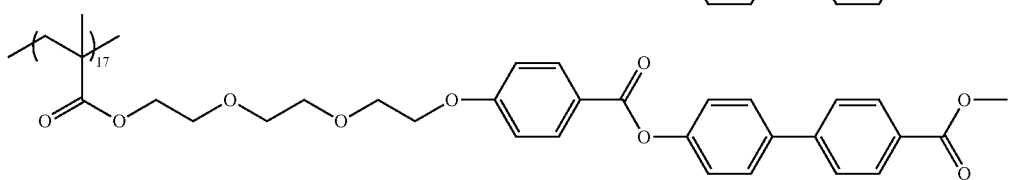
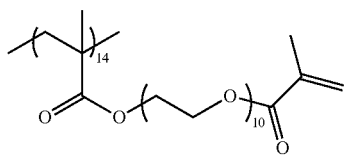
L4
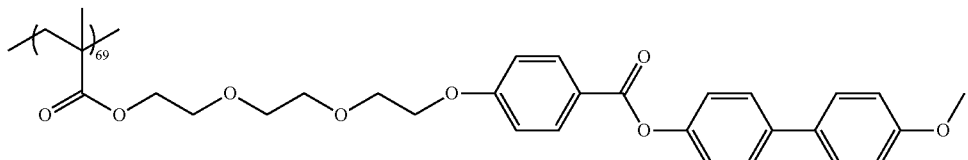
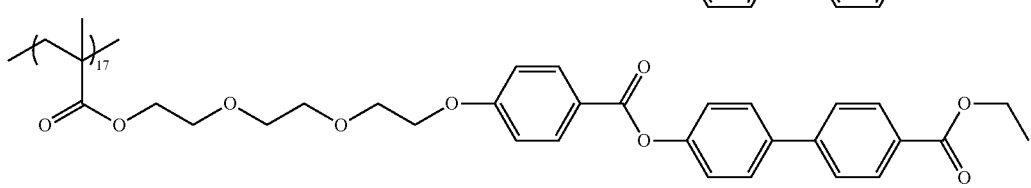
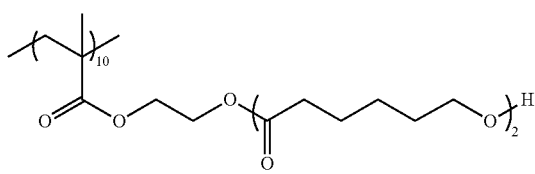
Y1
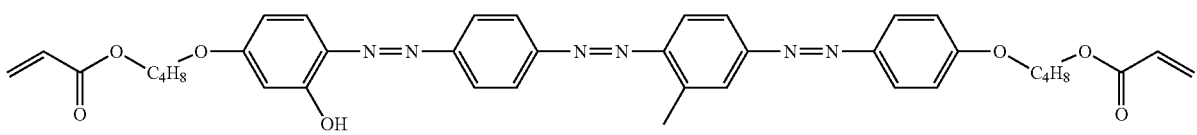
Y2
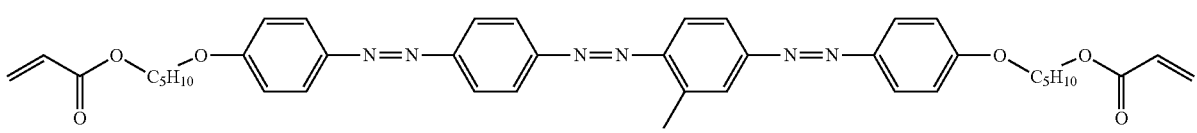
Y3
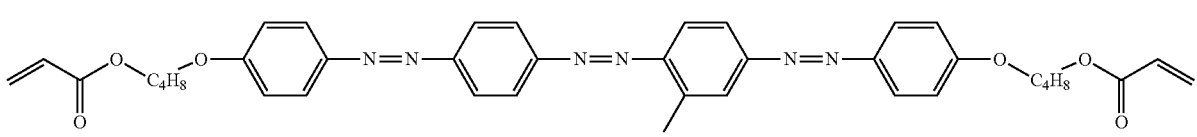

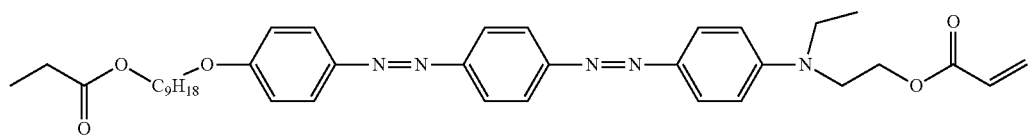
M1
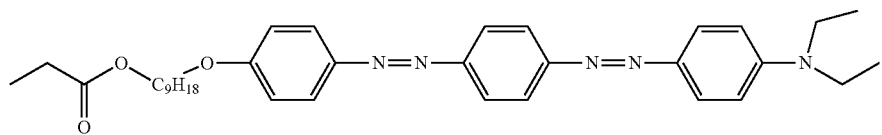
M2
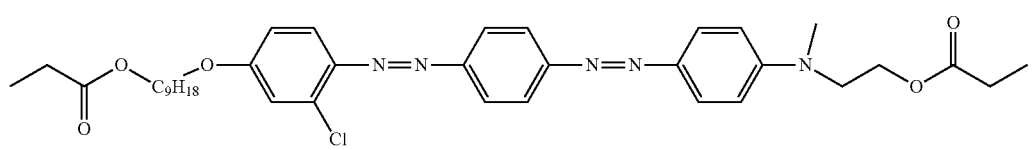
M3
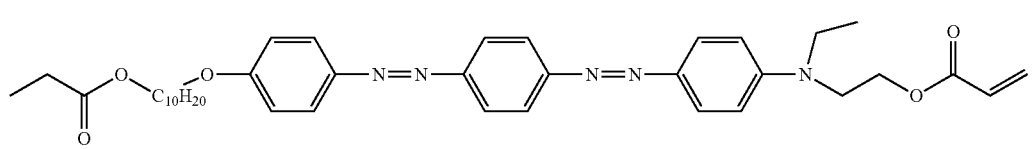
M4
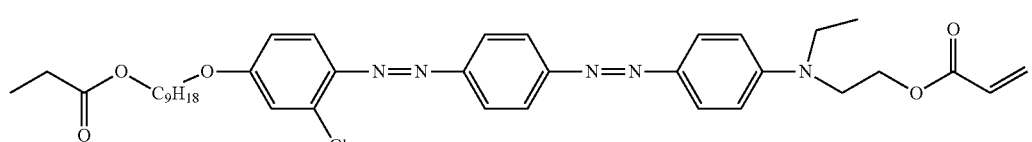
M5
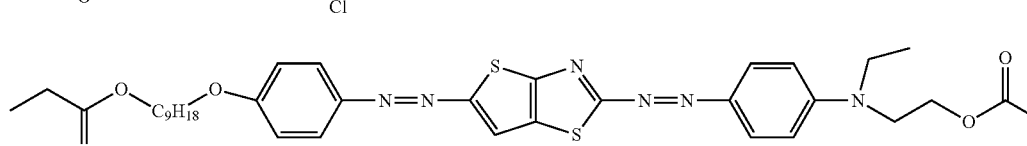
C1
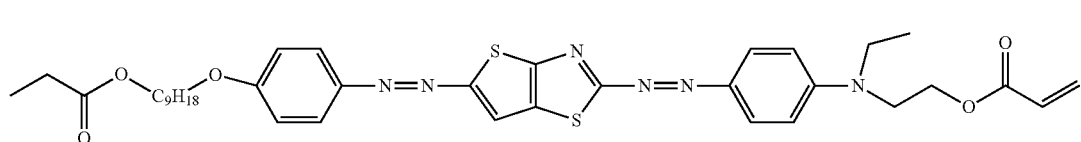
C2
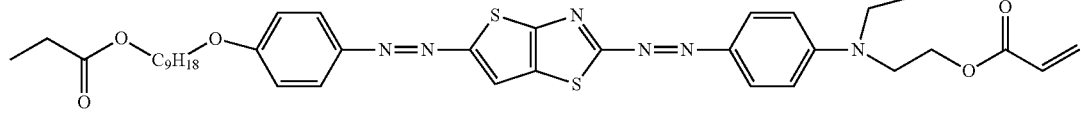
C3
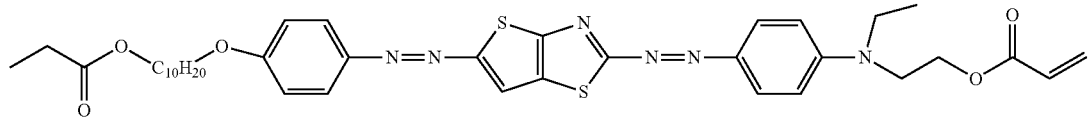
C4
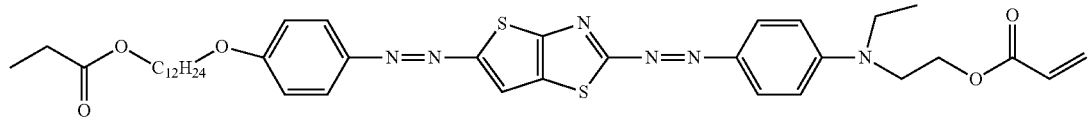
F1
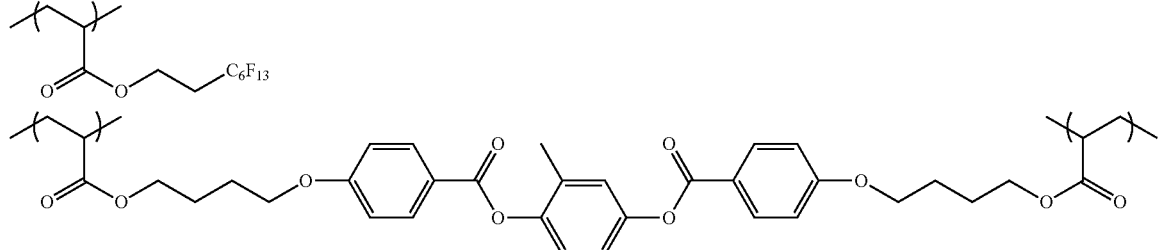
(75/25)

-continued
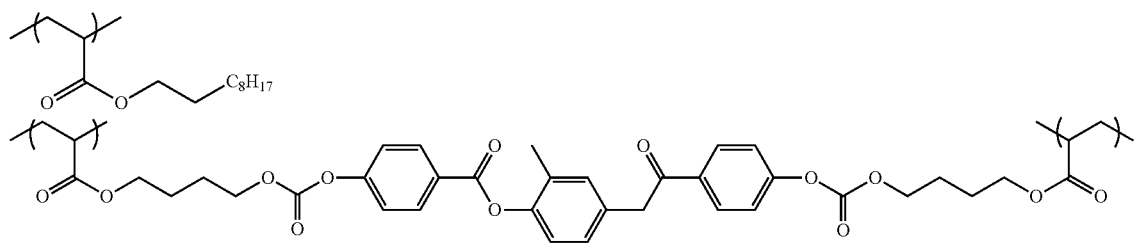
F2
(70/30)
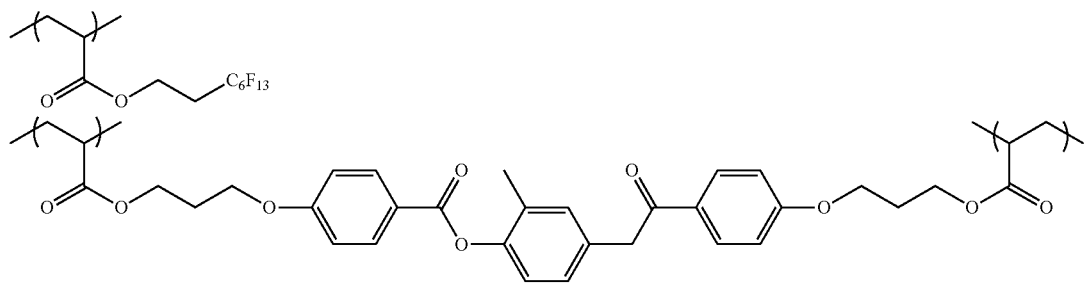
F3
(75/25)
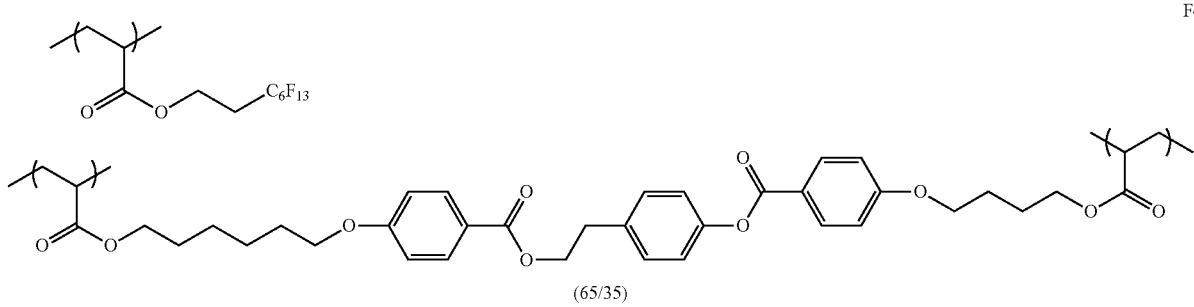
F4
(65/35)
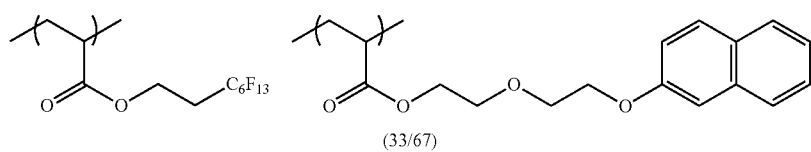
H1
(33/67)
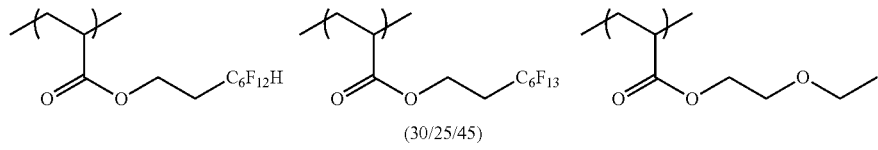
H2
(30/25/45)
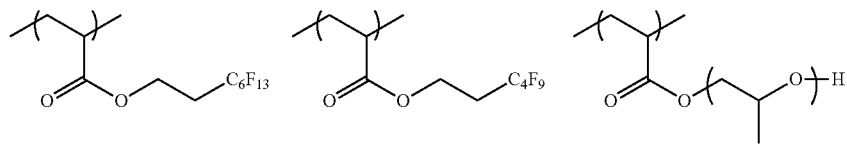
H3
(25/15/60)

<Alignment Defect>

The surface of the liquid crystal layer of each of the prepared laminates was visually observed, and the plane shape (the alignment defect) was visually observed. Further, the laminate was punched to a size of 2.5 cm×2.5 cm, the number of alignment defects was counted, and the following evaluation was carried out. The evaluation results are shown in Table 1 below.

A: Alignment defects are locally present, and the number thereof is less than 5.

B: Alignment defects are present on the entire surface, and the number thereof is 5 or more and less than 10.

C: Alignment defects are present on the entire surface, and the number thereof is 100 or more.

TABLE 1

| | Photo-alignable polymer | Liquid crystal compound Kind | Parts by mass | First dichroic substance Kind | Parts by mass | Second dichroic substance Kind | Parts by mass | Third dichroic substance Kind |
|---|---|---|---|---|---|---|---|---|
| Example 1 | P1 | L1 | 4.677 | Y1 | 0.200 | M1 | 0.334 | C1 |
| Example 2 | P2 | L2 | 4.668 | Y2 | 0.207 | M2 | 0.292 | C1 |
| Example 3 | P2 | L3 | 4.622 | Y1 | 0.195 | M3 | 0.326 | C2 |
| Example 4 | P1 | L4 | 4.507 | Y3 | 0.392 | M4 | 0.255 | C3 |
| Example 5 | P1 | L1 | 4.666 | Y1 | 0.324 | M5 | 0.227 | C4 |
| Example 6 | P2 | L3 | 4.566 | Y2 | 0.267 | M1 | 0.267 | C1 |
| Example 7 | P2 | L2 | 4.717 | Y3 | 0.170 | M3 | 0.272 | C2 |
| Example 8 | P2 | L4 | 5.862 | — | 0.000 | — | 0.000 | — |
| Example 9 | P2 | L3 | 5.862 | — | 0.000 | — | 0.000 | — |
| Comparative Example 1 | P2 | L3 | 4.774 | Y3 | 0.184 | M1 | 0.254 | C1 |
| Comparative Example 2 | P1 | L2 | 4.854 | Y1 | 0.178 | M2 | 0.614 | C2 |
| Comparative Example 3 | P1 | L1 | 4.643 | Y2 | 0.187 | M3 | 0.784 | C1 |

| | Third dichroic substance Parts by mass | Surfactant Kind | Parts by mass | Polymerization initiator Kind | Parts by mass | Tetrahydrofuran Parts by mass | Cyclopentanone Parts by mass | Alignment defect |
|---|---|---|---|---|---|---|---|---|
| Example 1 | 0.668 | F1 | 0.067 | I1 | 0.053 | 47.000 | 47.000 | A |
| Example 2 | 0.719 | F2 | 0.064 | I1 | 0.051 | 47.000 | 47.000 | A |
| Example 3 | 0.742 | F1 | 0.062 | I1 | 0.053 | 47.000 | 47.000 | A |
| Example 4 | 0.725 | F3 | 0.067 | I1 | 0.054 | 47.000 | 47.000 | A |
| Example 5 | 0.667 | F4 | 0.065 | I1 | 0.051 | 47.000 | 47.000 | A |
| Example 6 | 0.783 | F2 | 0.063 | I1 | 0.053 | 47.000 | 47.000 | A |
| Example 7 | 0.726 | F1 | 0.062 | I1 | 0.052 | 47.000 | 47.000 | A |
| Example 8 | 0.000 | F1 | 0.073 | I1 | 0.065 | 47.000 | 47.000 | B |
| Example 9 | 0.000 | F2 | 0.072 | I1 | 0.065 | 47.000 | 47.000 | B |
| Comparative Example 1 | 0.679 | H1 | 0.061 | I1 | 0.049 | 47.000 | 47.000 | C |
| Comparative Example 2 | 0.246 | H2 | 0.057 | I1 | 0.052 | 47.000 | 47.000 | C |
| Comparative Example 3 | 0.271 | H3 | 0.061 | I1 | 0.054 | 47.000 | 47.000 | C |

From the results shown in Table 1, it has been confirmed that in a case where a copolymer having no repeating unit that contains a mesogenic group is as a surfactant, many alignment defects are confirmed in the liquid crystal layer provided on the optical alignment layer (Comparative Examples 1 to 3).

On the other hand, it has been confirmed that in a case where a copolymer having a repeating unit that contains a fluorinated alkyl group and a repeating unit that contains a mesogenic group is used as a surfactant, alignment defects of the liquid crystal layer provided on the optical alignment layer are suppressed (Examples 1 to 9).

What is claimed is:

1. A laminate comprising:
   an optical alignment layer; and
   a liquid crystal layer provided on the optical alignment layer,
   wherein the liquid crystal layer is a layer formed from a liquid crystal composition containing a liquid crystal compound, a surfactant and a dichroic substance, and the liquid crystal compound is immobilized in a horizontal alignment state, and
   the surfactant is a copolymer having a repeating unit containing a fluorinated alkyl group, and a repeating unit containing a mesogenic group.

2. The laminate according to claim 1,
   wherein the optical alignment layer contains a compound having a photo-alignable group, and
   the photo-alignable group is a group having a cinnamoyl structure.

3. The laminate according to claim 1,
   wherein the liquid crystal compound is a high-molecular weight liquid crystal compound.

4. The laminate according to claim 1, further comprising a λ/4 plate that is provided on the liquid crystal layer.

5. An image display device comprising the laminate according to claim 1.

6. The laminate according to claim 2,
wherein the liquid crystal compound is a high-molecular weight liquid crystal compound.

7. The laminate according to claim 2, further comprising a λ/4 plate that is provided on the liquid crystal layer.

8. An image display device comprising the laminate according to claim 2.

9. The laminate according to claim 3, further comprising a λ/4 plate that is provided on the liquid crystal layer.

10. An image display device comprising the laminate according to claim 3.

11. An image display device comprising the laminate according to claim 4.

12. The laminate according to claim 1,
wherein the repeating unit containing a mesogenic group is
a repeating unit formed by radically polymerizing a compound having a mesogenic group and two or more polymerizable groups.

\* \* \* \* \*